United States Patent
Yamazaki et al.

(10) Patent No.: US 10,043,660 B2
(45) Date of Patent: Aug. 7, 2018

(54) SEMICONDUCTOR DEVICE OR DISPLAY DEVICE INCLUDING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Daisuke Kurosaki, Utsunomiya (JP); Yasutaka Nakazawa, Tochigi (JP); Kenichi Okazaki, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 19 days.

(21) Appl. No.: 15/596,417

(22) Filed: May 16, 2017

(65) Prior Publication Data

US 2017/0338108 A1    Nov. 23, 2017

(30) Foreign Application Priority Data

May 20, 2016 (JP) .................................. 2016-101578
Aug. 3, 2016 (JP) .................................. 2016-152985

(51) Int. Cl.
  *H01L 21/02* (2006.01)
  *H01L 21/28* (2006.01)
  (Continued)

(52) U.S. Cl.
  CPC .. *H01L 21/02266* (2013.01); *H01L 21/28211* (2013.01); *H01L 21/02142* (2013.01);
  (Continued)

(58) Field of Classification Search
  None
  See application file for complete search history.

(56) References Cited

U.S. PATENT DOCUMENTS 5,528,032 A    6/1996  Uchiyama
7,049,258 B2   5/2006  Ohsato et al.
(Continued)

FOREIGN PATENT DOCUMENTS

CN    101740634 A    6/2010
JP    2010-141304 A  6/2010
(Continued)

OTHER PUBLICATIONS

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
(Continued)

*Primary Examiner* — Jack Chen
(74) *Attorney, Agent, or Firm* — Robinson Intellectual Property Law Office; Eric J. Robinson

(57) ABSTRACT

To provide a novel method for manufacturing a semiconductor device. To provide a method for manufacturing a highly reliable semiconductor device at relatively low temperature. The method includes a first step of forming a first oxide semiconductor film in a deposition chamber and a second step of forming a second oxide semiconductor film over the first oxide semiconductor film in the deposition chamber. Water vapor partial pressure in an atmosphere in the deposition chamber is lower than water vapor partial pressure in atmospheric air. The first oxide semiconductor film and the second oxide semiconductor film are formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

27 Claims, 44 Drawing Sheets

(51) Int. Cl.
   *H01L 29/51* (2006.01)
   *H01L 29/786* (2006.01)
   *H01L 29/49* (2006.01)
   *H01L 29/423* (2006.01)

(52) U.S. Cl.
   CPC .. *H01L 21/02164* (2013.01); *H01L 21/02601* (2013.01); *H01L 21/02631* (2013.01); *H01L 29/4232* (2013.01); *H01L 29/4908* (2013.01); *H01L 29/517* (2013.01); *H01L 29/786* (2013.01)

(56) References Cited

U.S. PATENT DOCUMENTS

| | | | |
|---|---|---|---|
| 9,478,603 B2 | 10/2016 | Yamazaki et al. | |
| 9,478,668 B2 | 10/2016 | Takahashi et al. | |
| 9,496,408 B2 | 11/2016 | Yamazaki et al. | |
| 2007/0072439 A1 | 3/2007 | Akimoto et al. | |
| 2010/0117078 A1 | 5/2010 | Kuwabara et al. | |
| 2011/0069047 A1 | 3/2011 | Koyama et al. | |
| 2011/0156026 A1 | 6/2011 | Yamazaki et al. | |
| 2011/0212605 A1 | 9/2011 | Yamazaki et al. | |
| 2011/0309411 A1 | 12/2011 | Takemura | |
| 2012/0058600 A1 | 3/2012 | Kuwabara et al. | |
| 2012/0175609 A1 | 7/2012 | Yamazaki | |
| 2012/0252160 A1 | 10/2012 | Yamazaki | |
| 2013/0001545 A1 | 1/2013 | Kuwabara et al. | |
| 2013/0009209 A1 | 1/2013 | Yamazaki | |
| 2013/0009219 A1 | 1/2013 | Yamazaki et al. | |
| 2013/0009220 A1 | 1/2013 | Yamazaki et al. | |
| 2013/0320334 A1 | 12/2013 | Yamazaki et al. | |
| 2014/0001032 A1 | 1/2014 | Yamazaki | |
| 2014/0103335 A1 | 4/2014 | Yamazaki et al. | |
| 2014/0138675 A1 | 5/2014 | Yamazaki | |
| 2014/0151687 A1 | 6/2014 | Yamazaki | |
| 2014/0252348 A1 | 9/2014 | Kuwabara et al. | |
| 2014/0284599 A1 | 9/2014 | Yamazaki | |
| 2014/0299873 A1 | 10/2014 | Yamazaki | |
| 2014/0346500 A1 | 11/2014 | Yamazaki | |
| 2015/0001533 A1 | 1/2015 | Kuwabara et al. | |
| 2015/0060846 A1 | 3/2015 | Yamamoto et al. | |
| 2015/0187953 A1 | 7/2015 | Koezuka et al. | |
| 2015/0263140 A1 | 9/2015 | Yamazaki et al. | |
| 2015/0318171 A1 | 11/2015 | Yamazaki | |
| 2015/0333185 A1 | 11/2015 | Kuwabara et al. | |
| 2016/0049519 A1 | 2/2016 | Yamazaki | |
| 2016/0079089 A1 | 3/2016 | Koezuka et al. | |
| 2016/0118254 A1 | 4/2016 | Yamazaki | |
| 2016/0190346 A1 | 6/2016 | Kawata et al. | |
| 2016/0218119 A1 | 7/2016 | Koyama et al. | |
| 2016/0225620 A1 | 8/2016 | Yamazaki | |
| 2016/0247902 A1 | 8/2016 | Yamazaki | |
| 2017/0162716 A1 | 6/2017 | Koezuka et al. | |
| 2017/0170332 A1 | 6/2017 | Yamazaki | |
| 2017/0338107 A1* | 11/2017 | Yamazaki | H01L 21/02266 |
| 2017/0338108 A1* | 11/2017 | Yamazaki | H01L 21/02266 |

FOREIGN PATENT DOCUMENTS

| | | |
|---|---|---|
| JP | 2011-091376 A | 5/2011 |
| JP | 2012-160720 A | 8/2012 |
| JP | 2014-007399 A | 1/2014 |
| JP | 2014-082391 A | 5/2014 |
| JP | 2014-132670 A | 7/2014 |
| JP | 2014-241429 A | 12/2014 |
| JP | 2015-029087 A | 2/2015 |
| JP | 2015-179818 A | 10/2015 |
| JP | 2015-188098 A | 10/2015 |
| JP | 2016-028455 A | 2/2016 |
| JP | 2016-033669 A | 3/2016 |
| JP | 2016-063225 A | 4/2016 |
| JP | 2017-085119 A | 5/2017 |
| JP | 2017-103465 A | 6/2017 |
| KR | 2010-0054105 A | 5/2010 |
| KR | 2012-0083281 A | 7/2012 |
| KR | 2012-0090781 A | 8/2012 |
| KR | 2014-0135673 A | 11/2014 |
| KR | 2014-0135674 A | 11/2014 |
| KR | 2015-0002500 A | 1/2015 |
| KR | 2017-0015856 A | 2/2017 |
| KR | 2017-0058467 A | 5/2017 |
| TW | 201034190 | 9/2010 |
| TW | 201202818 | 1/2012 |
| TW | 201304014 | 1/2013 |
| TW | 201603283 | 1/2016 |
| TW | 201610537 | 3/2016 |
| TW | 201624719 | 7/2016 |
| WO | WO-2011/036987 | 3/2011 |

OTHER PUBLICATIONS

Wager.J, "Oxide TFTs: A Progress Report", Information Display, 2016, vol. 32, No. 1, pp. 16-21.

International Search Report (Application No. PCT/IB2017/052712) dated Aug. 15, 2017.

Written Opinion (Application No. PCT/IB2017/052712) dated Aug. 15, 2017.

* cited by examiner

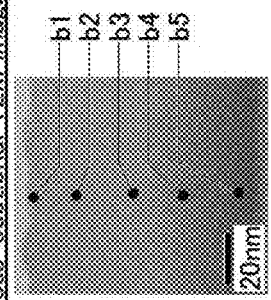
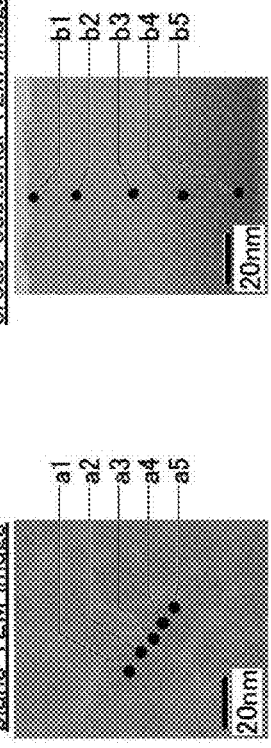
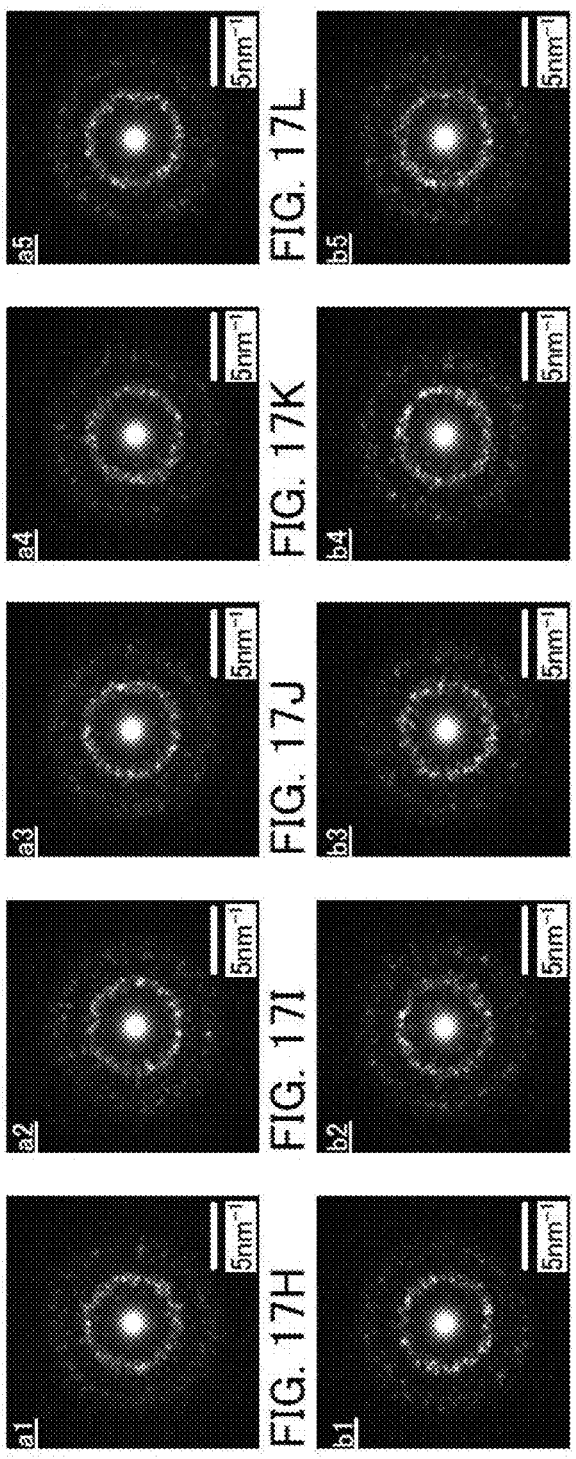

Sample A1 : 2.5kW,0.6Pa,Ar/O$_2$=270/30sccm(O$_2$ gas ratio=10%),R.T.

Sample A2 : 2.5kW,0.6Pa,O$_2$=300sccm(O$_2$ gas ratio=100%),170°C

9100

9200

9101

9201

9102

9201

9201

Sample B1: 2.5kW, 0.6Pa, Ar/O$_2$=270/30sccm (O$_2$ gas ratio=10%), R.T.

Sample B2: 2.5kW, 0.6Pa, O$_2$=300sccm (O$_2$ gas ratio=100%), 170°C lattice point Voronoi region Voronoi point Start S121 Extract lattice point group S122 Connect adjacent lattice points with segments S123 Draw perpendicular bisectors of segments S124 Extract points (Voronoi points) where three perpendicular bisectors intersect S125 Connect adjacent Voronoi points with segments to form polygonal Voronoi regions End

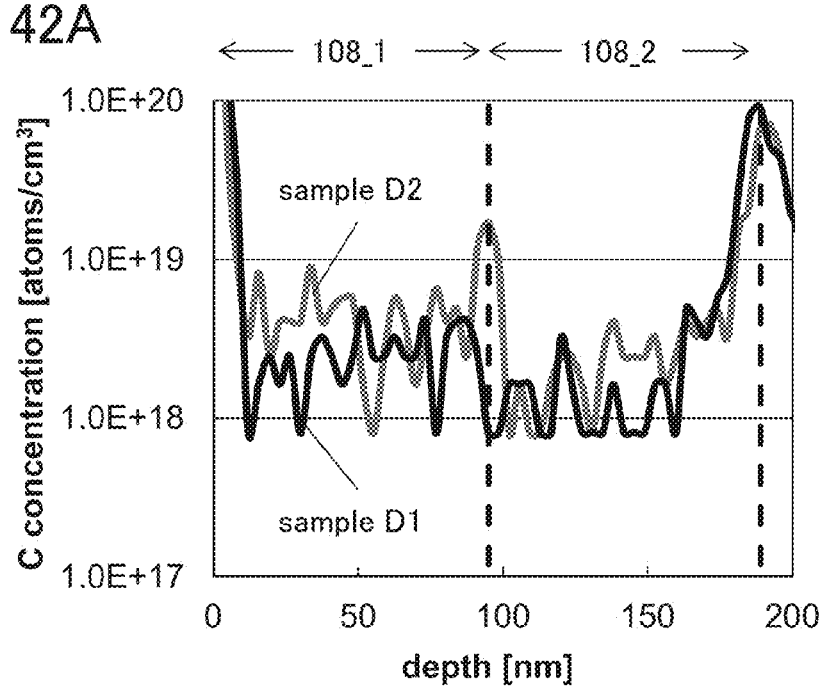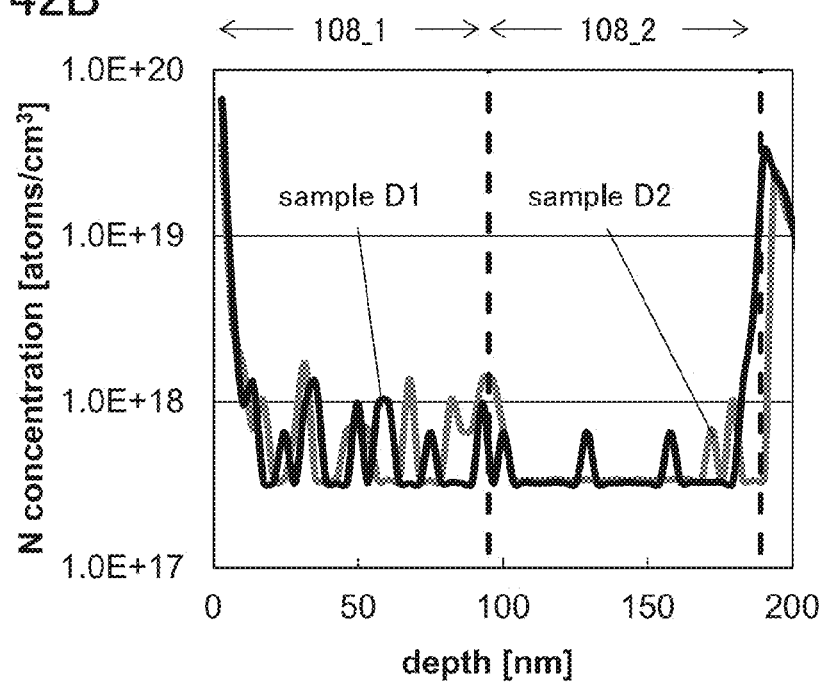

SEMICONDUCTOR DEVICE OR DISPLAY DEVICE INCLUDING THE SAME

TECHNICAL FIELD

One embodiment of the present invention relates to a semiconductor device including an oxide semiconductor film. One embodiment of the present invention relates to a display device including the semiconductor device.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, and a composition of matter. In particular, one embodiment of the present invention relates to a semiconductor device, a display device, a light-emitting device, a power storage device, a storage device, a driving method thereof, and a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

BACKGROUND ART

As a semiconductor material that can be used in a transistor, an oxide semiconductor has been attracting attention. For example, Patent Document 1 discloses a semiconductor device whose field-effect mobility (in some cases, simply referred to as mobility or μFE) is improved by stacking a plurality of oxide semiconductor layers, among which the oxide semiconductor layer serving as a channel contains indium and gallium where the proportion of indium is higher than the proportion of gallium.

Non-Patent Document 1 discloses a solid solution range in the $In_2O_3$—$Ga_2ZnO_4$—$ZnO$ system.

Non-Patent Document 2 discusses a structure in which an active layer of a transistor includes two layers of oxide semiconductors of indium zinc oxide and IGZO.

REFERENCES

Patent Document

[Patent Document 1] Japanese Published Patent Application No. 2014-007399

Non-Patent Documents

[Non-Patent Document 1] M. Nakamura, N. Kimizuka, and T. Mohri, "The Phase Relations in the $In_2O_3$—$Ga_2ZnO_4$—$ZnO$ System at 1350° C.", *J. Solid State Chem.*, Vol. 93, 1991, pp. 298-315.

[Non-Patent Document 2] John F. Wager, "Oxide TFTs: A Progress Report", Information Display 1/16, SID 2016, January/February 2016, Vol. 32, No. 1, pp. 16-21

DISCLOSURE OF INVENTION

In Non-Patent Document 2, a channel-protective bottom-gate transistor achieves high field-effect mobility (μ=62 $cm^2V^{-1}s^{-1}$). An active layer of the transistor is a two-layer stack of indium zinc oxide and IGZO, and the thickness of the indium zinc oxide where a channel is formed is 10 nm. However, the S value (the subthreshold swing (SS)), which is one of transistor characteristics, is as large as 0.41 V/decade. Moreover, the threshold voltage (Vth), which is also one of transistor characteristics, is −2.9 V, which means that the transistor has a normally-on characteristic.

The field-effect mobility of a transistor that uses an oxide semiconductor film as a channel region is preferably as high as possible. However, when the field-effect mobility is increased, the transistor has a problem with its characteristics, that is, the transistor tends to be normally on. Note that "normally on" means a state where a channel exists without application of a voltage to a gate electrode and a current flows through the transistor.

Furthermore, in a transistor that uses an oxide semiconductor film in a channel region, oxygen vacancy formed in the oxide semiconductor film adversely affect the transistor characteristics. For example, oxygen vacancy formed in the oxide semiconductor film is bonded with hydrogen to serve as a carrier supply source. The carrier supply source generated in the oxide semiconductor film causes a change in the electrical characteristics, typically, shift in the threshold voltage, of the transistor including the oxide semiconductor film.

Too many oxygen vacancies in an oxide semiconductor film, for example, shift the threshold voltage of the transistor in the negative direction, causing normally-on characteristics. Thus, it is preferable that a channel region in an oxide semiconductor film especially include few oxygen vacancies or include oxygen vacancies such that normally-on characteristics are not caused.

In view of the foregoing problems, an object of one embodiment of the present invention is to improve field-effect mobility and reliability in a transistor including an oxide semiconductor film. Another object of one embodiment of the present invention is to prevent a change in electrical characteristics of a transistor including an oxide semiconductor film and to improve reliability of the transistor. Another object of one embodiment of the present invention is to provide a semiconductor device with low power consumption. Another object of one embodiment of the present invention is to provide a novel semiconductor device. Another object of one embodiment of the present invention is to provide a novel method for manufacturing a semiconductor device. Another object of one embodiment of the present invention is to provide a method for manufacturing a highly reliable semiconductor device at relatively low temperature.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a manufacturing method of a semiconductor device that includes a first step of forming a first oxide semiconductor film in a deposition chamber and a second step of forming a second oxide semiconductor film over the first oxide semiconductor film in the deposition chamber. Water vapor partial pressure in an atmosphere in the deposition chamber is lower than water vapor partial pressure in atmospheric air. The first oxide semiconductor film and the second oxide semiconductor film are formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

Another embodiment of the present invention is a manufacturing method of a semiconductor device that includes a first step of forming a first oxide semiconductor film in a deposition chamber and a second step of forming a second oxide semiconductor film over the first oxide semiconductor film in the deposition chamber. Water vapor partial pressure in an atmosphere in the deposition chamber is lower than water vapor partial pressure in atmospheric air. The first oxide semiconductor film and the second oxide semiconductor film are each formed at a temperature that is not increased by intentional heating and formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

Another embodiment of the present invention is a manufacturing method of a semiconductor device that includes a first step of forming a first oxide semiconductor film in a deposition chamber and a second step of forming a second oxide semiconductor film over the first oxide semiconductor film in the deposition chamber. Water vapor partial pressure in an atmosphere in the deposition chamber is lower than water vapor partial pressure in atmospheric air. The first oxide semiconductor film and the second oxide semiconductor film are each formed at a temperature higher than or equal to 100° C. and lower than or equal to 200° C. and formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

In any of the above embodiments, it is preferable that each of the first oxide semiconductor film and the second oxide semiconductor film be formed by a sputtering method.

In any of the above embodiments, it is preferable that the second oxide semiconductor film be formed in an atmosphere in which oxygen partial pressure is higher than oxygen partial pressure in an atmosphere in which the first oxide semiconductor film is formed. In any of the above embodiments, it is preferable that the first oxide semiconductor film be formed with an oxygen flow rate ratio higher than or equal to 0% and lower than or equal to 30% and the second oxide semiconductor film be formed with an oxygen flow rate ratio higher than 30% and lower than or equal to 100%.

In any of the above embodiments, it is preferable that the first oxide semiconductor film be formed such that the first oxide semiconductor film includes a nanocrystal and the second oxide semiconductor film be formed such that the second oxide semiconductor film includes a c-axis-aligned crystal.

In any of the above embodiments, it is preferable that each of the first oxide semiconductor film and the second oxide semiconductor film be formed with an In-M-Zn oxide (the M is Ga, Al, Y, or Sn) target.

In the above embodiment, it is preferable that an atomic ratio of the In to the M and the Zn be In:M:Zn=4:2:4.1 or a neighborhood of In:M:Zn=4:2:4.1.

In the above embodiment, it is preferable that an atomic ratio of the In to the M and the Zn be In:M:Zn=5:1:7 or a neighborhood of In:M:Zn=5:1:7

In the above embodiment, it is preferable that an atomic ratio of the In to the M and the Zn be In:M:Zn=1:1:1.2 or a neighborhood of In:M:Zn=1:1:1.2.

One embodiment of the present invention can improve field-effect mobility and reliability in a transistor including an oxide semiconductor film. One embodiment of the present invention can prevent a change in electrical characteristics of a transistor including an oxide semiconductor film and improve the reliability of the transistor. One embodiment of the present invention can provide a semiconductor device with low power consumption. One embodiment of the present invention can provide a novel semiconductor device. One embodiment of the present invention can provide a novel method for manufacturing a semiconductor device. One embodiment of the present invention can provide a method for manufacturing a highly reliable semiconductor device at relatively low temperature.

Note that the description of these effects does not preclude the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 17A and 17B are TEM images of samples and FIGS. 17C to 17L are electron diffraction patterns thereof.

FIGS. 42A and 42B show carbon concentration of and nitrogen concentration in samples in an example.

BEST MODE FOR CARRYING OUT THE INVENTION

Figure 1:
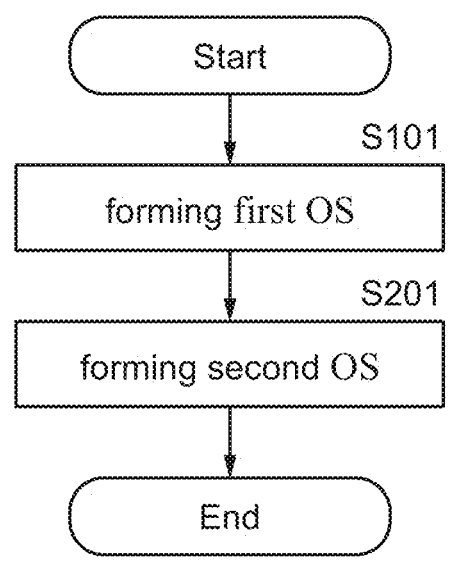
FIG. 1 is a flowchart illustrating a method for manufacturing a semiconductor device.

Embodiments will be described below with reference to drawings. However, the embodiments can be implemented in many different modes, and it will be readily appreciated by those skilled in the art that modes and details thereof can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel region between the drain (a drain terminal, a drain region, or a drain electrode) and the source (a source terminal, a source region, or a source electrode) and current can flow between the source and the drain through the channel region. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the term "electrically connected" includes the case where components are connected through an object having any electric function. There is no particular limitation on the "object having any electric function" as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. The term "perpendicular" indicates that the angle formed between two straight lines is greater than or equal to 80° and less than or equal to 100°, and accordingly also includes the case where the angle is greater than or equal to 85° and less than or equal to 95°.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Unless otherwise specified, off-state current in this specification and the like refers to drain current of a transistor in an off state (also referred to as a non-conducting state and a cutoff state). Unless otherwise specified, the off state of an n-channel transistor means that the voltage between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to a drain current that flows when the gate-source voltage Vgs is lower than the threshold voltage Vth.

The off-state current of a transistor depends on Vgs in some cases. Thus, "the off-state current of a transistor is lower than or equal to I" may mean "there is Vgs with which the off-state current of the transistor becomes lower than or equal to I". Furthermore, "the off-state current of a transistor" means "the off-state current in an off state at predetermined Vgs", "the off-state current in an off state at Vgs in a predetermined range", "the off-state current in an off state at Vgs with which sufficiently reduced off-state current is obtained", or the like.

As an example, the assumption is made of an n-channel transistor where the threshold voltage Vth is 0.5 V and the drain current is $1\times10^{-9}$ A at a voltage Vgs of 0.5 V, $1\times10^{-13}$ A at a voltage Vgs of 0.1 V, $1\times10^{-19}$ A at a voltage Vgs of −0.5 V, and $1\times10^{-22}$ A at a voltage Vgs of −0.8 V. The drain current of the transistor is $1\times10^{-19}$ A or lower at Vgs of −0.5 V or at Vgs in the range of −0.8 V to −0.5 V; therefore, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

In this specification and the like, the off-state current of a transistor with a channel width W is sometimes represented by a current value per channel width W or by a current value per given channel width (e.g., 1 μm). In the latter case, the off-state current may be represented in the unit with the dimension of current per length (e.g., A/μm).

The off-state current of a transistor depends on temperature in some cases. Unless otherwise specified, the off-state current in this specification may be an off-state current at room temperature, 60° C., 85° C., 95° C., or 125° C. Alternatively, the off-state current may be an off-state current at a temperature at which the reliability required in a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may refer to a situation where there is Vgs at which the off-state current of a transistor is lower than or equal to I at room temperature, 60° C., 85° C., 95° C., 125° C., a temperature at which the reliability required in a semiconductor device or the like including the transistor is ensured, or a temperature at which the semiconductor device or the like including the transistor is used (e.g., temperature in the range of 5° C. to 35° C.).

The off-state current of a transistor depends on voltage Vds between its drain and source in some cases. Unless otherwise specified, the off-state current in this specification may be off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current might be an off-state current at Vds at which the required reliability of a semiconductor device or the like including the transistor is ensured or Vds at which the semiconductor device or the like including the transistor is used. The description "an off-state current of a transistor is lower than or equal to a current I" may mean that there is Vgs at which the off-state current of the transistor is lower than or equal to the current I at a voltage Vds of 0.1 V, 0.8 V, 1 V, 1.2 V, 1.8 V, 2.5 V, 3 V, 3.3 V, 10 V, 12 V, 16 V, or 20 V, at a voltage Vds at which the reliability of a semiconductor device or the like including the transistor is ensured, or at a voltage Vds at which the semiconductor device or the like including the transistor is used.

In the above description of off-state current, a drain may be replaced with a source. That is, the off-state current sometimes refers to a current that flows through a source of a transistor in the off state.

In this specification and the like, the term "leakage current" sometimes expresses the same meaning as "off-state current". In this specification and the like, the off-state current sometimes refers to current that flows between a source and a drain of a transistor in the off state, for example.

In this specification and the like, the threshold voltage of a transistor refers to a gate voltage ($V_g$) at which a channel is formed in the transistor. Specifically, in a graph where the horizontal axis represents the gate voltage ($V_g$) and the vertical axis represents the square root of drain current ($I_d$), the threshold voltage of a transistor may refer to a gate voltage ($V_g$) at the intersection of the square root of drain current ($I_d$) of 0 ($I_d$=0 A) and an extrapolated straight line that is tangent with the highest inclination to a plotted curve ($V_g$–$\sqrt{I_d}$ characteristics). Alternatively, the threshold voltage of a transistor may refer to a gate voltage ($V_g$) at which the value of $I_d$ [A]×L [μm]/W [μm] is $1\times10^{-9}$ [A] where L is channel length and W is channel width.

In this specification and the like, a "semiconductor" includes characteristics of an "insulator" in some cases when the conductivity is sufficiently low, for example. Further, a "semiconductor" and an "insulator" cannot be strictly distinguished from each other in some cases because a border between the "semiconductor" and the "insulator" is not clear. Accordingly, a "semiconductor" in this specification and the like can be called an "insulator" in some cases. Similarly, an "insulator" in this specification and the like can be called a "semiconductor" in some cases. An "insulator" in this specification and the like can be called a "semi-insulator" in some cases.

In this specification and the like, a "semiconductor" includes characteristics of a "conductor" in some cases when the conductivity is sufficiently high, for example. Further, a "semiconductor" and a "conductor" cannot be strictly distinguished from each other in some cases because a border between the "semiconductor" and the "conductor" is not clear. Accordingly, a "semiconductor" in this specification can be called a "conductor" in some cases. Similarly, a "conductor" in this specification and the like can be called a "semiconductor" in some cases.

In this specification and the like, an impurity in a semiconductor refers to an element that is not a main component of the semiconductor film. For example, an element with a concentration of lower than 0.1 atomic % is an impurity. If a semiconductor contains an impurity, the density of states (DOS) may be formed therein, the carrier mobility may be decreased, or the crystallinity may be decreased, for example. In the case where the semiconductor includes an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. When the semiconductor is an oxide semiconductor, oxygen vacancies may be formed by entry of impurities such as hydrogen, for example. Furthermore, in the case where the semiconductor includes silicon, examples of an impurity which changes the characteristics of the semiconductor include oxygen, Group 1 elements except hydrogen, Group 2 elements, Group 13 elements, and Group 15 elements.

Note that in this specification and the like, "In:Ga:Zn=4:2:3 or a neighborhood of In:Ga:Zn=4:2:3" refers to an atomic ratio where, when In is 4 with respect to the total number of atoms, Ga is greater than or equal to 1 and less than or equal to 3 (1≤Ga≤3) and Zn is greater than or equal to 2 and less than or equal to 4 (2≤Zn≤4). "In:Ga:Zn=5:1:6 or a neighborhood of In:Ga:Zn=5:1:6" refers to an atomic ratio where, when In is 5 with respect to the total number of atoms, Ga is greater than 0.1 and less than or equal to 2 (0.1<Ga≤2) and Zn is greater than or equal to 5 and less than or equal to 7 (5≤Zn≤7). "In:Ga:Zn=1:1:1 or a neighborhood of In:Ga:Zn=1:1:1" refers to an atomic ratio where, when In is 1 with respect to the total number of atoms, Ga is greater than 0.1 and less than or equal to 2 (0.1<Ga≤2) and Zn is greater than 0.1 and less than or equal to 2 (0.1<Zn≤2).

Embodiment 1

In this embodiment, a semiconductor device of one embodiment of the present invention and a manufacturing method thereof are described with reference to FIG. 1 to FIG. 11C.

One embodiment of the present invention is a manufacturing method of a semiconductor device that includes a first step of forming a first oxide semiconductor film in a deposition chamber and a second step of forming a second oxide semiconductor film over the first oxide semiconductor film in the deposition chamber. Water vapor partial pressure in an atmosphere in the deposition chamber is lower than water vapor partial pressure in atmospheric air. The first oxide semiconductor film and the second oxide semiconductor film are formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

In the case where a plurality of oxide semiconductor films (here, a first oxide semiconductor film and a second oxide semiconductor film) are stacked, impurities (specifically, hydrogen, moisture, and the like) at the interface between the first oxide semiconductor film and the second oxide semiconductor film become a problem.

Attachment or entry of impurities to or into the interface between the first oxide semiconductor film and the second oxide semiconductor film will reduce the reliability of the semiconductor device in some cases. Therefore, the amount of impurities such as hydrogen or moisture at the interface between the first oxide semiconductor film and the second oxide semiconductor film is preferably as small as possible.

Thus, in one embodiment of the present invention, the first step of forming a first oxide semiconductor film and the second step of forming a second oxide semiconductor film are performed in the same deposition chamber, and water vapor partial pressure in an atmosphere in the deposition chamber is set lower than water vapor partial pressure in atmospheric air.

Note that the atmosphere in which water vapor partial pressure is lower than water vapor partial pressure in atmospheric air corresponds to an atmosphere in which pressure is lower than at least pressure of atmospheric air. Specifically, the pressure in the atmosphere is set to a low vacuum or a medium vacuum (several hundreds of pascals to 0.1 pascals) or a high vacuum or an ultra-high vacuum (0.1 Pa to $1\times10^{-7}$ Pa).

By the above embodiment, it is possible to inhibit attachment or entry of impurities to or into the interface between the first oxide semiconductor film and the second oxide semiconductor film.

The first oxide semiconductor film and the second oxide semiconductor film are each formed such that the first oxide semiconductor film and the second oxide semiconductor film each have crystallinity. The second oxide semiconductor film is formed such that the crystallinity of the second oxide semiconductor film is higher than the crystallinity of the first oxide semiconductor film.

The crystallinity of the first oxide semiconductor film and the crystallinity of the second oxide semiconductor film will be described in detail in Embodiment 3 or Embodiment 4.

After the first oxide semiconductor film and the second oxide semiconductor film are formed, a step of removing hydrogen, moisture, and the like that can be contained in the first oxide semiconductor film and the second oxide semiconductor film may be performed. Note that in this specification and the like, treatment for removing hydrogen contained in an oxide semiconductor film is referred to as dehydrogenation treatment in some cases. Similarly, treatment for removing moisture contained in an oxide semiconductor film is referred to as dehydration treatment in some cases.

By using the manufacturing method of a semiconductor device of one embodiment of the present invention, the plurality of oxide semiconductor films can each be an oxide semiconductor film in which the impurity concentration is low and the density of defect states is low.

Note that using an oxide semiconductor film in which the impurity concentration is low and density of defect states is low is preferable, in which case the transistors can have more excellent electrical characteristics. Here, the state in which impurity concentration is low and density of defect states is low (the amount of oxygen vacancies is small) is referred to as "highly purified intrinsic" or "substantially highly purified intrinsic". Note that impurities in an oxide semiconductor film are typically water, hydrogen, and the like.

A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Further, the highly purified intrinsic or substantially highly purified intrinsic oxide semiconductor film has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

<1-1. Manufacturing Method of Semiconductor Device>

Next, a manufacturing method of a semiconductor device of one embodiment of the present invention will be described with reference to FIG. 1 and FIG. 2. Note that FIG. 1 and FIG. 2 are flow charts each showing the manufacturing method of a semiconductor device of one embodiment of the present invention.

[First Step: Formation of First Oxide Semiconductor Film]

Figure 2:
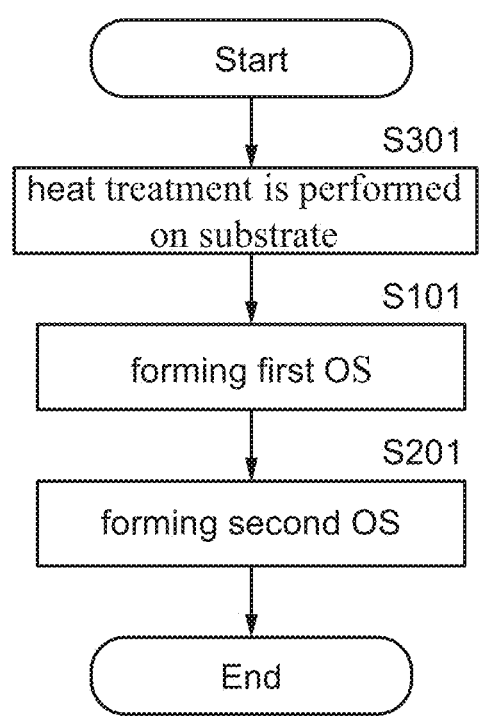
FIG. 2 is a flowchart illustrating a method for manufacturing a semiconductor device.

The first step is a step of forming the first oxide semiconductor film over a substrate in a deposition chamber (see Step S101 in FIG. 1).

Note that although the step of forming the first oxide semiconductor film over the substrate is described as an example in this embodiment, the step is not limited thereto. For example, the first oxide semiconductor film may be formed over any of a variety of films such as an insulating film, a semiconductor film, and a conductive film which is formed over a substrate.

The first oxide semiconductor film preferably includes In, M (M is Ga, Al, Y, or Sn) and Zn. The first oxide semiconductor film preferably includes a region in which the atomic proportion of In is larger than the atomic proportion of M. For example, the atomic ratio of In to M and Zn in the first oxide semiconductor film is preferably In:M:Zn=4:2:3 or a neighborhood of In:M:Zn=4:2:3, or In:M:Zn=5:1:7 or a neighborhood of In:M:Zn=5:1:7.

As a gas used to form the first oxide semiconductor film, at least one of an inert gas (typically, argon) and an oxygen gas is used.

For example, one of an argon gas and an oxygen gas is used to form the first oxide semiconductor film. Note that the proportion of the flow rate of the oxygen gas to the flow rate of a whole gas (the proportion is also referred to as an oxygen flow rate ratio) at the time of forming the first oxide semiconductor film is higher than or equal to 0% and lower than or equal to 30%, preferably higher than or equal to 5% and lower than or equal to 15%. With the oxygen flow rate ratio in the above range, the first oxide semiconductor film can have low crystallinity. Furthermore, the oxygen flow rate ratio in the above range enables the material composition of the first oxide semiconductor film to be a CAC-OS described later.

The substrate temperature at the time of forming the first oxide semiconductor film is set higher than or equal to room temperature (25° C.) and lower than or equal to 200° C., preferably higher than or equal to room temperature and lower than or equal to 130° C. The substrate temperature in the above range can prevent bending or warpage of the substrate in the case where the substrate is a large glass substrate.

[Second Step: Formation of Second Oxide Semiconductor Film]

The second step is a step of forming the second oxide semiconductor film over the first oxide semiconductor film (see Step S201 in FIG. 1).

The second oxide semiconductor film preferably includes In, M (M is Ga, Al, Y, or Sn) and Zn. The second oxide semiconductor film preferably includes a region in which the atomic proportion of In is larger than the atomic proportion of M. For example, the atomic ratio of In to M and Zn in the second oxide semiconductor film is preferably In:M:Zn=4:2:3 or a neighborhood of In:M:Zn=4:2:3, or In:M:Zn=5:1:7 or a neighborhood of In:M:Zn=5:1:7.

As a gas used to form the second oxide semiconductor film, at least one of an inert gas (typically, argon) and an oxygen gas is used.

For example, one of an argon gas and an oxygen gas is used to form the second oxide semiconductor film. The oxygen flow rate ratio at the time of forming the second oxide semiconductor film is higher than 30% and lower than or equal to 100%, preferably higher than or equal to 50% and lower than or equal to 100%, further preferably higher than or equal to 70% and lower than or equal to 100%. With the oxygen flow rate ratio in the above range, the second oxide semiconductor film can have high crystallinity.

The substrate temperature at the time of forming the second oxide semiconductor film is set higher than or equal to room temperature (25° C.) and lower than or equal to 200° C., preferably higher than or equal to room temperature and lower than or equal to 130° C. The substrate temperature in the above range can prevent bending or warpage of the substrate in the case where the substrate is a large glass substrate.

The first step and the second step are performed in the same deposition chamber, and the water vapor partial pressure in an atmosphere in the deposition chamber is lower than the water vapor partial pressure in atmospheric air. Thus, entry of impurities such as water and hydrogen into the interface between the first oxide semiconductor film and the second oxide semiconductor film can be inhibited. Moreover, the manufacturing cost can be reduced because the first oxide semiconductor film and the second oxide semiconductor film are formed in the same deposition chamber.

Before the formation of the first oxide semiconductor film (Step S101), heat treatment may be performed on the substrate as a third step (Step S301 in FIG. 2).

The third step is a step of heating the substrate. By performing the third step, water or the like adsorbed on a surface of the substrate can be suitably removed. When the first oxide semiconductor film is formed with water or the like adsorbed on the surface of the substrate, moisture or the like enters the first oxide semiconductor film to affect the transistor characteristics and the like.

In the case where the third step is performed, the third step, the first step, and the second step are sequentially performed in this order as shown in FIG. 2. The first to third steps are suitably performed in an atmosphere in which the water vapor partial pressure is lower than the water vapor partial pressure in atmospheric air.

<1-2. Structure Example of Deposition Apparatus>

A structure example of a deposition apparatus that can be used in the manufacturing method of a semiconductor device of one embodiment of the present invention is described with reference to FIG. 3 and FIGS. 4A to 4C.

With the deposition apparatus shown in FIG. 3 and FIGS. 4A to 4C, entry of impurities (in particular, hydrogen and water) that can enter the oxide semiconductor film can be inhibited.

Figure 3:
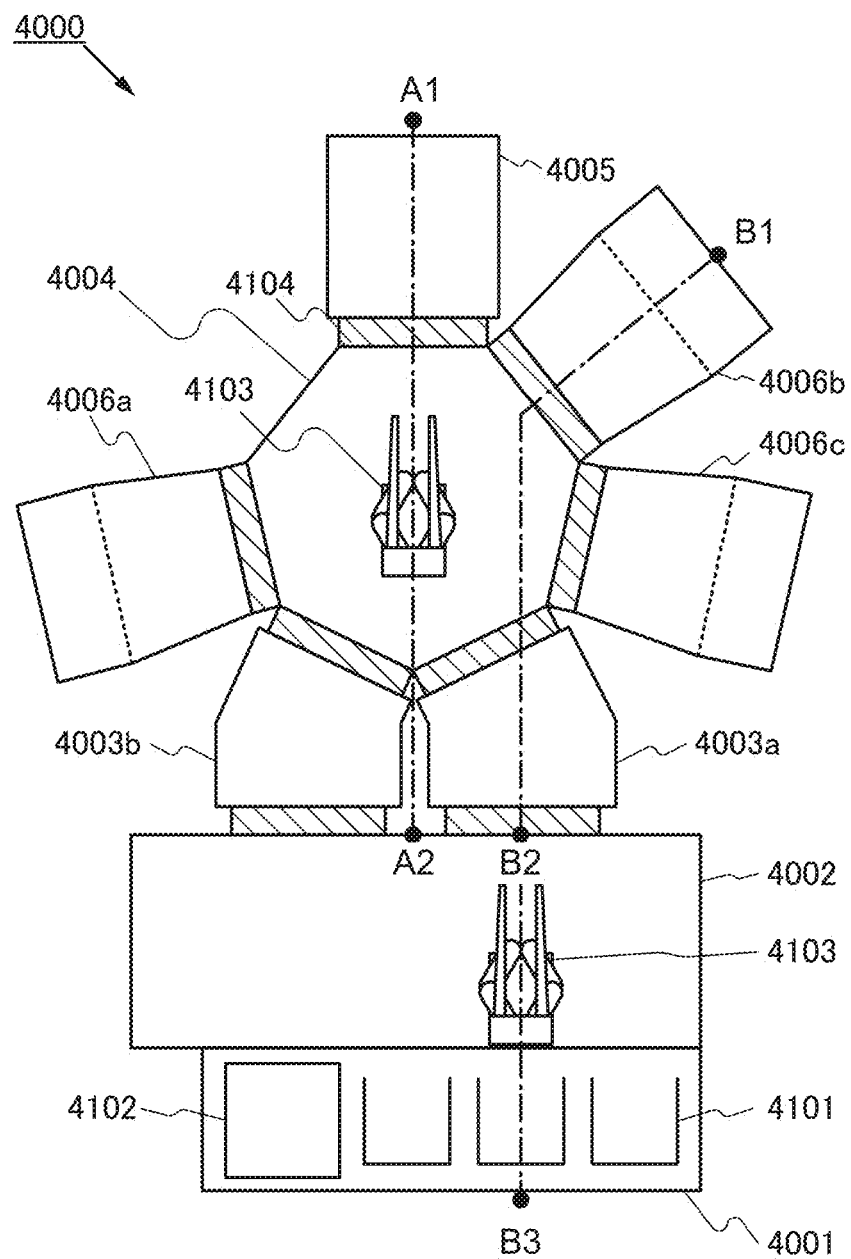
FIG. 3 is a top view of a deposition apparatus.

FIG. 3 is a top view schematically illustrating a single wafer multi-chamber deposition apparatus 4000. The single wafer multi-chamber deposition apparatus 4000 includes an atmosphere-side substrate supply chamber 4001 including a cassette port 4101 for storing substrates and an alignment port 4102 for performing alignment of substrates, an atmosphere-side substrate transfer chamber 4002 through which a substrate is transferred from the atmosphere-side substrate supply chamber 4001, a load lock chamber 4003a where a substrate is carried in and the pressure is switched from atmospheric pressure to reduced pressure or from reduced pressure to atmospheric pressure, an unload lock chamber 4003b where a substrate is carried out and the pressure is switched from reduced pressure to atmospheric pressure or from atmospheric pressure to reduced pressure, a transfer chamber 4004 where a substrate is transferred in a vacuum, a substrate heating chamber 4005 where a substrate is heated, and deposition chambers 4006a, 4006b, and 4006c in each of which a sputtering target is placed for deposition.

Note that a plurality of the cassette ports 4101 may be provided as illustrated in FIG. 3 (in FIG. 3, three cassette ports 4101 are provided).

The atmosphere-side substrate transfer chamber 4002 is connected to the load lock chamber 4003a and the unload lock chamber 4003b, the load lock chamber 4003a and the unload lock chamber 4003b are connected to the transfer chamber 4004, and the transfer chamber 4004 is connected to the substrate heating chamber 4005 and the deposition chambers 4006a, 4006b, and 4006c.

Gate valves 4104 are provided for connecting portions between chambers so that each chamber except the atmosphere-side substrate supply chamber 4001 and the atmosphere-side substrate transfer chamber 4002 can be independently kept under vacuum. In each of the atmosphere-side substrate transfer chamber 4002 and the transfer chamber 4004, a transfer robot 4103 is provided, which is capable of transferring glass substrates.

Further, it is preferable that the substrate heating chamber 4005 also serve as a plasma treatment chamber. In the single wafer multi-chamber deposition apparatus 4000, it is possible to transfer a substrate without exposure to the air between treatment and treatment; therefore, adsorption of impurities on a substrate can be suppressed. In addition, the order of film deposition, heat treatment, and the like can be freely determined. Note that the number of the transfer chambers, the number of the deposition chambers, the number of the load lock chambers, the number of the unload lock chambers, and the number of the substrate heating chambers are not limited to the above, and the numbers thereof can be set as appropriate depending on the space for placement or the process conditions.

Figure 4A:
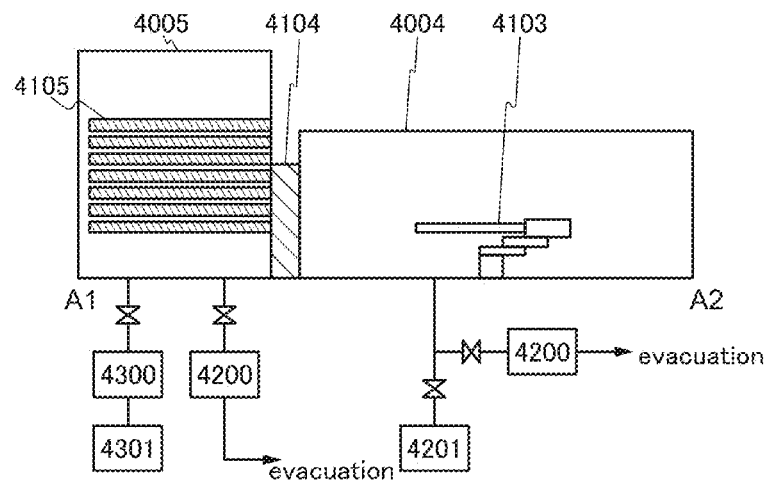
FIGS. 4A to 4C are cross-sectional views of a deposition apparatus.
Figure 4B:
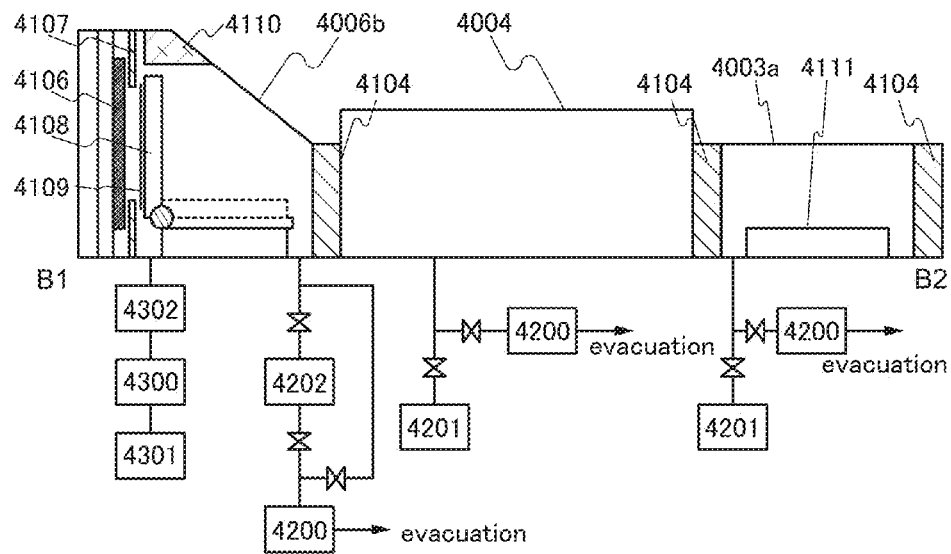
Figure 4C:
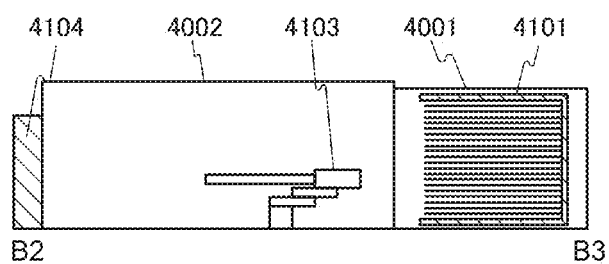

FIG. 4A, FIG. 4B, and FIG. 4C show a cross section corresponding to a cutting plane along dashed-dotted line A1-A2, a cross section corresponding to a cutting plane along dashed-dotted line B1-B2, and a cross section corresponding to a cutting plane along dashed-dotted line B2-B3, respectively, in the single wafer multi-chamber deposition apparatus 4000 illustrated in FIG. 3.

FIG. 4A is a cross-sectional view of the substrate heating chamber 4005 and the transfer chamber 4004. The substrate heating chamber 4005 shown in FIG. 4A includes a plurality of heating stages 4105 which can hold a substrate.

Note that although the substrate heating chamber 4005 including the seven heating stages 4105 is illustrated in FIG. 4A, one embodiment of the present invention is not limited to such a structure. The number of the plurality of heating stages 4105 may be greater than or equal to one and less than seven. Alternatively, the number of the plurality of heating stages 4105 may be greater than or equal to eight. It is preferable to increase the number of the plurality of heating stages 4105 because a plurality of substrates can be subjected to heat treatment at the same time, which leads to an increase in productivity. Further, the substrate heating chamber 4005 is connected to a vacuum pump 4200 through a valve. As the vacuum pump 4200, a dry pump and a mechanical booster pump can be used, for example.

As a heating mechanism which can be used for the substrate heating chamber 4005, a resistance heater or the like may be used for heating, for example. Alternatively, heat conduction or heat radiation from a medium such as a heated gas may be used as the heating mechanism. For example, a rapid thermal annealing (RTA) apparatus such as a gas rapid thermal annealing (GRTA) apparatus or a lamp rapid thermal annealing (LRTA) apparatus can be used. The LRTA apparatus is an apparatus for heating an object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. In the GRTA apparatus, heat treatment is performed using a high-temperature gas. An inert gas is used as a gas.

Moreover, the substrate heating chamber 4005 is connected to a refiner 4301 through a mass flow controller 4300. Note that although the mass flow controller 4300 and the refiner 4301 can be provided for each of a plurality of kinds of gases, only one mass flow controller 4300 and one refiner 4301 are provided for simplicity. As the gas introduced to the substrate heating chamber 4005, a gas whose dew point is −80° C. or lower, preferably −100° C. or lower can be used; for example, an oxygen gas, a nitrogen gas, and a rare gas (e.g., an argon gas) are used.

The transfer chamber 4004 includes the transfer robot 4103. The transfer robot 4103 includes a plurality of movable portions and an arm for holding a substrate and can transfer a substrate to each chamber. Further, the transfer chamber 4004 is connected to a vacuum pump 4200 and a cryopump 4201 through valves. With such a structure, evacuation is performed inside the transfer chamber 4004 using the vacuum pump 4200 from the atmospheric pressure to a low or medium vacuum (approximately several hundred pascals to 0.1 pascals) and then the valves are switched and evacuation is performed using the cryopump 4201 from the medium vacuum to a high or ultrahigh vacuum (approximately 0.1 Pa to $1\times10^{-7}$ Pa).

Alternatively, two or more cryopumps 4201 may be connected in parallel to the transfer chamber 4004. With such a structure, even when one of the cryopumps is in regeneration, evacuation can be performed using any of the other cryopumps. Note that the above regeneration refers to treatment for discharging molecules (or atoms) entrapped in the cryopump. When molecules (or atoms) are entrapped too much in a cryopump, the evacuation capability of the cryopump is lowered; therefore, regeneration is performed regularly.

FIG. 4B is a cross-sectional view of the deposition chamber 4006b, the transfer chamber 4004, and the load lock chamber 4003a. The details of the deposition chamber (sputtering chamber) are described with reference to FIG. 4B.

The deposition chamber 4006b illustrated in FIG. 4B includes a target 4106, an attachment protection plate 4107, and a substrate stage 4108. Note that here, a substrate 4109 is provided on the substrate stage 4108. Although not illustrated, the substrate stage 4108 may include a substrate holding mechanism which holds the substrate 4109, a rear heater which heats the substrate 4109 from the back surface, or the like.

Note that the substrate stage 4108 is held substantially perpendicularly to a floor during film deposition and is held substantially parallel to the floor when the substrate is delivered. In FIG. 4B, the position where the substrate stage 4108 is held when the substrate is delivered is denoted by a dashed line. With such a structure, the probability that dust or a particle which might be mixed into the film during deposition is attached to the substrate 4109 can be lowered as compared to the case where the substrate stage 4108 is held parallel to the floor. However, there is a possibility that the substrate 4109 falls when the substrate stage 4108 is held vertically (90°) to the floor; therefore, the angle of the substrate stage 4108 to the floor is preferably wider than or equal to 800 and narrower than 90°.

The attachment protection plate 4107 can suppress deposition of a particle which is sputtered from the target 4106 on a region where deposition is not needed. Moreover, the attachment protection plate 4107 is preferably processed to prevent accumulated sputtered particles from being separated. For example, blasting treatment which increases surface roughness may be performed, or roughness may be formed on the surface of the attachment protection plate 4107.

The film formation chamber 4006b is connected to the mass flow controller 4300 through a gas heating system 4302, and the gas heating system 4302 is connected to the refiner 4301 through the mass flow controller 4300. With the gas heating system 4302, a gas to be introduced to the deposition chamber 4006b can be heated to a temperature higher than or equal to 40° C. and lower than or equal to 400° C., preferably higher than or equal to 50° C. and lower than or equal to 200° C. Note that although the gas heating system 4302, the mass flow controller 4300, and the refiner 4301 can be provided for each of a plurality of kinds of gases, only one gas heating system 4302, one mass flow controller 4300, and one refiner 4301 are provided for simplicity. As the gas introduced to the deposition chamber 4006b, a gas whose dew point is −80° C. or lower, preferably −100° C. or lower can be used; for example, an oxygen gas, a nitrogen gas, and a rare gas (e.g., an argon gas) are used.

The deposition chamber 4006b is connected to a turbo molecular pump 4202 and a vacuum pump 4200 through valves.

In addition, the deposition chamber 4006b is provided with a cryotrap 4110.

The cryotrap 4110 is a mechanism which can adsorb a molecule (or an atom) having a relatively high melting point, such as water. The turbo molecular pump 4202 is capable of stably evacuating a large-sized molecule (or atom), needs low frequency of maintenance, and thus enables high productivity, whereas it has a low capability in evacuating hydrogen and water. Hence, the cryotrap 4110 is connected to the deposition chamber 4006b so as to have a high capability in evacuating water or the like. The temperature of a refrigerator of the cryotrap 4110 is set to be lower than or equal to 100 K, preferably lower than or equal to 80 K. In the case where the cryotrap 4110 includes a plurality of refrigerators, it is preferable to set the temperature of each refrigerator at a different temperature because efficient evacuation is possible. For example, the temperatures of a first-stage refrigerator and a second-stage refrigerator may be set at 100 K or lower and 20 K or lower, respectively.

Note that the evacuation method of the deposition chamber 4006b is not limited to the above, and a structure similar to that in the evacuation method described in the transfer chamber 4004 (the evacuation method using the cryopump and the vacuum pump) may be employed. Needless to say, the evacuation method of the transfer chamber 4004 may have a structure similar to that of the deposition chamber 4006b (the evacuation method using the turbo molecular pump and the vacuum pump).

Note that in each of the above transfer chamber 4004, the substrate heating chamber 4005, and the deposition chamber 4006b, the back pressure (total pressure) and the partial pressure of each gas molecule (atom) are preferably set as follows. In particular, the back pressure and the partial pressure of each gas molecule (atom) in the deposition chamber 4006b need to be noted because impurities might enter a film to be formed.

In each of the above chambers, the back pressure (total pressure) is less than or equal to $1 \times 10^{-4}$ Pa, preferably less than or equal to $3 \times 10^{-5}$ Pa, further preferably less than or equal to $1 \times 10^{-5}$ Pa. In each of the above chambers, the partial pressure of a gas molecule (atom) having a mass-to-charge ratio (m/z) of 18 is less than or equal to $3 \times 10^{-5}$ Pa, preferably less than or equal to $1 \times 10^{-5}$ Pa, further preferably less than or equal to $3 \times 10^{-6}$ Pa. Moreover, in each of the above chambers, the partial pressure of a gas molecule (atom) having a mass-to-charge ratio (m/z) of 28 is less than or equal to $3 \times 10^{-5}$ Pa, preferably less than or equal to $1 \times 10^{-5}$ Pa, further preferably less than or equal to $3 \times 10^{-6}$ Pa. Further, in each of the above chambers, the partial pressure of a gas molecule (atom) having a mass-to-charge ratio (m/z) of 44 is less than or equal to $3 \times 10^{-5}$ Pa, preferably less than or equal to $1 \times 10^{-5}$ Pa, further preferably less than or equal to $3 \times 10^{-6}$ Pa.

Note that a total pressure and a partial pressure in a vacuum chamber can be measured using a mass analyzer. For example, Qulee CGM-051, a quadrupole mass analyzer (also referred to as Q-mass) manufactured by ULVAC, Inc. can be used.

Next, the details of the transfer chamber 4004 and the load lock chamber 4003a illustrated in FIG. 4B and the atmosphere-side substrate transfer chamber 4002 and the atmosphere-side substrate supply chamber 4001 illustrated in FIG. 4C are described. Note that FIG. 4C is a cross-sectional view of the atmosphere-side substrate transfer chamber 4002 and the atmosphere-side substrate supply chamber 4001.

For the transfer chamber 4004 illustrated in FIG. 4B, the description of the transfer chamber 4004 in FIG. 4A can be referred to.

The load lock chamber 4003a includes a substrate delivery stage 4111. When a pressure in the load lock chamber 4003a becomes an atmospheric pressure by being increased from a reduced pressure, the substrate delivery stage 4111 receives a substrate from the transfer robot 4103 provided in the atmosphere-side substrate transfer chamber 4002. After that, the load lock chamber 4003a is evacuated into vacuum so that the pressure therein becomes a reduced pressure and then the transfer robot 4103 provided in the transfer chamber 4004 receives the substrate from the substrate delivery stage 4111.

Further, the load lock chamber 4003a is connected to a vacuum pump 4200 and a cryopump 4201 through valves. For a method for connecting evacuation systems such as the vacuum pump 4200 and the cryopump 4201, the description of the method for connecting the transfer chamber 4004 can be referred to, and the description thereof is omitted here. Note that the unload lock chamber 4003b illustrated in FIG. 3 can have a structure similar to that in the load lock chamber 4003a.

The atmosphere-side substrate transfer chamber 4002 includes the transfer robot 4103. The transfer robot 4103 can deliver a substrate from the cassette port 4101 to the load lock chamber 4003a or deliver a substrate from the load lock chamber 4003a to the cassette port 4101. Further, a mechanism for suppressing entry of dust or a particle, such as high efficiency particulate air (HEPA) filter, may be provided above the atmosphere-side substrate transfer chamber 4002 and the atmosphere-side substrate supply chamber 4001.

The atmosphere-side substrate supply chamber 4001 includes a plurality of the cassette ports 4101. The cassette port 4101 can hold a plurality of substrates.

When the oxide semiconductor film is formed with the use of the above deposition apparatus, the entry of impurities into the oxide semiconductor film can be suppressed. Further, when a film in contact with the oxide semiconductor film is formed with the use of the above deposition apparatus, the entry of impurities into the oxide semiconductor film from the film in contact with the oxide semiconductor film can be suppressed.

For example, with the deposition apparatus shown in FIG. 3 and FIGS. 4A to 4C, the semiconductor device of one embodiment of the present invention can be manufactured in the following order.

The first oxide semiconductor film is formed in the deposition chamber 4006b. Then, the second semiconductor film is formed in the deposition chamber 4006b. Note that by using different oxygen gas flow rates for forming the first oxide semiconductor film and the second oxide semiconductor film as described above, the crystallinity or the material composition of the first oxide semiconductor film can be made different from the crystallinity or the material composition of the second oxide semiconductor film.

Alternatively, the substrate is heated in the substrate heating chamber 4005. Then, the first oxide semiconductor film is formed in the deposition chamber 4006b. Then, the second oxide semiconductor film is formed in the deposition chamber 4006b. Thus, the first oxide semiconductor film and the second oxide semiconductor film are formed over the same substrate using the same deposition chamber 4006*b* and the same sputtering target. In other words, the first oxide semiconductor film and the second oxide semiconductor film are formed using the same material and have different material compositions.

At least part of this embodiment can be implemented in combination with any of the other embodiments described in this specification as appropriate.

Embodiment 2

In this embodiment, a semiconductor device of one embodiment of the present invention and a manufacturing method thereof are described with reference to FIG. 5A to FIG. 15B.

<2-1. Structure Example 1 of Semiconductor Device>

Figure 5A:
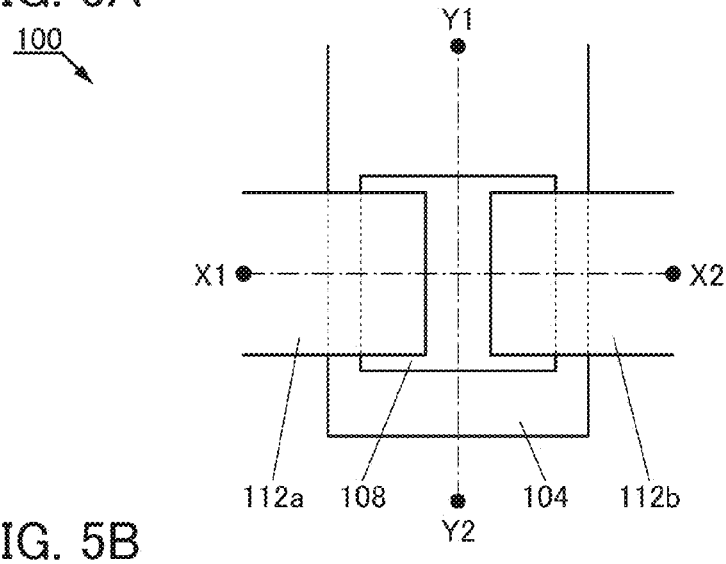
FIGS. 5A to 5C are a top view and cross-sectional views of a semiconductor device.
Figure 5B:
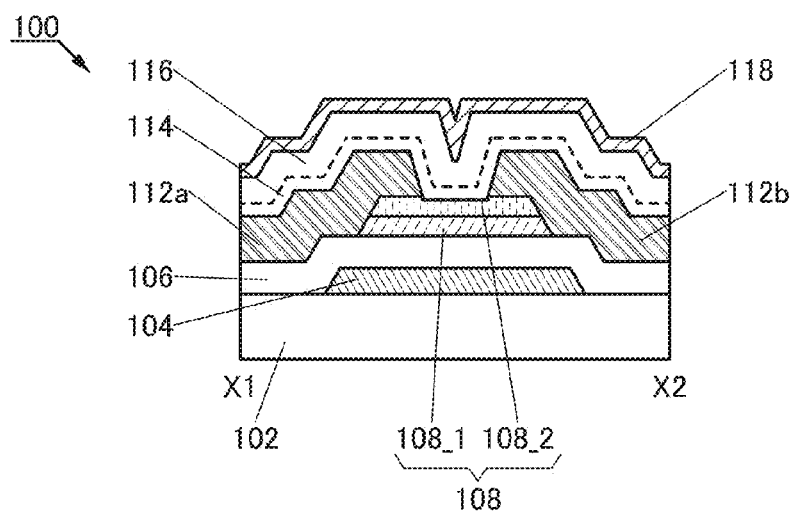
Figure 5C:
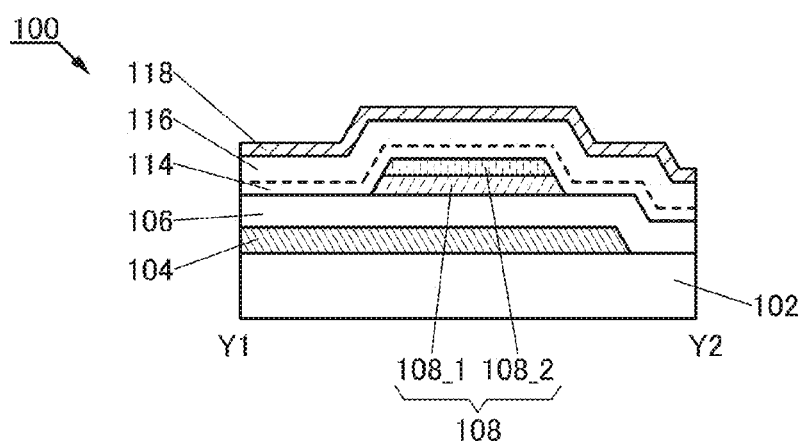

FIG. 5A is a top view of a transistor 100 that is a semiconductor device of one embodiment of the present invention. FIG. 5B is a cross-sectional view taken along a dashed dotted line X1-X2 in FIG. 5A. FIG. 5C is a cross-sectional view taken along a dashed dotted line Y1-Y2 in FIG. 5A. Note that in FIG. 5A, some components of the transistor 100 (e.g., an insulating film serving as a gate insulating film) are not illustrated to avoid complexity. Furthermore, the direction of the dashed dotted line X1-X2 may be referred to as a channel length direction, and the direction of the dashed dotted line Y1-Y2 may be referred to as a channel width direction. As in FIG. 5A, some components are not illustrated in some cases in top views of transistors described below.

The transistor 100 includes a conductive film 104 over a substrate 102, an insulating film 106 over the substrate 102 and the conductive film 104, an oxide semiconductor film 108 over the insulating film 106, a conductive film 112*a* over the oxide semiconductor film 108, and a conductive film 112*b* over the oxide semiconductor film 108. Furthermore, an insulating film 114, an insulating film 116 over the insulating film 114, and an insulating film 118 over the insulating film 116 are formed over the transistor 100, specifically over the oxide semiconductor film 108, the conductive film 112*a*, and the conductive film 112*b*.

Note that the transistor 100 is what is called a channel-etched transistor.

Furthermore, the oxide semiconductor film 108 includes an oxide semiconductor film 108_1 over the insulating film 106, and an oxide semiconductor film 108_2 over the oxide semiconductor film 108_1. Note that the oxide semiconductor film 108_1 corresponds to the first oxide semiconductor film described in Embodiment 1, and the oxide semiconductor film 108_2 corresponds to the second oxide semiconductor film described in Embodiment 1. That is, the oxide semiconductor film 108_1 and the oxide semiconductor film 108_2 each independently include a region in which the atomic proportion of In is higher than the atomic proportion of M.

When the oxide semiconductor film 108_1 and the oxide semiconductor film 108_2 each independently include a region in which the atomic proportion of In is higher than the atomic proportion of M, the transistor 100 can have high field-effect mobility. Specifically, the field-effect mobility of the transistor 100 can be higher than 50 cm$^2$/Vs, preferably higher than 100 cm$^2$/Vs.

For example, the use of the transistor with high field-effect mobility in a gate driver that generates a gate signal allows a display device to have a narrow frame. The use of the transistor with high field-effect mobility in a source driver (particularly in a demultiplexer connected to an output terminal of a shift register included in a source driver) that is included in a display device and supplies a signal from a signal line can reduce the number of wirings connected to the display device.

Even when the oxide semiconductor film 108_1 and the oxide semiconductor film 108_2 each independently include a region in which the atomic proportion of In is higher than the atomic proportion of M, the field-effect mobility might be low if the oxide semiconductor film 108_1 and the oxide semiconductor film 108_2 have high crystallinity.

However, in this embodiment, the oxide semiconductor film 108_1 includes a region having lower crystallinity than the oxide semiconductor film 108_2. Note that the crystallinity of the oxide semiconductor film 108 can be determined by analysis by X-ray diffraction (XRD) or with a transmission electron microscope (TEM).

In the case where the oxide semiconductor film 108_1 has a region with low crystallinity, the following effects can be achieved.

First, oxygen vacancies that might be formed in the oxide semiconductor film 108 will be described.

Oxygen vacancies formed in the oxide semiconductor film 108 adversely affect the transistor characteristics and therefore cause a problem. For example, oxygen vacancies formed in the oxide semiconductor film 108 are bonded to hydrogen to serve as a carrier supply source. The carrier supply source generated in the oxide semiconductor film 108 causes a change in the electrical characteristics, typically, shift in the threshold voltage, of the transistor 100 including the oxide semiconductor film 108. Therefore, it is preferable that the amount of oxygen vacancies in the oxide semiconductor film 108 be as small as possible.

In view of this, one embodiment of the present invention is a structure in which insulating films in the vicinity of the oxide semiconductor film 108, specifically the insulating films 114 and 116 formed over the oxide semiconductor film 108, include excess oxygen. Oxygen or excess oxygen is transferred from the insulating film 114 and the insulating films 116 to the oxide semiconductor film 108, whereby the oxygen vacancies in the oxide semiconductor film can be reduced.

Figure 15A:
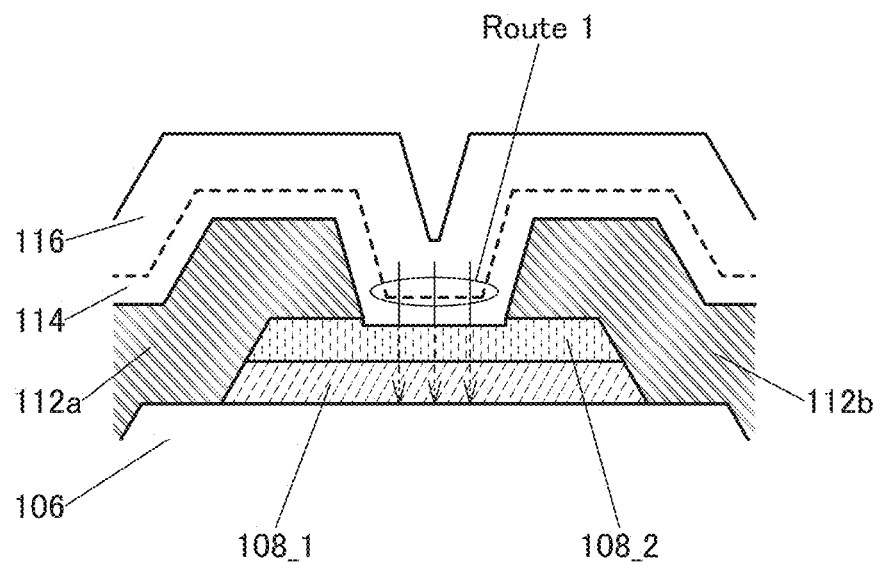
FIGS. 15A and 15B are schematic views illustrating diffusion paths of oxygen or excess oxygen diffused into an oxide semiconductor film.
Figure 15B:
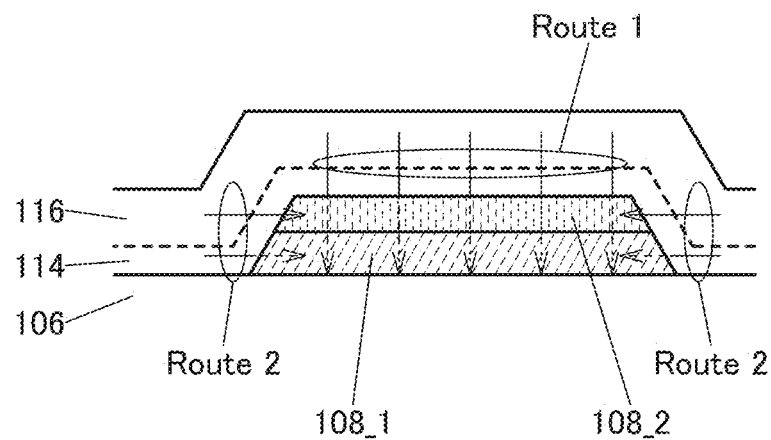

Here, the path of oxygen or excess oxygen diffused into the oxide semiconductor film 108 will be described with reference to FIGS. 15A and 15B. FIGS. 15A and 15B are schematic views illustrating the diffusion paths of oxygen or excess oxygen diffused into the oxide semiconductor film 108. FIG. 15A is the schematic view in the channel length direction and FIG. 15B is that in the channel width direction.

Oxygen or excess oxygen of the insulating films 114 and 116 is diffused to the oxide semiconductor film 108_1 from above, i.e., through the oxide semiconductor film 108_2 (Route 1 in FIGS. 15A and 15B).

In another case, oxygen or excess oxygen of the insulating films 114 and 116 is diffused into the oxide semiconductor film 108 through the side surfaces of the oxide semiconductor film 108_1 and the oxide semiconductor film 108_2 (Route 2 in FIG. 15B).

For example, diffusion of oxygen or excess oxygen by Route 1 shown in FIGS. 15A and 15B is sometimes prevented when the oxide semiconductor film 108_2 has high crystallinity. In contrast, oxygen or excess oxygen can be diffused to the oxide semiconductor film 108_1 and the oxide semiconductor film 108_2 through the side surfaces of the oxide semiconductor film 108_1 and the oxide semiconductor film 108_2 by Route 2 shown in FIG. 15B.

The oxide semiconductor film 108_1 includes a region having lower crystallinity than the oxide semiconductor film 108_2, and the region serves as a diffusion path of excess oxygen. Thus, excess oxygen can be diffused to the oxide semiconductor film 108_2 that have higher crystallinity than the oxide semiconductor film 108_1 by Route 2 shown in FIG. 15B. Although not shown in FIGS. 15A and 15B, when the insulating film 106 contains oxygen or excess oxygen, the oxygen or excess oxygen might be diffused also from the insulating film 106 into the oxide semiconductor film 108.

Although not shown in FIGS. 15A and 15B, in the case where an oxygen gas is used at the time of forming the oxide semiconductor film 108_2, the oxygen gas can be added to the oxide semiconductor film 108_1. The oxide semiconductor film 108_1 that has a small thickness, e.g., the oxide semiconductor film 108_1 that has a thickness of 5 nm or more and 40 nm or less or a thickness of 10 nm or more and 20 nm or less, is suitable, in which case the oxygen gas at the time of forming the oxide semiconductor film 108_2 can be introduced into the oxide semiconductor film 108_1.

As described above, a stacked-layer structure that includes the oxide semiconductor films having different crystal structures is formed in a semiconductor device of one embodiment of the present invention and the region with low crystallinity serves as a diffusion path of excess oxygen, whereby the semiconductor device can be highly reliable.

Note that in the case where the oxide semiconductor film 108 consists only of an oxide semiconductor film with low crystallinity, the reliability might be lowered because of attachment or entry of impurities (e.g., hydrogen or moisture) to the back channel side of the oxide semiconductor film, i.e., a region corresponding to the oxide semiconductor film 108_2.

Impurities such as hydrogen or moisture entering the channel region of the oxide semiconductor film 108 adversely affect the transistor characteristics and therefore cause a problem. Therefore, it is preferable that the amount of impurities such as hydrogen or moisture in the oxide semiconductor film 108 be as small as possible.

In view of this, the crystallinity of oxide semiconductor films over the oxide semiconductor film is increased in one embodiment of the present invention. Owing to this, impurities that might enter the oxide semiconductor film 108 can be suppressed. In particular, the higher crystallinity of the oxide semiconductor film 108_2 can inhibit damage at the time of processing the conductive films 112a and 112b. The surface of the oxide semiconductor film 108, i.e., the surface of the oxide semiconductor film 108_2 is exposed to an etchant or an etching gas at the time of processing the conductive films 112a and 112b. The oxide semiconductor film 108_2 has etching resistance superior to the oxide semiconductor film 108_1 owing to its region with higher crystallinity than the oxide semiconductor film 108_1. Thus, the oxide semiconductor film 108_2 serves as an etching stopper.

By including a region having lower crystallinity than the oxide semiconductor film 108_2, the oxide semiconductor film 108_1 sometimes has a high carrier density.

When the oxide semiconductor film 108_1 has a high carrier density, the Fermi level is sometimes high relative to the conduction band of the oxide semiconductor film 108_1. This lowers the conduction band minimum of the oxide semiconductor film 108_1, so that the energy difference between the conduction band minimum of the oxide semiconductor film 108_1 and the trap level, which might be formed in a gate insulating film (here, the insulating film 106), is increased in some cases. The increase of the energy difference can reduce trap of charges in the gate insulating film and reduce variation in the threshold voltage of the transistor, in some cases. In addition, when the oxide semiconductor film 108_1 has a high carrier density, the oxide semiconductor film 108 can have high field-effect mobility.

It is favorable to use a composite oxide semiconductor as the oxide semiconductor film 108_1. The details of the composite oxide semiconductor will be described in Embodiment 4.

In the transistor 100 illustrated in FIGS. 5A to 5C, the insulating film 106 functions as a gate insulating film of the transistor 100, and the insulating films 114, 116, and 118 function as protective insulating films of the transistor 100. Furthermore, in the transistor 100, the conductive film 104 functions as a gate electrode, the conductive film 112a functions as a source electrode, and the conductive film 112b functions as a drain electrode. Note that in this specification and the like, in some cases, the insulating film 106 is referred to as a first insulating film, the insulating films 114 and 116 are collectively referred to as a second insulating film, and the insulating film 118 is referred to as a third insulating film.

<2-2. Components of Semiconductor Device>

Next, components of the semiconductor device in this embodiment are described in detail.

[Substrate]

There is no particular limitation on a material and the like of the substrate 102 as long as the material has heat resistance high enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate of silicon or silicon carbide, a compound semiconductor substrate of silicon germanium, an SOI substrate, or the like can be used, or any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be fabricated.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

[Conductive Film]

The conductive film 104 functioning as a gate electrode and the conductive films 112a and 112b functioning as a source electrode and a drain electrode can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b can be formed using an oxide conductor or an oxide semiconductor, such as an oxide including indium and tin (In—Sn oxide), an oxide including indium and tungsten (In—W oxide), an oxide including indium, tungsten, and zinc (In—W—Zn oxide), an oxide including indium and titanium (In—Ti oxide), an oxide including indium, titanium, and tin (In—Ti—Sn oxide), an oxide including indium and zinc (In—Zn oxide), an oxide including indium, tin, and silicon (In—Sn—Si oxide), or an oxide including indium, gallium, and zinc (In—Ga—Zn oxide).

Here, an oxide conductor is described. In this specification and the like, an oxide conductor may be referred to as OC. For example, oxygen vacancies are formed in an oxide semiconductor, and then hydrogen is added to the oxygen vacancies, so that a donor level is formed in the vicinity of the conduction band. This increases the conductivity of the oxide semiconductor; accordingly, the oxide semiconductor becomes a conductor. The oxide semiconductor having become a conductor can be referred to as an oxide conductor. Oxide semiconductors generally transmit visible light because of their large energy gap. Since an oxide conductor is an oxide semiconductor having a donor level in the vicinity of the conduction band, the influence of absorption due to the donor level is small in an oxide conductor, and an oxide conductor has a visible light transmitting property comparable to that of an oxide semiconductor.

A Cu—X alloy film (X is Mn, Ni, Cr, Fe, Co, Mo, Ta, or Ti) may be used for the conductive films 104, 112a, and 112b. The use of a Cu—X alloy film results in lower manufacturing costs because the film can be processed by wet etching.

Among the above-mentioned metal elements, any one or more elements selected from copper, titanium, tungsten, tantalum, and molybdenum are preferably included in the conductive films 112a and 112b. In particular, a tantalum nitride film is preferably used for the conductive films 112a and 112b. A tantalum nitride film has conductivity and a high barrier property against copper or hydrogen. Because a tantalum nitride film releases little hydrogen from itself, it can be favorably used as the conductive film in contact with the oxide semiconductor film 108 or the conductive film in the vicinity of the oxide semiconductor film 108. It is favorable to use a copper film for the conductive films 112a and 112b because the resistance of the conductive films 112a and 112b can be reduced.

The conductive films 112a and 112b can be formed by electroless plating. As a material that can be deposited by electroless plating, for example, one or more elements selected from Cu, Ni, Al, Au, Sn, Co, Ag, and Pd can be used. It is further favorable to use Cu or Ag because the resistance of the conductive film can be reduced.

[Insulating Film Functioning as Gate Insulating Film]

As the insulating film 106 functioning as a gate insulating film of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that the insulating film 106 may have a stacked-layer structure or a stacked layer structure of three or more layers.

The insulating film 106 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 106 is an insulating film capable of releasing oxygen. In order to provide the oxygen-excess region in the insulating film 106, the insulating film 106 is formed in an oxygen atmosphere, or the deposited insulating film 106 is subjected to heat treatment in an oxygen atmosphere, for example.

In the case where hafnium oxide is used for the insulating film 106, the following effect is attained. Hafnium oxide has higher dielectric constant than silicon oxide and silicon oxynitride. Therefore, the insulating film 106 using hafnium oxide can have a larger thickness than the insulating film 106 using silicon oxide, so that leakage current due to tunnel current can be low. That is, it is possible to provide a transistor with a low off-state current. Moreover, hafnium oxide having a crystal structure has a higher dielectric constant than hafnium oxide having an amorphous structure. Therefore, it is preferable to use hafnium oxide having a crystal structure, in order to provide a transistor with a low off-state current. Examples of the crystal structure include a monoclinic crystal structure and a cubic crystal structure. Note that one embodiment of the present invention is not limited to the above examples.

In this embodiment, a layered film of a silicon nitride film and a silicon oxide film is formed as the insulating film 106. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

[Oxide Semiconductor Film]

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In >M. The atomic ratio of metal elements in such a sputtering target is, for example, In:M:Zn=2:1:3, In:M:Zn=3:1:2, In:M:Zn=4:2:4.1, In:M:Zn=5:1:6, In:M:Zn=5:1:7, In:M:Zn=5:1:8, In:M:Zn=6:1:6, In:M:Zn=5:2:5, or the like.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratio of metal elements in the formed oxide semiconductor film 108 varies from the above atomic ratios of metal elements of the sputtering targets in a range of ±40%. For example, when a sputtering target with an atomic ratio of In to Ga to Zn of 4:2:4.1 is used, the atomic ratio of In to Ga to Zn in the formed oxide semiconductor film 108 may be 4:2:3 or the neighborhood of 4:2:3.

The energy gap of the oxide semiconductor film 108 is 2 eV or more, preferably 2.5 eV or more. With the use of an oxide semiconductor having such a wide energy gap, the off-state current of the transistor 100 can be reduced.

Furthermore, the oxide semiconductor film 108 preferably has a non-single-crystal structure. Examples of the non-single-crystal structure include a c-axis-aligned crystalline oxide semiconductor (CAAC-OS) which is described later, a polycrystalline structure, a microcrystalline structure, and an amorphous structure. Among the non-single-crystal structures, the amorphous structure has the highest density of defect states, whereas the CAAC-OS has the lowest density of defect states.

[Insulating Film 1 Functioning as Protective Insulating Film]

The insulating films 114 and 116 function as protective insulating films for the transistor 100. In addition, the insulating films 114 and 116 each have a function of supplying oxygen to the oxide semiconductor film 108. That is, the insulating films 114 and 116 contain oxygen. The insulating film 114 is an insulating film that allows oxygen to pass therethrough. Note that the insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the property of transmitting oxygen of the insulating film 114 is lowered.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film which releases ammonia more than nitrogen oxide in thermal desorption spectroscopy (TDS) analysis; the amount of released ammonia is typically greater than or equal to $1\times10^{18}$ molecules/cm$^{-3}$ and less than or equal to $5\times10^{19}$ molecules/cm$^{-3}$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and lower than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 corresponds to the sum of the spin densities of signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a substrate temperature higher than or equal to 220° C. and lower than or equal to 350° C. using silane and dinitrogen monoxide, whereby a dense and hard film can be formed.

The insulating film 116 is an oxide insulating film which contains oxygen at a higher proportion than the stoichiometric composition. Part of oxygen is released from the above oxide insulating film by heating. The amount of oxygen released from the oxide insulating film in TDS is more than or equal to $1.0 \times 10^{19}$ atoms/cm$^3$, preferably more than or equal to $3.0 \times 10^{20}$ atoms/cm$^3$. Note that the amount of released oxygen is the total amount of oxygen released by heat treatment in a temperature range of 50° C. to 650° C. or 50° C. to 550° C. in TDS. In addition, the amount of released oxygen is the total amount of released oxygen converted into oxygen atoms in TDS.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal that appears at g=2.001 due to a dangling bond of silicon be lower than $1.5 \times 10^{18}$ spins/cm$^3$, preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of only the insulating film 114 or a layered structure of three or more layers may be employed.

[Insulating Film 2 Functioning as Protective Insulating Film]

The insulating film 118 functions as a protective insulating film for the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. The provision of the insulating film 118 makes it possible to prevent outward diffusion of oxygen from the oxide semiconductor film 108, outward diffusion of oxygen included in the insulating films 114 and 116, and entry of hydrogen, water, or the like into the oxide semiconductor film 108 from the outside.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, the oxide semiconductor film, and the metal film which are described above can be formed by a sputtering method or a PECVD method, such films may be formed by another method, e.g., a thermal chemical vapor deposition (CVD) method. A metal organic chemical vapor deposition (MOCVD) method and an atomic layer deposition (ALD) method can be given as examples of a thermal CVD method.

A thermal CVD method has an advantage that no defect due to plasma damage is generated since it does not utilize plasma for forming a film. In a thermal CVD method, a source gas is introduced into a chamber, the chamber is set at an atmospheric pressure or a reduced pressure, and a film is deposited on a substrate.

Furthermore, in an ALD method, a source gas is introduced into a chamber, the chamber is set at an atmospheric pressure or a reduced pressure, and a film is deposited on a substrate.

<2-3. Structure Example 2 of Semiconductor Device>

Next, variations of the transistor 100 illustrated in in FIGS. 5A to 5C are described with reference to FIG. 6A to FIG. 10C.

Figure 6A:
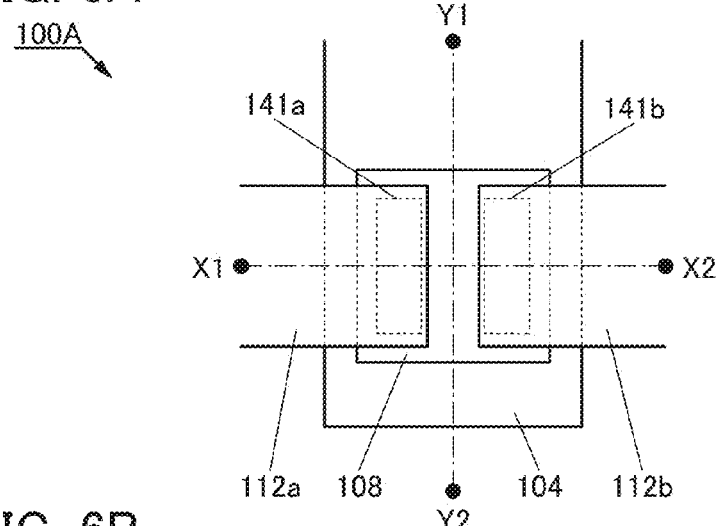
FIGS. 6A to 6C are a top view and cross-sectional views of a semiconductor device.
Figure 6B:
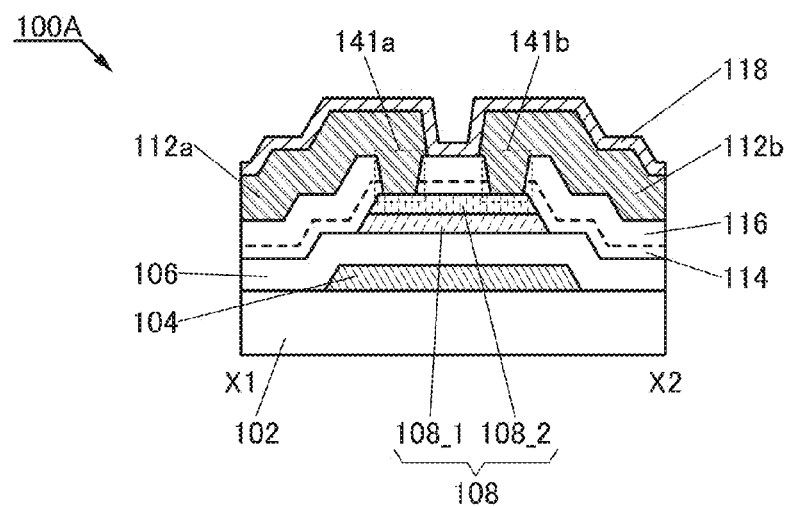
Figure 6C:
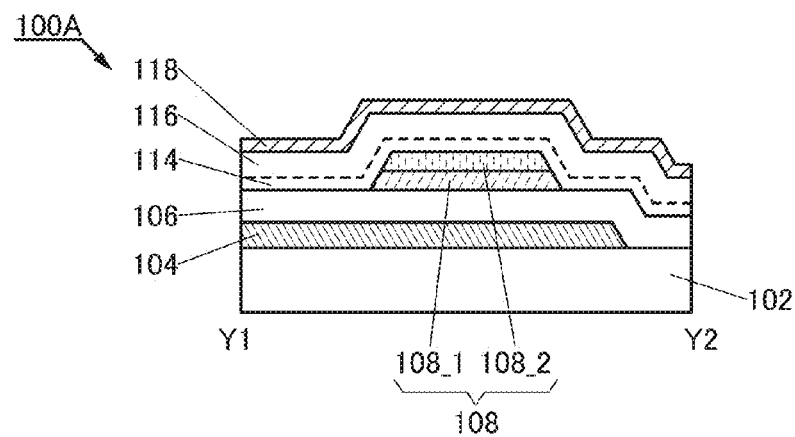

FIG. 6A is a top view of a transistor 100A that is a semiconductor device of one embodiment of the present invention. FIG. 6B is a cross-sectional view taken along a dashed dotted line X1-X2 in FIG. 6A. FIG. 6C is a cross-sectional view taken along a dashed dotted line Y1-Y2 in FIG. 6A.

Note that the transistor 100A illustrated in FIGS. 6A and 6B is what is called a channel-protective transistor. Thus, the semiconductor device of one embodiment of the present invention can have either the channel-etched structure or the channel-protective structure.

In the transistor 100A, the insulating films 114 and 116 have an opening 141a and an opening 141b. The oxide semiconductor film 108 is connected to the conductive films 112a and 112b through the openings 141a and 141b. Furthermore, the insulating film 118 is formed over the conductive films 112a and 112b. The insulating films 114 and 116 function as channel protective films. Note that the other components of the transistor 100A are similar to those of the transistor 100 described above, and an effect similar to that of the transistor 100 can be obtained.

Figure 7A:
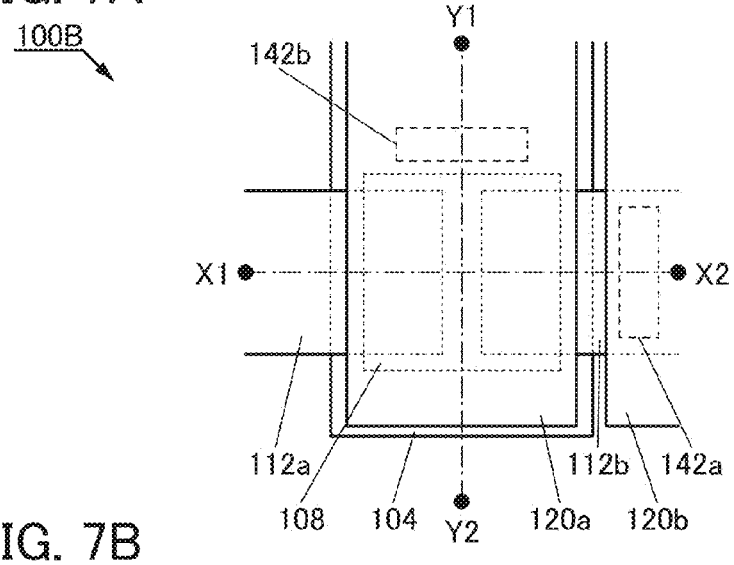
FIGS. 7A to 7C are a top view and cross-sectional views of a semiconductor device.
Figure 7B:
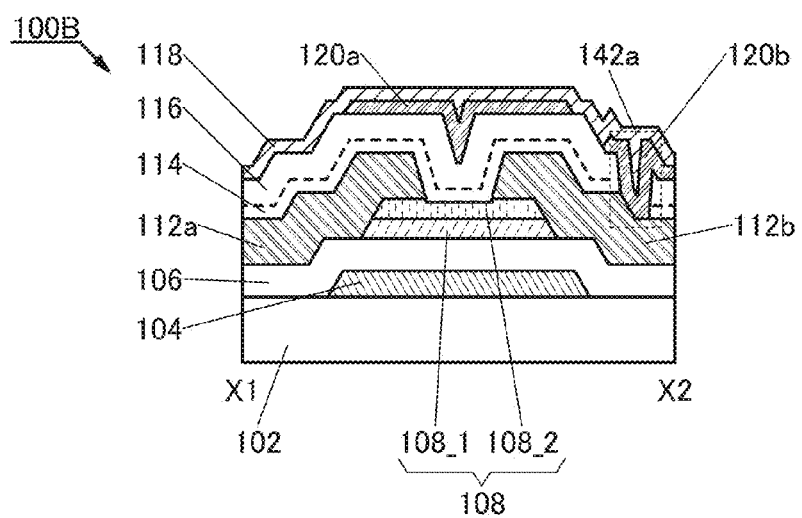
Figure 7C:
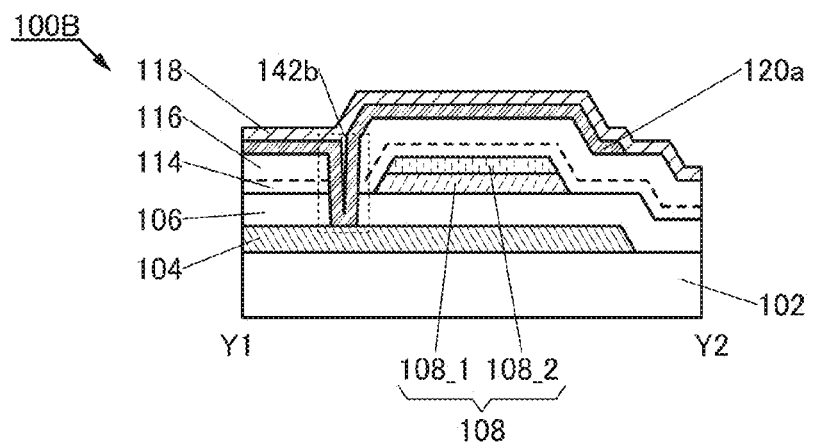

FIG. 7A is a top view of a transistor 100B that is a semiconductor device of one embodiment of the present invention. FIG. 7B is a cross-sectional view taken along a dashed dotted line X1-X2 in FIG. 7A, and FIG. 7C is a cross-sectional view taken along a dashed dotted line Y1-Y2 in FIG. 7A.

The transistor 100B includes the conductive film 104 over the substrate 102, the insulating film 106 over the substrate 102 and the conductive film 104, the oxide semiconductor film 108 over the insulating film 106, the conductive film 112a over the oxide semiconductor film 108, the conductive film 112b over the oxide semiconductor film 108, the insulating film 114 over the oxide semiconductor film 108, the conductive film 112a, and the conductive film 112b, the insulating film 116 over the insulating film 114, a conductive film 120a over the insulating film 116, a conductive film 120b over the insulating film 116, and the insulating film 118 over the insulating film 116 and the conductive films 120a and 120b.

The insulating films 114 and 116 have an opening 142a. The insulating films 106, 114, and 116 have an opening 142b. The conductive film 120a is electrically connected to the conductive film 104 through the opening 142b. Furthermore, the conductive film 120b is electrically connected to the conductive film 112b through the opening 142a.

Note that in the transistor 100B, the insulating film 106 functions as a first gate insulating film of the transistor 100B, the insulating films 114 and 116 function as a second gate insulating film of the transistor 100B, and the insulating film 118 functions as a protective insulating film of the transistor 100B. In the transistor 100B, the conductive film 104 functions as a first gate electrode, the conductive film 112a functions as a source electrode, and the conductive film 112b functions as a drain electrode. In the transistor 100B, the conductive film 120a functions as a second gate electrode, and the conductive film 120b functions as a pixel electrode of a display device.

As illustrated in FIG. 7C, the conductive film 120a is electrically connected to the conductive film 104 through the opening 142b. Accordingly, the conductive film 104 and the conductive film 120a are supplied with the same potential.

As illustrated in FIG. 7C, the oxide semiconductor film 108 is positioned so as to face the conductive film 104 and the conductive film 120a, and is sandwiched between the two conductive films functioning as the gate electrodes. The length in the channel length direction and the length in the channel width direction of the conductive film 120a are longer than the length in the channel length direction and the length in the channel width direction of the oxide semiconductor film 108, respectively. The whole oxide semiconductor film 108 is covered with the conductive film 120a with the insulating films 114 and 116 positioned therebetween.

In other words, the conductive film 104 and the conductive film 120a are connected through the opening provided in the insulating films 106, 114, and 116, and each include a region positioned outside an edge portion of the oxide semiconductor film 108.

With this structure, the oxide semiconductor film 108 included in the transistor 100B can be electrically surrounded by electric fields of the conductive films 104 and 120a. A device structure of a transistor, like that of the transistor 100B, in which electric fields of a first gate electrode and a second gate electrode electrically surround an oxide semiconductor film where a channel region is formed can be referred to as a surrounded channel (s-channel) structure.

Since the transistor 100B has the s-channel structure, an electric field for inducing a channel can be effectively applied to the oxide semiconductor film 108 by the conductive film 104 functioning as a first gate electrode; therefore, the current drive capability of the transistor 100B can be improved and high on-state current characteristics can be obtained. Since the on-state current can be increased, the size of the transistor 100B can be reduced. In addition, since the transistor 100B has a structure in which the oxide semiconductor film 108 is surrounded by the conductive film 104 functioning as the first gate electrode and the conductive film 120a functioning as the second gate electrode, the mechanical strength of the transistor 100B can be increased.

Note that for the conductive films 120a and 120b, materials similar to those described as the materials of the above-described conductive films 104, 112a, and 112b can be used. In particular, oxide conductor films (OC) are preferable as the conductive films 120a and 120b. When the conductive films 120a and 120b are formed using an oxide conductive film, oxygen can be added to the insulating films 114 and 116.

The other components of the transistor 100B are similar to those of the transistor 100 described above and have similar effects.

Figure 8A:
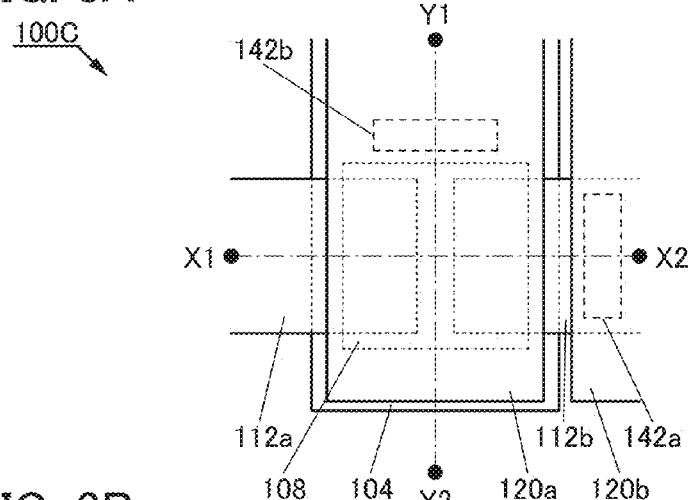
FIGS. 8A to 8C are a top view and cross-sectional views of a semiconductor device.
Figure 8B:
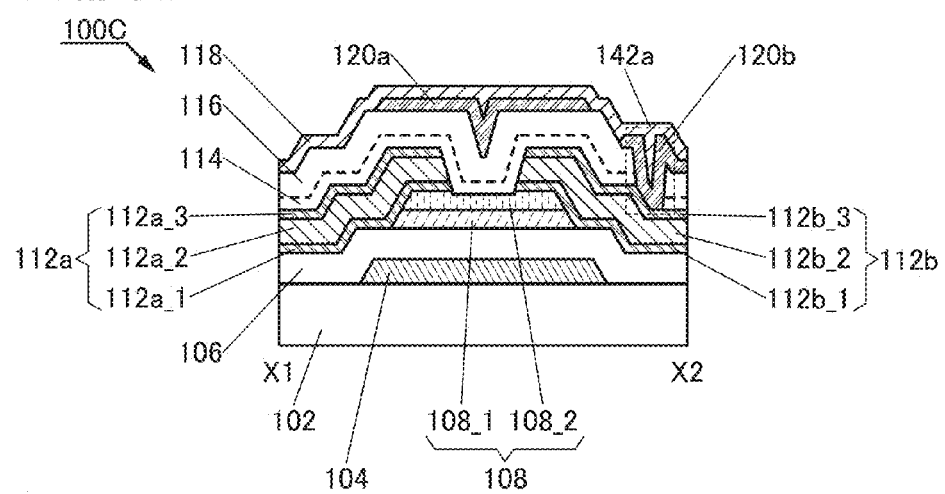
Figure 8C:
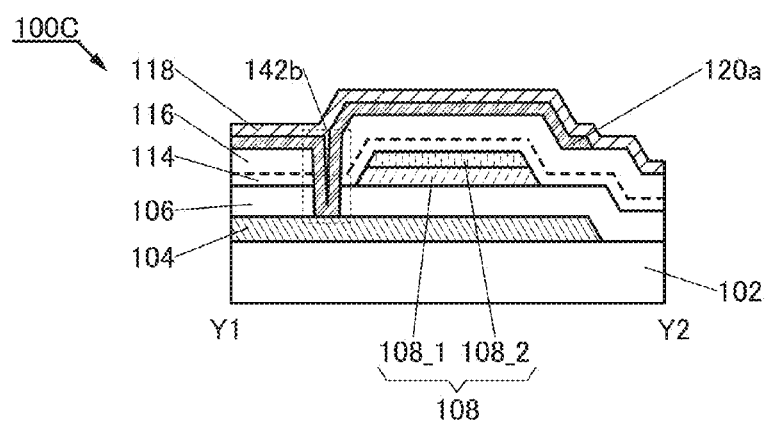

FIG. 8A is a top view of a transistor 100C that is a semiconductor device of one embodiment of the present invention. FIG. 8B is a cross-sectional view taken along a dashed dotted line X1-X2 in FIG. 8A, and FIG. 8C is a cross-sectional view taken along a dashed dotted line Y1-Y2 in FIG. 8A.

The transistor 100C is different from the above-described transistor 100B in that the conductive films 112a and 112b each have a three-layer structure. The conductive film 112a of the transistor 100C includes a conductive film 112a_1, a conductive film 112a_2 over the conductive film 112a_1, and a conductive film 112a_3 over the conductive film 112a 2. The conductive film 112b of the transistor 100C includes a conductive film 112b 1, a conductive film 112b 2 over the conductive film 112b 1, and a conductive film 112b 3 over the conductive film 112b 2.

For example, it is preferable that the conductive film 112a_1, the conductive film 112b 1, the conductive film 112a 3, and the conductive film 112b 3 contain one or more elements selected from titanium, tungsten, tantalum, molybdenum, indium, gallium, tin, and zinc. Furthermore, it is preferable that the conductive film 112a_2 and the conductive film 112b_2 contain one or more elements selected from copper, aluminum, and silver.

Specifically, the conductive film 112a_1, the conductive film 112b_1, the conductive film 112a_3, and the conductive film 112b_3 can be formed using an In—Sn oxide or an In—Zn oxide and the conductive film 112a_2 and the conductive film 112b_2 can be formed using copper.

The above structure is preferred because the wiring resistance of the conductive films 112a and 112b can be reduced and diffusion of copper to the oxide semiconductor film 108 can be inhibited. The above structure is preferred also because the contact resistance between the conductive film 112b and the conductive film 120b can be low. The other components of the transistor 100C are similar to those of the transistor 100 described above and have similar effects.

Figure 9A:
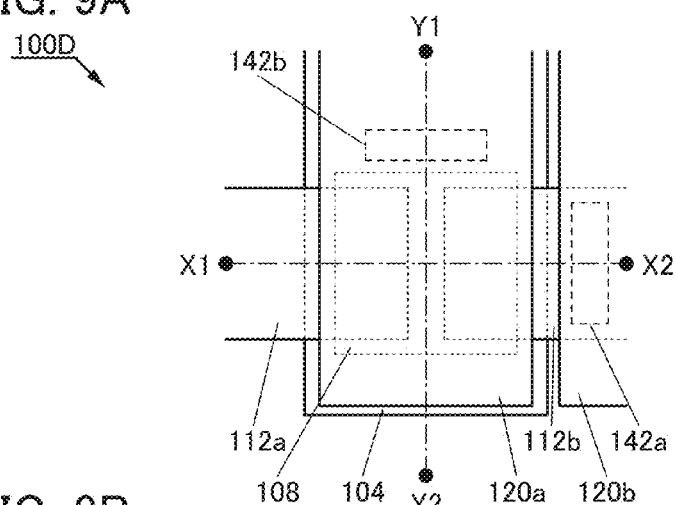
FIGS. 9A to 9C are a top views and cross-sectional views of a semiconductor device.
Figure 9B:
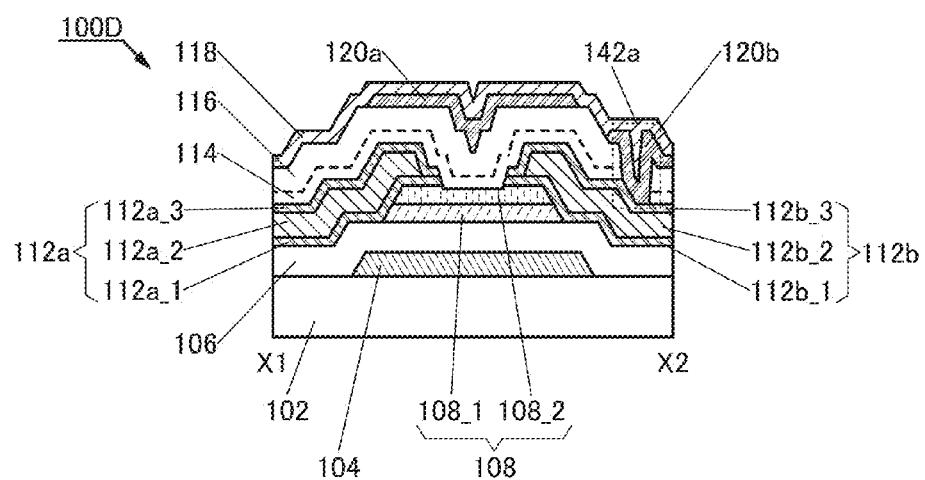
Figure 9C:
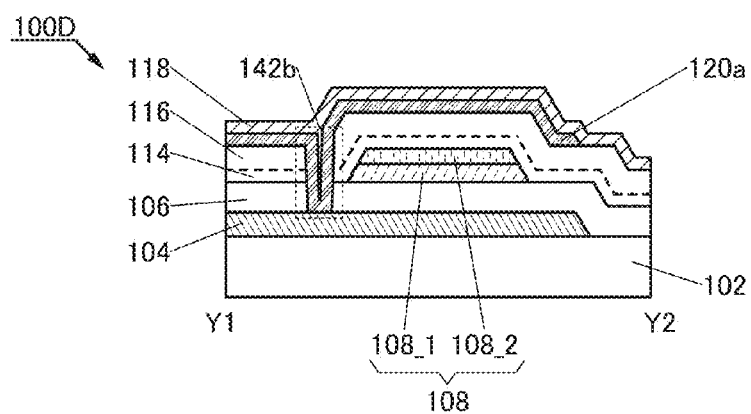

FIG. 9A is a top view of a transistor 100D that is a semiconductor device of one embodiment of the present invention. FIG. 9B is a cross-sectional view taken along a dashed dotted line X1-X2 in FIG. 9A, and FIG. 9C is a cross-sectional view taken along a dashed dotted line Y1-Y2 in FIG. 9A.

The transistor 100D is different from the above-described transistor 100B in that the conductive films 112a and 112b each have a three-layer structure. In addition, the transistor 100D is different from the above-described transistor 100C in the shapes of the conductive films 112a and 112b.

The conductive film 112a of the transistor 100D includes the conductive film 112a_1, the conductive film 112a_2 over the conductive film 112a_1, and the conductive film 112a_3 over the conductive film 112a 2. The conductive film 112b of the transistor 100C includes the conductive film 112b 1, the conductive film 112b 2 over the conductive film 112b 1, and the conductive film 112b 3 over the conductive film 112b 2. Note that the conductive film 112a_1, the conductive film 112a 2, the conductive film 112a 3, the conductive film 112b_1, the conductive film 112b_2, and the conductive film 112b_3 can be formed using any of the above-described materials.

An end portion of the conductive film 112a_1 has a region located outward from an end portion of the conductive film 112a_2. The conductive film 112a_3 covers a top surface and a side surface of the conductive film 112a_2 and has a region that is in contact with the conductive film 112a_1. An end portion of the conductive film 112b_1 has a region located outward from an end portion of the conductive film 112b_2. The conductive film 112b_3 covers a top surface and a side surface of the conductive film 112b_2 and has a region that is in contact with the conductive film 112b 1.

The above structure is preferred because the wiring resistance of the conductive films 112a and 112b can be reduced and diffusion of copper to the oxide semiconductor film 108 can be inhibited. Note that diffusion of copper can be more effectively inhibited in the transistor 100D than in the above-described transistor 100C. The above structure is preferred also because the contact resistance between the conductive film 112b and the conductive film 120b can be low. The other components of the transistor 100D are similar to those of the transistor 100 described above and have similar effects.

Figure 10A:
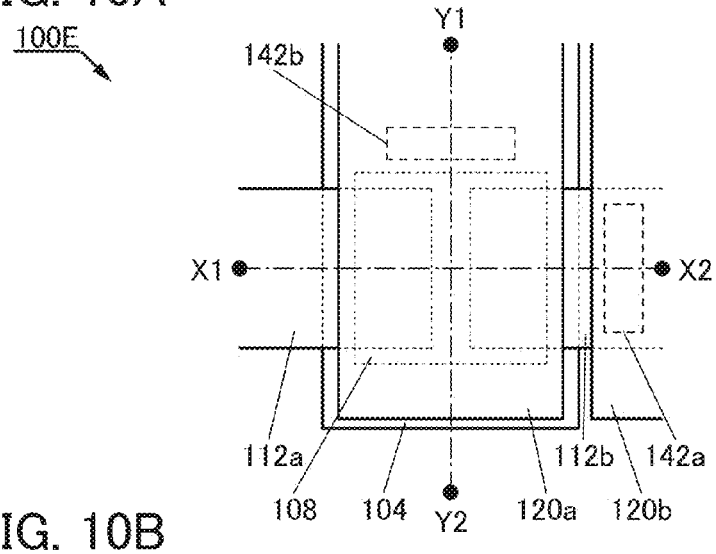
FIGS. 10A to 10C are a top view and cross-sectional views of a semiconductor device.
Figure 10B:
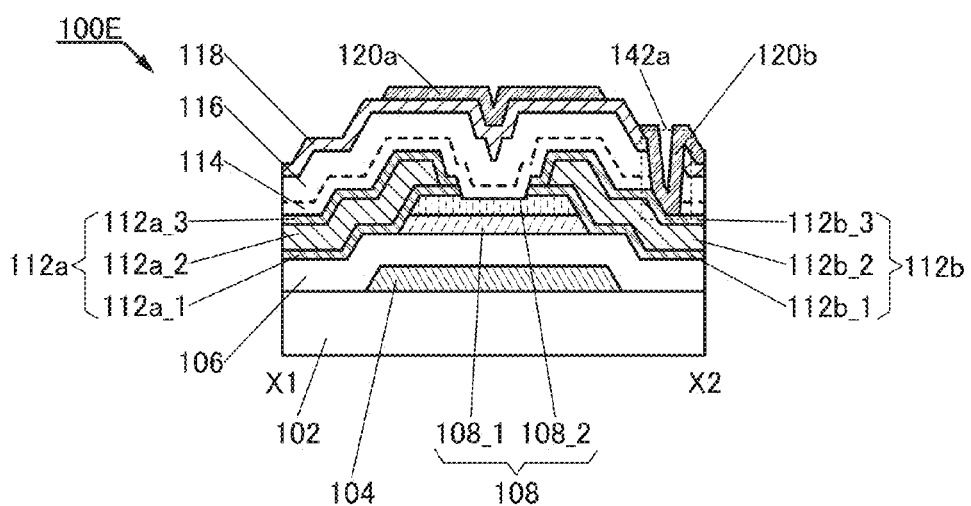
Figure 10C:
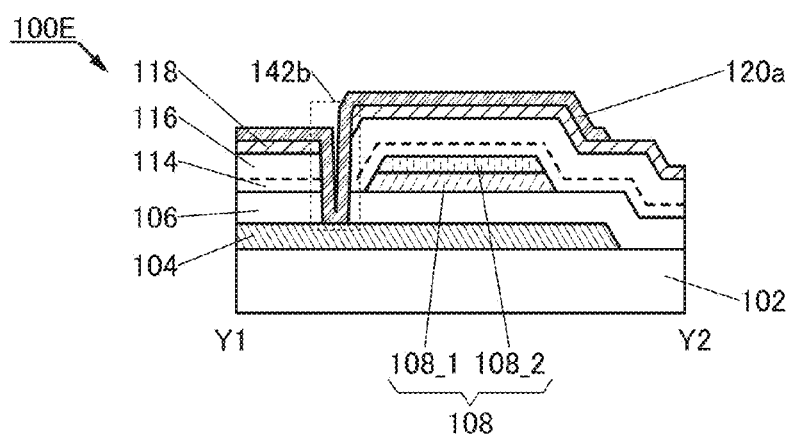

FIG. 10A is a top view of a transistor 100E that is a semiconductor device of one embodiment of the present invention. FIG. 10B is a cross-sectional view taken along the dashed-dotted line X1-X2 in FIG. 10A. FIG. 10C is a cross-sectional view taken along the dashed-dotted line Y1-Y2 in FIG. 10A.

The transistor 100E is different from the transistor 100D described above in the position of the conductive films 120a and 120b. Specifically, the conductive films 120a and 120b of the transistor 100E are positioned over the insulating film 118. Note that the other components of the transistor 100E are similar to those of the transistor 100D described above, and an effect similar to that of the transistor 100D can be obtained.

The structures of the transistors of this embodiment can be freely combined with each other.

<2-4. Manufacturing Method of Semiconductor Device>

Next, a manufacturing method of the transistor 100B that is a semiconductor device of one embodiment of the present invention is described with reference to FIG. 11A to FIG. 14C.

FIGS. 11A to 11C, FIGS. 12A to 12C, FIGS. 13A to 13C, and FIGS. 14A to 14C are cross-sectional views illustrating a manufacturing method of the semiconductor device. In each of FIGS. 11A to 11C, FIGS. 12A to 12C, FIGS. 13A to 13C, and FIGS. 14A to 14C, the left part is a cross-sectional view in the channel length direction, and the right part is a cross-sectional view in the channel width direction.

First, a conductive film is formed over the substrate 102 and processed through a lithography process and an etching process, whereby the conductive film 104 functioning as the first gate electrode is formed. Then, the insulating film 106 functioning as the first gate insulating film is formed over the conductive film 104 (see FIG. 11A).

In this embodiment, a glass substrate is used as the substrate 102, and as the conductive film 104 functioning as the first gate electrode, a 50-nm-thick titanium film and a 200-nm-thick copper film are each formed by a sputtering method. A 400-nm-thick silicon nitride film and a 50-nm-thick silicon oxynitride film as the insulating film 106 are formed by a PECVD method.

Note that the above-described silicon nitride film has a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and a power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and a power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and a power of 2000 W is supplied using a 27.12 MHz high-frequency power source.

Note that the first silicon nitride film, the second silicon nitride film, and the third silicon nitride film can each be formed at a substrate temperature of lower than or equal to 350° C.

When the silicon nitride film has the above-described three-layer structure, for example, in the case where a conductive film including copper is used as the conductive film 104, the following effect can be obtained.

The first silicon nitride film can inhibit diffusion of copper from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

Figure 11A:
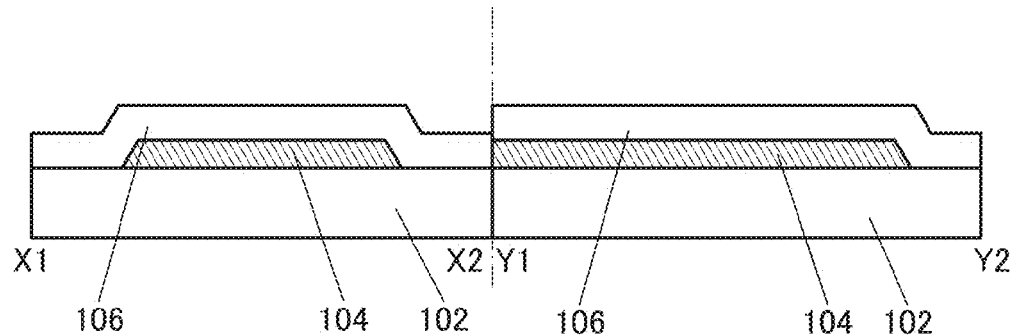
FIGS. 11A to 11C are cross-sectional views illustrating a method for manufacturing a semiconductor device.
Figure 11B:
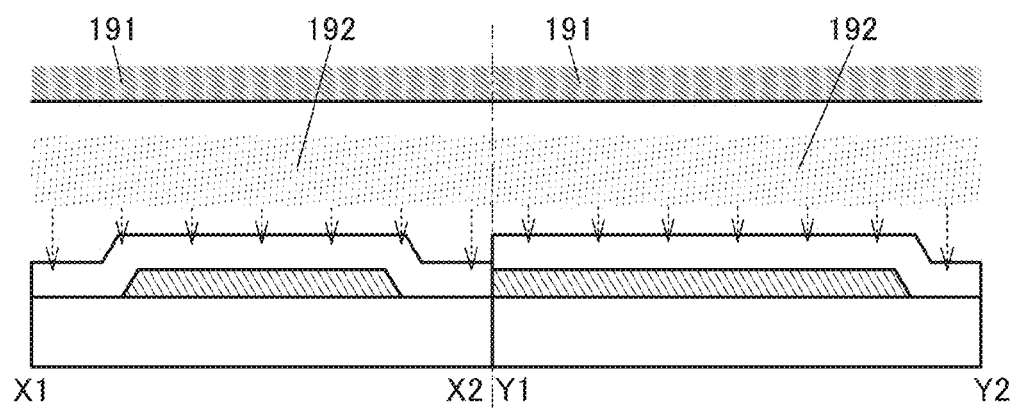
Figure 11C:
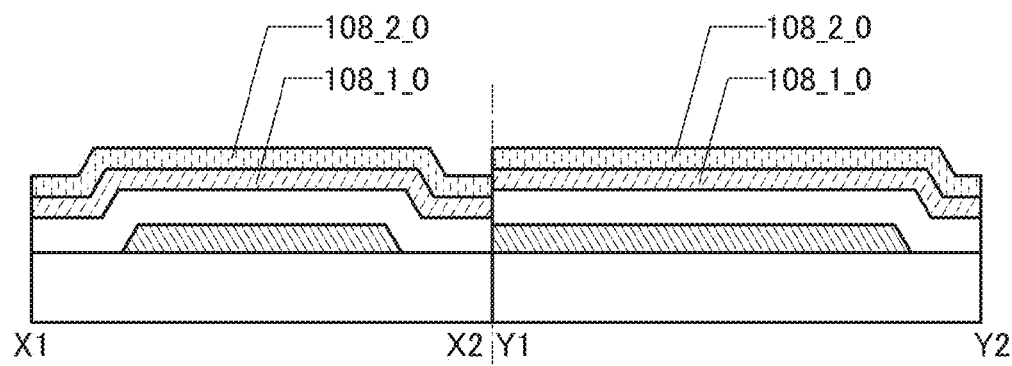

Next, an oxide semiconductor film 108_1_0 and an oxide semiconductor film 108_2_0 are formed over the insulating film 106 (see FIGS. 11B and 11C).

Note that FIG. 11B is a schematic cross-sectional view illustrating the inside of a deposition apparatus when the oxide semiconductor film 108_1_0 and the oxide semiconductor film 108_2_0 are formed over the insulating film 106. In FIG. 11B, a sputtering apparatus is used as the deposition apparatus, and a target 191 placed inside the sputtering apparatus and plasma 192 formed under the target 191 are schematically illustrated.

Note that in FIG. 11B, oxygen or excess oxygen added to the insulating film 106 is schematically shown by arrows of broken lines. When an oxygen gas is used in forming the oxide semiconductor film 108_1_0, oxygen can be suitably added to the insulating film 106.

First, the oxide semiconductor film 108_1_0 is formed over the insulating film 106. The thickness of the oxide semiconductor film 108_1_0 is greater than or equal to 1 nm and less than or equal to 25 nm, preferably greater than or equal to 5 nm and less than or equal to 20 nm. The oxide semiconductor film 108_1_0 is formed using one or both of an inert gas (typically, Ar gas) and an oxygen gas. Note that the proportion of the oxygen gas in the deposition gas for forming the oxide semiconductor film 108_1_0 (hereinafter also referred to as oxygen flow rate) is higher than or equal to 0% and lower than or equal to 30%, preferably higher than or equal to 5% and lower than or equal to 15%.

When the oxygen flow rate for forming the oxide semiconductor film 108_1_0 is set in the above range, the oxide semiconductor film 108_1_0 can have lower crystallinity.

Next, the oxide semiconductor film 108_2_0 is formed over the oxide semiconductor film 108_1_0. Note that when the oxide semiconductor film 108_2_0 is formed, plasma discharge is performed in an atmosphere containing an oxygen gas. At this time, oxygen is added into the oxide semiconductor film 108_1_0 over which the oxide semiconductor film 108_2_0 is to be formed. The oxygen flow rate in forming the oxide semiconductor film 108_2_0 is higher than 30% and lower than or equal to 100%, preferably higher than or equal to 50% and lower than or equal to 100%, further preferably higher than or equal to 70% and lower than or equal to 100%.

The thickness of the oxide semiconductor film 108_2_0 is greater than or equal to 20 nm and less than or equal to 100 nm, preferably greater than or equal to 20 nm and less than or equal to 50 nm.

Note that the percentage of oxygen flow rate for forming the oxide semiconductor film 108_2_0 is preferably higher than the percentage of oxygen flow rate for forming the oxide semiconductor film 108_1_0 as described above. In other words, the oxide semiconductor film 108_1_0 is preferably formed under a lower oxygen partial pressure than the oxide semiconductor film 108_2_0.

The substrate temperature in forming the oxide semiconductor film 108_1_0 and the oxide semiconductor film 108_2_0 is set at higher than or equal to room temperature (25° C.) and lower than or equal to 200° C., preferably higher than or equal to room temperature and lower than or equal to 130° C. Note that it is more favorable to successively form the oxide semiconductor film 108_1_0 and the oxide semiconductor film 108_2_0 in a vacuum because impurities can be prevented from being caught at the interfaces.

In addition, increasing the purity of a sputtering gas is necessary. For example, as an oxygen gas or an argon gas used as a sputtering gas, a gas which is highly purified to have a dew point of −40° C. or lower, preferably −80° C. or lower, further preferably −100° C. or lower, still further preferably −120° C. or lower is used, whereby entry of moisture or the like into the oxide semiconductor film can be minimized.

In the case where the oxide semiconductor film is deposited by a sputtering method, a chamber in a sputtering apparatus is preferably evacuated to be a high vacuum state (to the degree of about $5\times10^{-7}$ Pa to $1\times10^{-4}$ Pa) with an adsorption vacuum evacuation pump such as a cryopump in order to remove water or the like, which serves as an impurity for the oxide semiconductor film, as much as possible. In particular, the partial pressure of gas molecules corresponding to $H_2O$ (gas molecules corresponding to m/z=18) in the chamber in the standby mode of the sputtering apparatus is preferably lower than or equal to $1\times10^{-4}$ Pa, further preferably $5\times10^{-5}$ Pa.

In this embodiment, the oxide semiconductor film 108_1_0 is formed by a sputtering method using an In—Ga—Zn oxide target (In:Ga:Zn=4:2:4.1 in an atomic ratio). The substrate temperature during the formation of the oxide semiconductor film 108_1_0 is room temperature, and an argon gas at a flow rate of 180 sccm and an oxygen gas at a flow rate of 20 sccm is used as a deposition gas (percentage of oxygen flow rate: 10%).

The oxide semiconductor film 108_2_0 is formed by a sputtering method using an In—Ga—Zn oxide target (In:Ga:Zn=4:2:4.1 in an atomic ratio). The substrate temperature during the formation of the oxide semiconductor film 108_2_0 is room temperature, and an oxygen gas at a flow rate of 200 sccm is used as a deposition gas (percentage of oxygen flow rate: 100%).

When the percentage of oxygen flow rate in forming the oxide semiconductor film 108_1_0 is different from that in forming the oxide semiconductor film 108_2_0, a layered film having a plurality of kinds of crystallinity can be formed.

Next, the oxide semiconductor film 108_1_0 and the oxide semiconductor film 108_2_0 are processed into desired shapes, so that the island-shaped oxide semiconductor film 108_1 and the island-shaped oxide semiconductor film 108_2 are formed. In this embodiment, the oxide semiconductor film 108_1 and the oxide semiconductor film 108_2 constitute the oxide semiconductor film 108 (see FIG. 12A).

Heat treatment (hereinafter referred to as first heat treatment) is preferably performed after the oxide semiconductor film 108 is formed. By the first heat treatment, water, hydrogen, or the like contained in the oxide semiconductor film 108 can be reduced. The heat treatment for the purpose of reducing hydrogen, water, and the like may be performed before the oxide semiconductor film 108 is processed into an island shape. Note that the first heat treatment is one kind of treatment for increasing the purity of the oxide semiconductor film.

The first heat treatment can be performed at a temperature of, for example, higher than or equal to 150° C. and lower than the strain point of the substrate, preferably higher than or equal to 200° C. and lower than or equal to 450° C., further preferably higher than or equal to 250° C. and lower than or equal to 350° C.

Moreover, an electric furnace, an RTA apparatus, or the like can be used for the first heat treatment. With the use of an RTA apparatus, the heat treatment can be performed at a temperature higher than or equal to the strain point of the substrate if the heating time is short. Therefore, the heat treatment time can be shortened. The first heat treatment may be performed under an atmosphere of nitrogen, oxygen, ultra-dry air (air with a water content of 20 ppm or less, preferably 1 ppm or less, further preferably 10 ppb or less), or a rare gas (e.g., argon, helium). It is preferable that hydrogen, water, and the like not be contained in the nitrogen, oxygen, ultra-dry air, or rare gas. Furthermore, after heat treatment is performed under a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the number of oxygen vacancies in the oxide semiconductor film can be reduced.

Figure 12A:
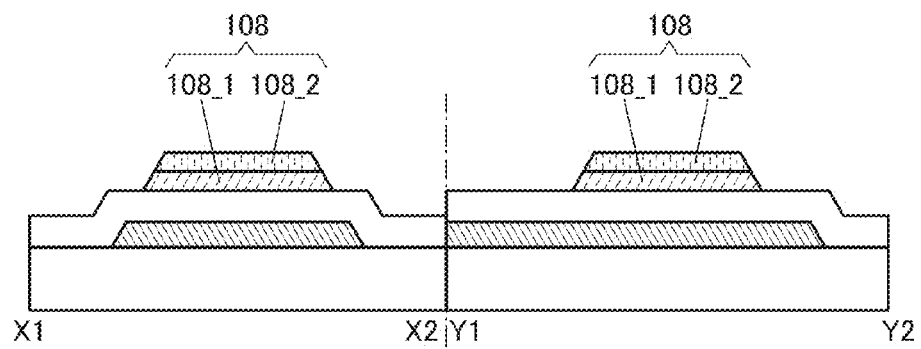
FIGS. 12A to 12C are cross-sectional views illustrating a method for manufacturing a semiconductor device.
Figure 12B:
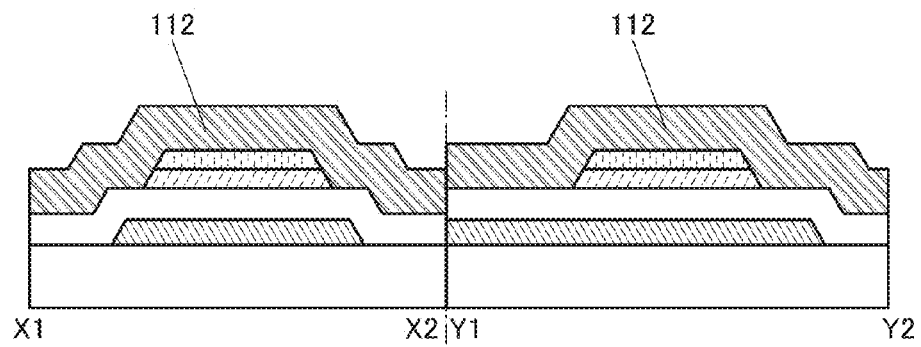

Next, a conductive film 112 is formed over the insulating film 106 and the oxide semiconductor film 108 (see FIG. 12B).

In this embodiment, as the conductive film 112, a 30-nm-thick titanium film, a 200-nm-thick copper film, and a 10-nm-thick titanium film are formed in this order by a sputtering method.

Figure 12C:
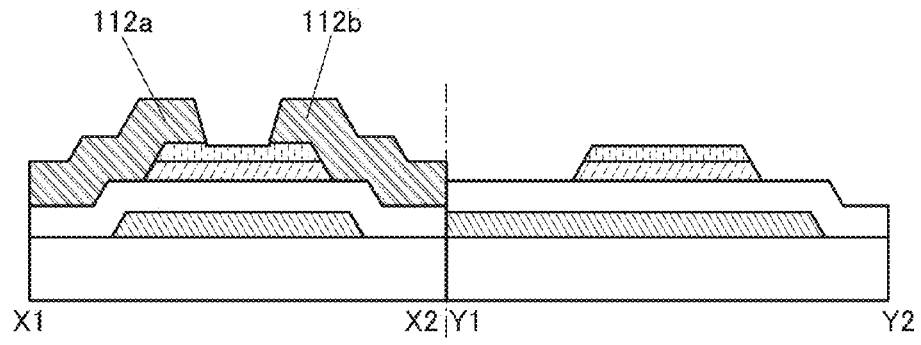

Next, the conductive film 112 is processed into a desired shape, so that the island-shaped conductive film 112a and the island-shaped conductive film 112b are formed (see FIG. 12C).

In this embodiment, the conductive film 112 is processed with a wet etching apparatus. Note that the method for processing the conductive film 112 is not limited to the above-described method, and a dry etching apparatus may be used, for example.

After the conductive films 112a and 112b are formed, a surface (on the back channel side) of the oxide semiconductor film 108 (specifically, the oxide semiconductor film 108_3) may be cleaned. The cleaning may be performed, for example, using a chemical solution such as a phosphoric acid. The cleaning using a chemical solution such as a phosphoric acid can remove impurities (e.g., an element included in the conductive films 112a and 112b) attached to the surface of the oxide semiconductor film 108_3. Note that the cleaning is not necessarily performed; in some cases, the cleaning is not performed.

In the step of forming the conductive films 112a and 112b and/or the cleaning step, the thickness of a region of the oxide semiconductor film 108 which is not covered with the conductive films 112a and 112b might be reduced.

Note that in the semiconductor device of one embodiment of the present invention, the region not covered with the conductive films 112a and 112b, i.e., an oxide semiconductor film 109_2 is an oxide semiconductor film with improved crystallinity. Impurities (in particular, constituent elements used in the conductive films 112a and 112b) are not easily diffused into an oxide semiconductor film with high crystallinity. Accordingly, a highly reliable semiconductor device can be provided.

Although FIG. 12C illustrates an example in which the surface of the oxide semiconductor film 108 not covered with the conductive films 112a and 112b, i.e., the surface of the oxide semiconductor film 108_2 has a depression, one embodiment of the present invention is not limited to this example and the surface of the oxide semiconductor film 108 not covered with the conductive films 112a and 112b does not necessarily have a depression.

Figure 13A:
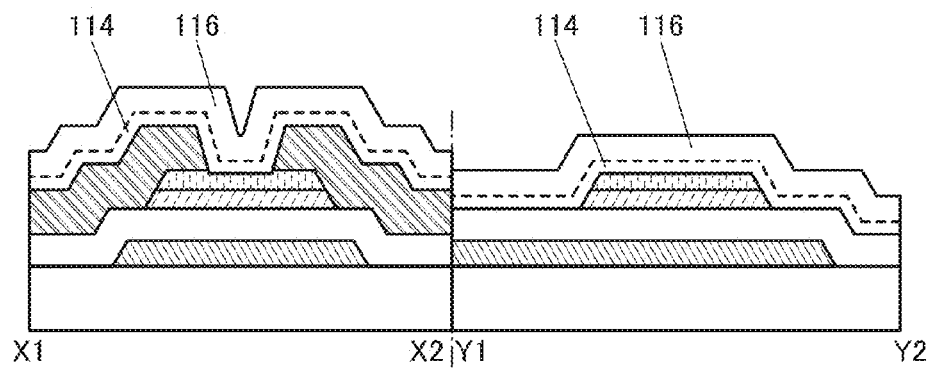
FIGS. 13A to 13C are cross-sectional views illustrating a method for manufacturing a semiconductor device.

Next, the insulating film 114 and the insulating film 116 are formed over the oxide semiconductor film 108 and the conductive films 112a and 112b (see FIG. 13A).

Note that after the insulating film 114 is formed, the insulating film 116 is preferably formed successively without exposure to the air. When the insulating film 116 is formed successively after the formation of the insulating film 114 without exposure to the air while at least one of the flow rate of a source gas, the pressure, high-frequency power, and the substrate temperature is adjusted, the concentration of impurities attributed to the atmospheric component at the interface between the insulating films 114 and 116 can be reduced.

For example, as the insulating film 114, a silicon oxynitride film can be formed by a PECVD method. In that case, a deposition gas containing silicon and an oxidizing gas are preferably used as a source gas. Typical examples of the deposition gas containing silicon include silane, disilane, trisilane, and silane fluoride.

In this embodiment, a silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^2$ W/cm$^2$ as the power density) is supplied to a parallel-plate electrode.

As the insulating film 116, a silicon oxide film or a silicon oxynitride film is formed under the following conditions: the substrate placed in the treatment chamber of the PECVD apparatus that is vacuum-evacuated is held at a temperature of higher than or equal to 180° C. and lower than or equal to 350° C., the pressure in the treatment chamber is higher than or equal to 100 Pa and lower than or equal to 250 Pa, preferably higher than or equal to 100 Pa and lower than or equal to 200 Pa, with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

As the deposition conditions of the insulating film 116, the high-frequency power having the above power density is supplied to the reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. In the film formed at a substrate temperature within the above temperature range, the bond between silicon and oxygen is weak, and accordingly, part of oxygen in the film is released by heat treatment in a later step. Thus, it is possible to form an oxide insulating film which contains more oxygen than that in the stoichiometric composition and from which part of oxygen is released by heating.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas containing silicon with respect to the oxidizing gas is increased, the amount of defects in the insulating film 116 can be reduced. Typically, it is possible to form an oxide insulating film in which the amount of defects is small, i.e., the spin density of a signal which appears at g=2.001 due to a dangling bond of silicon, is lower than $6 \times 10^{17}$ spins/cm$^3$, preferably lower than or equal to $3 \times 10^{17}$ spins/cm$^3$, further preferably lower than or equal to $1.5 \times 10^{17}$ spins/cm$^3$ by ESR measurement. As a result, the reliability of the transistor 100 can be improved.

Heat treatment (hereinafter referred to as second heat treatment) is preferably performed after the insulating films 114 and 116 are formed. The second heat treatment can reduce nitrogen oxide included in the insulating films 114 and 116. By the second heat treatment, part of oxygen contained in the insulating films 114 and 116 can be transferred to the oxide semiconductor film 108, so that the amount of oxygen vacancies included in the oxide semiconductor film 108 can be reduced.

The temperature of the second heat treatment is typically lower than 400° C., preferably lower than 375° C., further preferably higher than or equal to 150° C. and lower than or equal to 350° C. The second heat treatment may be performed in an atmosphere of nitrogen, oxygen, ultra-dry air (air with a water content of less than or equal to 20 ppm, preferably less than or equal to 1 ppm, further preferably less than or equal to 10 ppb), or a rare gas (e.g., argon, helium). It is preferable that hydrogen, water, and the like not be contained in the nitrogen, oxygen, ultra-dry air, or rare gas. An electric furnace, RTA, or the like can be used for the heat treatment.

Figure 13B:
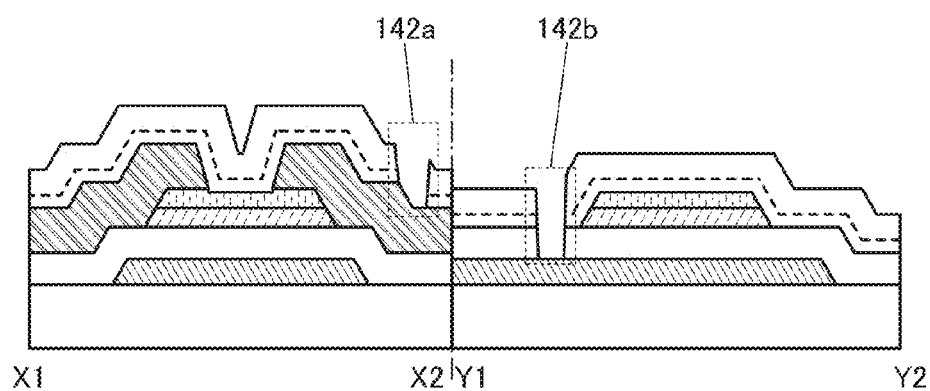

Next, the openings 142a and 142b are formed in desired regions in the insulating films 114 and 116 (see FIG. 13B).

In this embodiment, the openings 142a and 142b are formed with a dry etching apparatus. Note that the opening 142a reaches the conductive film 112b, and the opening 142b reaches the conductive film 104.

Figure 13C:
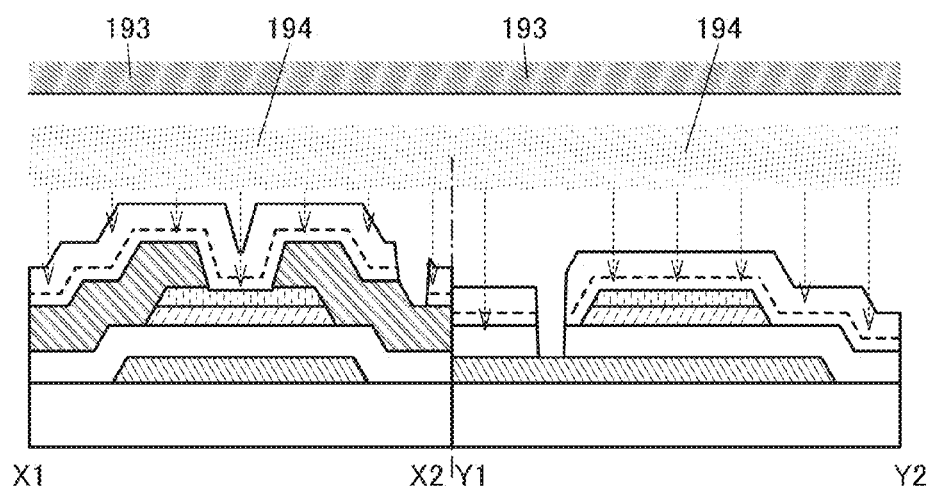
Figure 14A:
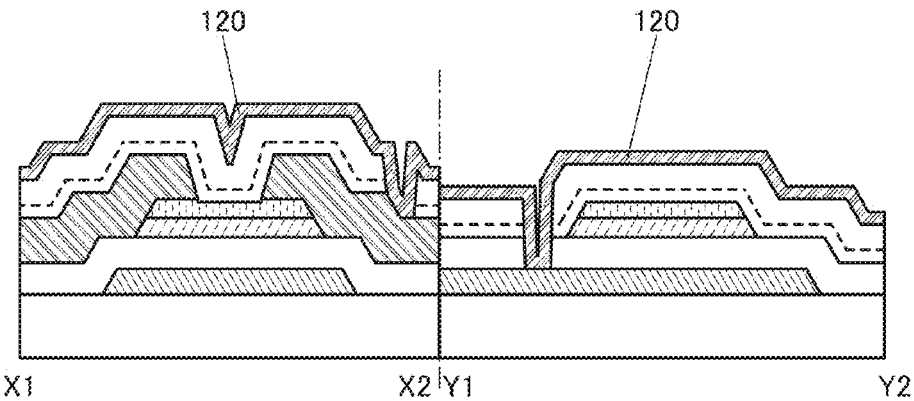
FIGS. 14A to 14C are cross-sectional views illustrating a method for manufacturing a semiconductor device.

Next, a conductive film 120 is formed over the insulating film 116 (see FIG. 13C and FIG. 14A).

FIG. 13C is a schematic cross-sectional view illustrating the inside of a deposition apparatus when the conductive film 120 is formed over the insulating film 116. In FIG. 13C, a sputtering apparatus is used as the deposition apparatus, and a target 193 placed inside the sputtering apparatus and plasma 194 formed under the target 193 are schematically illustrated.

When the conductive film 120 is formed, plasma discharge is performed in an atmosphere containing an oxygen gas. At this time, oxygen is added to the insulating film 116 over which the conductive film 120 is to be formed. When the conductive film 120 is formed, an inert gas (e.g., a helium gas, an argon gas, or a xenon gas) and the oxygen gas may be mixed.

The oxygen gas is mixed at least when the conductive film 120 is formed. The proportion of the oxygen gas in a deposition gas for forming the conductive film 120 is higher than 0% and lower than or equal to 100%, preferably higher than or equal to 10% and lower than or equal to 100%, further preferably higher than or equal to 30% and lower than or equal to 100%.

In FIG. 13C, oxygen or excess oxygen added to the insulating film 116 is schematically shown by arrows of broken lines.

In this embodiment, the conductive film 120 is formed by a sputtering method using an In—Ga—Zn oxide target (In:Ga:Zn=4:2:4.1 in an atomic ratio).

Note that although oxygen is added to the insulating film 116 when the conductive film 120 is formed in this embodiment, the method for adding oxygen is not limited to this example. For example, oxygen may be further added to the insulating film 116 after the conductive film 120 is formed.

As the method for adding oxygen to the insulating film 116, an ITSO film with a thickness of 5 nm may be formed using a target of an oxide including indium, tin, and silicon (an In—Sn—Si oxide, also referred to as ITSO) ($In_2O_3$: $SnO_2$: $SiO_2$=85:10:5 in wt %), for example. In that case, the thickness of the ITSO film is preferably greater than or equal to 1 nm and less than or equal to 20 nm or greater than or equal to 2 nm and less than or equal to 10 nm, in which case oxygen is favorably transmitted and release of oxygen can be inhibited. Then, oxygen is added to the insulating film 116 through the ITSO film. Oxygen can be added by, for example, ion doping, ion implantation, or plasma treatment. By application of a bias voltage to the substrate side when oxygen is added, oxygen can be effectively added to the insulating film 116. An ashing apparatus is used, for example, and the power density of the bias voltage applied to the substrate side of the ashing apparatus can be greater than or equal to 1 $W/cm^2$ and less than or equal to 5 $W/cm^2$. The substrate temperature during addition of oxygen is higher than or equal to room temperature and lower than or equal to 300° C., preferably higher than or equal to 100° C. and lower than or equal to 250° C., whereby oxygen can be added efficiently to the insulating film 116.

Figure 14B:
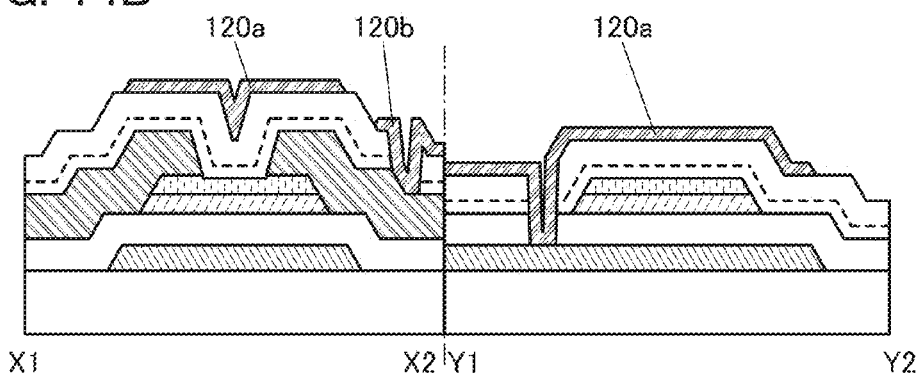

Next, the conductive film 120 is processed into a desired shape, so that the island-shaped conductive films 120a and 120b are formed (see FIG. 14B).

In this embodiment, the conductive film 120 is processed with a wet etching apparatus.

Figure 14C:
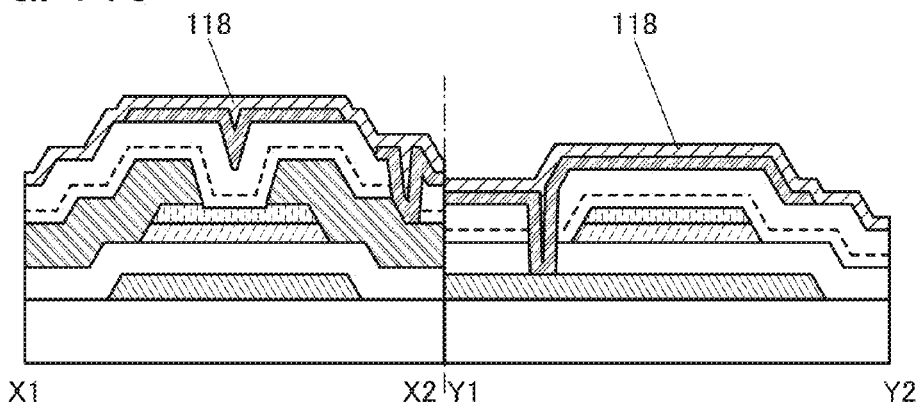

Next, the insulating film 118 is formed over the insulating film 116 and the conductive films 120a and 120b (see FIG. 14C).

The insulating film 118 includes either or both of hydrogen and nitrogen. As the insulating film 118, a silicon nitride film is preferably used, for example. The insulating film 118 can be formed by a sputtering method or a PECVD method, for example. In the case where the insulating film 118 is formed by a PECVD method, for example, the substrate temperature is lower than 400° C., preferably lower than 375° C., and further preferably higher than or equal to 180° C. and lower than or equal to 350° C. The substrate temperature at which the insulating film 118 is formed is preferably within the above range because a dense film can be formed. Furthermore, when the substrate temperature at which the insulating film 118 is formed is within the above range, oxygen or excess oxygen in the insulating films 114 and 116 can be moved to the oxide semiconductor film 108.

In the case where a silicon nitride film is formed by a PECVD method as the insulating film 118, a deposition gas containing silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen are few, can be formed. If the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, the flow rate of nitrogen is set to be preferably 5 times or more and 50 times or less, further preferably 10 times or more and 50 times or less the flow rate of ammonia.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to a parallel-plate electrode with a 27.12 MHz high-frequency power source. The PECVD apparatus is a parallel-plate PECVD apparatus in which the electrode area is 6000 $cm^2$, and the power per unit area (power density) into which the supplied power is converted is $1.7\times10^{-1}$ $W/cm^2$.

In the case where the conductive films 120a and 120b are formed using an In—Ga—Zn oxide target (In:Ga:Zn=4:2:4.1 in an atomic ratio), either or both of hydrogen and nitrogen included in the insulating film 118 might enter the conductive films 120a and 120b. In this case, either or both of hydrogen and nitrogen might be bonded to oxygen vacancies in the conductive films 120a and 120b to cause a reduction in the resistance of the conductive films 120a and 120b.

After the insulating film 118 is formed, heat treatment similar to the first heat treatment or the second heat treatment (hereinafter referred to as third heat treatment) may be performed.

By the third heat treatment, oxygen included in the insulating film 116 moves into the oxide semiconductor film 108 to fill the oxygen vacancies in the oxide semiconductor film 108.

Through the above process, the transistor 100B illustrated in FIGS. 7A to 7C can be manufactured.

The transistor 100 illustrated in FIGS. 5A to 5C can be manufactured by forming the insulating film 118 after the step of FIG. 13A. The transistor 100A illustrated in FIGS. 6A to 6C can be manufactured by changing the formation order of the conductive films 112a and 112b and the insulating films 114 and 116 and, in addition, adding a step for forming the openings 141a and 141b in the insulating films 114 and 116.

At least part of this embodiment can be implemented in combination with any of the other embodiments described in this specification as appropriate.

Embodiment 3

In this embodiment, the composition of a cloud-aligned composite oxide semiconductor (CAC-OS) included in the oxide semiconductor film of one embodiment of the present invention is described.

<3-1. Composition of CAC>

The CAC has, for example, a composition in which elements included in an oxide semiconductor film are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of an oxide semiconductor film, a state in which one or more metal elements are mixed is referred to as a mosaic pattern or a patch-like pattern. Regions of the metal element each have a size of greater than or equal to 0.5 nm and less than or equal to 10 nm, preferably greater than or equal to 1 nm and less than or equal to 2 nm, or a similar size.

For example, of In—Ga—Zn oxide (hereinafter also referred to as IGZO), CAC-IGZO has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0), gallium zinc oxide ($Ga_{X4}Zn_{Y4}O_{Z4}$, where X4, Y4, and Z4 are real numbers greater than 0), or the like, and a mosaic pattern is formed. Then, $InO_{X1}$ or $In_{X2}Zn_{Y2}O_{Z2}$ forming the mosaic pattern is distributed in the oxide semiconductor film. This composition is also referred to as a cloud-like composition.

That is, CAC-IGZO is a composite oxide semiconductor film having a composition in which a region including $In_{X2}Zn_{Y2}O_{Z2}$ or $InO_{X1}$ as a main component and a region including $GaO_{X3}$ as a main component are distributed unevenly and mixed. Surrounding portions of the region including $In_{X2}Zn_{Y2}O_{Z2}$ or $InO_{X1}$ as a main component and the region including $GaO_{X3}$ as a main component are unclear (blurred), so that a boundary is not clearly observed in some cases.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC relates to the material composition. In a material composition of CAC including In, Ga, Zn, and O, a plurality of regions including Ga as a main component and a plurality of regions including In as a main component are randomly dispersed in a mosaic pattern. Therefore, the crystal structure is a secondary element for the CAC composition. Note that the region including Ga as a main component and the region including In as a main component can be examined by EDX mapping. Note that the region including Ga as a main component and the region including In as a main component may each be referred to as a nanoparticle. The diameter of the nanoparticle is greater than or equal to 0.5 nm and less than or equal to 10 nm, typically greater than or equal to 1 nm and less than or equal to 2 nm. Surrounding portions of the nanoparticles are unclear (blurred), so that a boundary is not clearly observed in some cases.

Note that in the CAC composition, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases. For example, the density of an element which is a main component is gradually lowered from the central portion of the region toward the surrounding portion. For example, the number (abundance) of atoms of an element countable in an EDX mapping image of a cross-sectional photograph has a gradual change, and thus, the surrounding portion of the region is unclear (blurred) in the EDX mapping image. Specifically, from the central portion toward the surrounding portion in the region including $GaO_{X3}$ as a main component, the number of Ga atoms gradually reduces and the number of Zn atoms gradually increases, so that a region including $Ga_xZn_yO_z$ as a main component gradually appears. Accordingly, the surrounding portion of the region including $GaO_{X3}$ as a main component is unclear (blurred) in the EDX mapping image.

<3-2. Analysis of CAC-IGZO>

Next, measurement results of an oxide semiconductor film over a substrate by a variety of methods are described.

[Structure of Samples and Formation Method Thereof]

Nine samples of one embodiment of the present invention are described below. The samples are formed at different substrate temperatures and with different ratios of an oxygen gas flow rate in formation of the oxide semiconductor film. Note that each sample includes a substrate and an oxide semiconductor film over the substrate.

A method for forming the samples is described.

A glass substrate is used as the substrate. Over the glass substrate, a 100-nm-thick In—Ga—Zn oxide is formed as an oxide semiconductor film with a sputtering apparatus. The formation conditions are as follows: the pressure in a chamber is 0.6 Pa, and a metal oxide target (with an atomic ratio of In:Ga:Zn=4:2:4.1) is used as a target. The metal oxide target provided in the sputtering apparatus is supplied with an AC power of 2500 W.

As for the conditions in the formation of the oxide of the nine samples, the substrate temperature is set to a temperature that is not increased by intentional heating (hereinafter such a temperature is also referred to as R.T.), to 130° C., and to 170° C. The ratio of a flow rate of an oxygen gas to a flow rate of a mixed gas of Ar and oxygen (also referred to as an oxygen gas flow rate ratio) is set to 10%, 30%, and 100%.

[Analysis by X-Ray Diffraction]

In this section, results of X-ray diffraction (XRD) measurement performed on the nine samples are described. As an XRD apparatus, D8 ADVANCE manufactured by Bruker AXS is used. The conditions are as follows: scanning is performed by an out-of-plane method at θ/2θ, the scanning range is 15 deg. to 50 deg., the step width is 0.02 deg., and the scanning speed is 3.0 deg./min.

Figure 16:
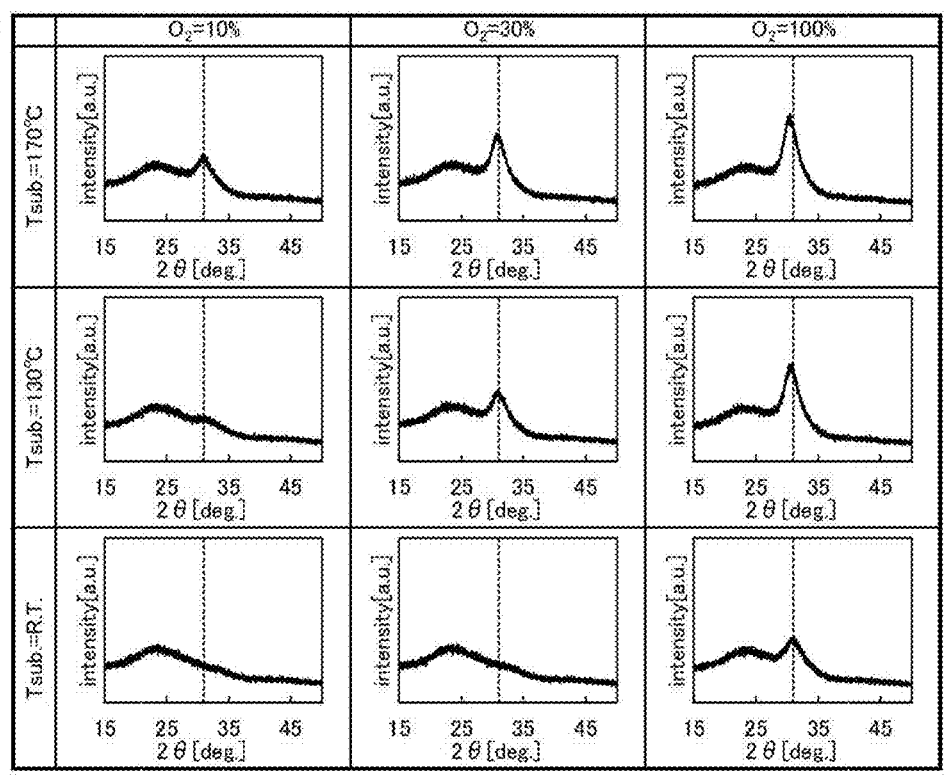
FIG. 16 shows measured XRD spectra.

FIG. 16 shows an XRD spectrum of the samples measured by an Out-of-plane method. In FIG. 16, the top row shows the measurement results of the samples formed at a substrate temperature of 170° C.; the middle row shows the measurement results of the samples formed at a substrate temperature of 130° C.; the bottom row shows the measurement results of the samples formed at a substrate temperature of R.T. The left column shows the measurement results of the samples formed with an oxygen gas flow rate ratio of 10%; the middle column shows the measurement results of the samples formed with an oxygen gas flow rate ratio of 30%;

the right column shows the measurement results of the samples formed with an oxygen gas flow rate ratio of 100%.

In the XRD spectra shown in FIG. 16, the higher the substrate temperature at the time of formation is or the higher the oxygen gas flow rate ratio at the time of formation is, the higher the intensity of the peak at around 2θ=31° is. Note that it is found that the peak at around 2θ=31° is derived from a crystalline IGZO compound whose c-axes are aligned in a direction substantially perpendicular to a formation surface or a top surface of the crystalline IGZO compound (such a compound is also referred to as c-axis aligned crystalline (CAAC) IGZO).

As shown in the XRD spectra in FIG. 16, as the substrate temperature at the time of formation is lower or the oxygen gas flow rate ratio at the time of formation is lower, a peak becomes less clear. Accordingly, it is found that there are no alignment in the a-b plane direction and c-axis alignment in the measured areas of the samples that are formed at a lower substrate temperature or with a lower oxygen gas flow rate ratio.

Note that conditions with which a clear peak does not appear in the XRD spectra shown in FIG. 16 are used to form the first oxide semiconductor film described in Embodiment 1. For example, conditions in which the substrate temperature is R.T. and the oxygen gas flow rate ratio is 10%, conditions in which in which the substrate temperature is R.T. and the oxygen gas flow rate ratio is 30%, or conditions in which the substrate temperature is 130° C. and the oxygen gas flow rate ratio is 10% are selected from the conditions used for forming the nine samples shown in FIG. 16.

Conditions with which a clear peak appears at or near 2θ=31° in the XRD spectra shown in FIG. 16 are used to form the second oxide semiconductor film described in Embodiment 1. For example, conditions in which the substrate temperature is 130° C. and the oxygen gas flow rate ratio is 100%, conditions in which the substrate temperature is 170° C. and the oxygen gas flow rate ratio is 30%, or conditions in which the substrate temperature is 170° C. and the oxygen gas flow rate ratio is 100% are selected from the conditions used for forming the nine samples shown in FIG. 16.

[Analysis with Electron Microscope]

This section describes the observation and analysis results of the samples formed at a substrate temperature of R.T. and with an oxygen gas flow rate ratio of 10% with a high-angle annular dark-field scanning transmission electron microscope (HAADF-STEM). An image obtained with an HAADF-STEM is also referred to as a TEM image.

Described are the results of image analysis of plan-view images and cross-sectional images obtained with an HAADF-STEM (also referred to as plan-view TEM images and cross-sectional TEM images, respectively). The TEM images are observed with a spherical aberration corrector function. The HAADF-STEM images are obtained using an atomic resolution analytical electron microscope JEM-ARM200F manufactured by JEOL Ltd. under the following conditions: the acceleration voltage is 200 kV, and irradiation with an electron beam with a diameter of approximately 0.1 nm is performed.

FIG. 17A is a plan-view TEM image of the sample formed at a substrate temperature of R.T. and an oxygen gas flow rate ratio of 10%. FIG. 17B is a cross-sectional TEM image of the sample formed at a substrate temperature of R.T. and with an oxygen gas flow rate ratio of 10%.

[Analysis of Electron Diffraction Patterns]

This section describes electron diffraction patterns obtained by irradiation of the sample formed at a substrate temperature of R.T. and an oxygen gas flow rate ratio of 10% with an electron beam with a probe diameter of 1 nm (also referred to as a nanobeam).

Electron diffraction patterns of points indicated by black dots a1, a2, a3, a4, and a5 in the plan-view TEM image in FIG. 17A of the sample formed at a substrate temperature of R.T. and an oxygen gas flow rate ratio of 10% are observed. Note that the electron diffraction patterns are observed while electron beam irradiation is performed at a constant rate for 35 seconds. FIGS. 17C, 17D, 17E, 17F, and 17G show the results of the points indicated by the black dots a1, a2, a3, a4, and a5, respectively.

In FIGS. 17C, 17D, 17E, 17F, and 17G, regions with high luminance in a circular (ring) pattern can be shown. Furthermore, a plurality of spots can be shown in a ring-like shape.

Electron diffraction patterns of points indicated by black dots b1, b2, b3, b4, and b5 in the cross-sectional TEM image in FIG. 17B of the sample formed at a substrate temperature of R.T. and an oxygen gas flow rate ratio of 10% are observed. FIGS. 17H, 17I, 17J, 17K, and 17L show the results of the points indicated by the black dots b1, b2, b3, b4, and b5, respectively.

In FIGS. 17H, 17I, 17J, 17K, and 17L, regions with high luminance in a ring pattern can be shown. Furthermore, a plurality of spots can be shown in a ring-like shape.

For example, when an electron beam with a probe diameter of 300 nm is incident on a CAAC-OS including an $InGaZnO_4$ crystal in a direction parallel to the sample surface, a diffraction pattern including a spot derived from the (009) plane of the $InGaZnO_4$ crystal is obtained. That is, the CAAC-OS has c-axis alignment and the c-axes are aligned in the direction substantially perpendicular to the formation surface or the top surface of the CAAC-OS. Meanwhile, a ring-like diffraction pattern is shown when an electron beam with a probe diameter of 300 nm is incident on the same sample in a direction perpendicular to the sample surface. That is, it is found that the CAAC-OS has neither a-axis alignment nor b-axis alignment.

Furthermore, a diffraction pattern like a halo pattern is observed when an oxide semiconductor film including a nanocrystal (a nanocrystalline oxide semiconductor (nc-OS)) is subjected to electron diffraction using an electron beam with a large probe diameter (e.g., 50 nm or larger). Meanwhile, bright spots are shown in a nanobeam electron diffraction pattern of the nc-OS obtained using an electron beam with a small probe diameter (e.g., smaller than 50 nm). Furthermore, in a nanobeam electron diffraction pattern of the nc-OS, regions with high luminance in a circular (ring) pattern are shown in some cases. Also in a nanobeam electron diffraction pattern of the nc-OS, a plurality of bright spots are shown in a ring-like shape in some cases.

The electron diffraction pattern of the sample formed at a substrate temperature of R.T. and with an oxygen gas flow rate ratio of 10% has regions with high luminance in a ring pattern and a plurality of bright spots appear in the ring-like pattern. Accordingly, the sample formed at a substrate temperature of R.T. and with an oxygen gas flow rate ratio of 10% exhibits an electron diffraction pattern similar to that of the nc-OS and does not show alignment in the plane direction and the cross-sectional direction.

According to what is described above, an oxide semiconductor film formed at a low substrate temperature or with a low oxygen gas flow rate ratio is likely to have characteristics distinctly different from those of an oxide semiconductor film having an amorphous structure and an oxide semiconductor film having a single crystal structure.

[Elementary Analysis]

This section describes the analysis results of elements included in the sample formed at a substrate temperature of R.T. and with an oxygen gas flow rate ratio of 10%. For the analysis, by energy dispersive X-ray spectroscopy (EDX), EDX mapping images are obtained. An energy dispersive X-ray spectrometer AnalysisStation JED-2300T manufactured by JEOL Ltd. is used as an elementary analysis apparatus in the EDX measurement. A Si drift detector is used to detect an X-ray emitted from the sample.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of an EDX spectrum of the point are attributed to electron transition to the L shell in an In atom, electron transition to the K shell in a Ga atom, and electron transition to the K shell in a Zn atom and the K shell in an O atom, and the proportions of the atoms in the point are calculated. An EDX mapping image indicating distributions of proportions of atoms can be obtained through the process in an analysis target region of a sample.

Figure 18A:
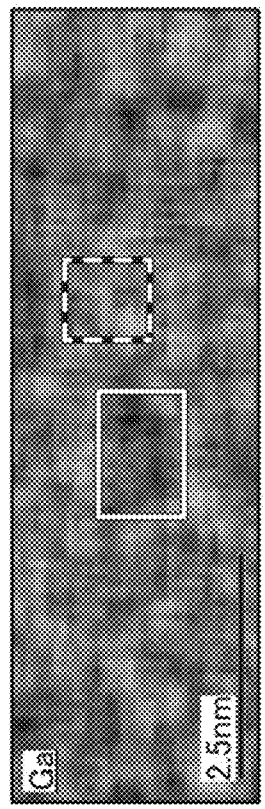
FIGS. 18A to 18C show EDX mapping images of a sample.
Figure 18B:
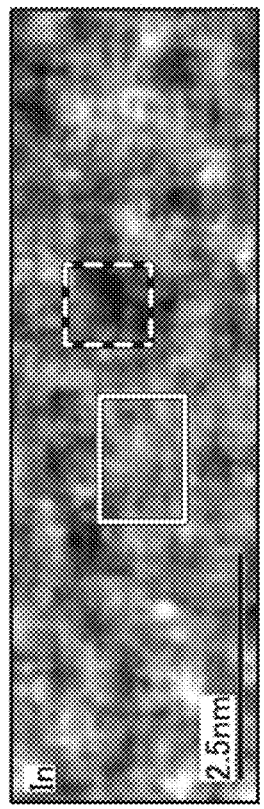
Figure 18C:
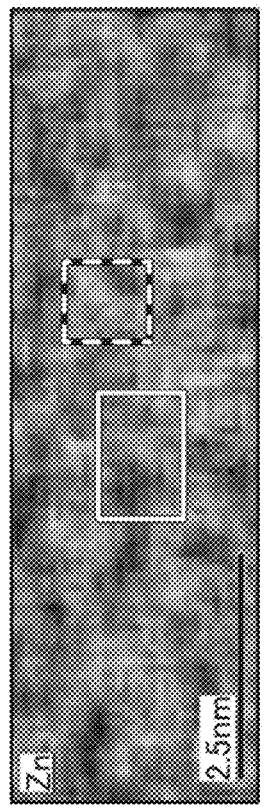

FIGS. 18A to 18C show EDX mapping images in a cross section of the sample formed at a substrate temperature of R.T. and with an oxygen gas flow rate ratio of 10%. FIG. 18A shows an EDX mapping image of Ga atoms. The proportion of the Ga atoms in all the atoms is 1.18 atomic % to 18.64 atomic %. FIG. 18B shows an EDX mapping image of In atoms. The proportion of the In atoms in all the atoms is 9.28 atomic % to 33.74 atomic %. FIG. 18C shows an EDX mapping image of Zn atoms. The proportion of the Zn atoms in all the atoms is 6.69 atomic % to 24.99 atomic %. FIGS. 18A to 18C show the same region in the cross section of the sample formed at a substrate temperature of R.T. and with an oxygen gas flow rate ratio of 10%. In the EDX mapping images, the proportion of an element is indicated by grayscale: the more measured atoms exist in a region, the brighter the region is; the less measured atoms exist in a region, the darker the region is. The magnification of the EDX mapping images in FIGS. 18A to 18C is 7200000 times.

The EDX mapping images in FIGS. 18A to 18C show relative distribution of brightness indicating that each element has a distribution in the sample formed at a substrate temperature of R.T. and with an oxygen gas flow rate ratio of 10%. Areas surrounded by solid lines and areas surrounded by dashed lines in FIGS. 18A to 18C are examined.

In FIG. 18A, a relatively dark region occupies a large area in the area surrounded by the solid line, while a relatively bright region occupies a large area in the area surrounded by the dashed line. In FIG. 18B, a relatively bright region occupies a large area in the area surrounded by the solid line, while a relatively dark region occupies a large area in the area surrounded by the dashed line.

That is, the areas surrounded by the solid lines are regions including a relatively large number of In atoms and the areas surrounded by the dashed lines are regions including a relatively small number of In atoms. In FIG. 18C, the right portion of the area surrounded by the solid line is relatively bright and the left portion thereof is relatively dark. Thus, the area surrounded by the solid line is a region including $In_{X2}Zn_{Y2}O_{Z2}$, $InO_{X1}$, or the like as a main component.

The area surrounded by the solid line is a region including a relatively small number of Ga atoms and the area surrounded by the dashed line is a region including a relatively large number of Ga atoms. In FIG. 18C, the upper left portion of the area surrounded by the dashed line is relatively bright and the lower right portion thereof is relatively dark. Thus, the area surrounded by the dashed line is a region including $GaO_{X3}$, $Ga_{X4}Zn_{Y4}O_{Z4}$, or the like as a main component.

Furthermore, as shown in FIGS. 18A to 18C, the In atoms are relatively more uniformly distributed than the Ga atoms, and regions including $InO_{X1}$ as a main component are seemingly joined to each other through a region including $In_{X2}Zn_{Y2}O_{Z2}$ as a main component. Thus, the regions including $In_{X2}Zn_{Y2}O_{Z2}$ and $InO_{X1}$ as main components extend like a cloud.

An In—Ga—Zn oxide having a structure in which the regions including GaO as a main component and the regions including $In_{X2}Zn_{Y2}O_{Z2}$ or $InO_{X1}$ as main components are unevenly distributed and mixed can be referred to as CAC-IGZO.

As shown in FIGS. 18A to 18C, each of the regions including $GaO_{X3}$ or the like as a main component and the regions including $In_{X2}Zn_{Y2}O_{Z2}$ or $InO_{X1}$ as a main component has a size of greater than or equal to 0.5 nm and less than or equal to 10 nm, or greater than or equal to 0.3 nm and less than or equal to 3 nm. Note that it is preferable that a diameter of a region including each metal element as a main component be greater than or equal to 1 nm and less than or equal to 2 nm in the EDX mapping images.

As described above, CAC-IGZO has a structure different from that of an IGZO compound in which metal elements are evenly distributed, and has characteristics different from those of the IGZO compound. That is, CAC-IGZO includes regions including $GaO_{X3}$ or the like as a main component and regions including $In_{X2}Zn_{Y2}O_{Z2}$ or $InO_{X1}$ as a main component. Accordingly, when CAC-IGZO is used for a semiconductor element, the property derived from $GaO_{X3}$ or the like and the property derived from $In_{X2}Zn_{Y2}O_{Z2}$ or $InO_{X1}$ complement each other, whereby high on-state current ($I_{on}$) and high field-effect mobility (pt) can be achieved.

Note that the conduction mechanism of a semiconductor element including CAC-IGZO that achieves high on-state current ($I_{on}$) and high field-effect mobility (pt) can be presumed by a random-resistance-network model in percolation theory.

A semiconductor element including CAC-IGZO has high reliability. Thus, CAC-IGZO is suitably used in a variety of semiconductor devices typified by a display.

At least part of this embodiment can be implemented in combination with any of the other embodiments described in this specification as appropriate.

Embodiment 4

In this embodiment, an oxide semiconductor film of one embodiment of the present invention is described with reference to FIG. 19A to FIG. 24C.

<4-1. Oxide Semiconductor Film>

The oxide semiconductor film preferably contains at least indium. In particular, indium and zinc are preferably contained. In addition, gallium, aluminum, yttrium, tin, or the like is preferably contained. One or more elements selected from boron, silicon, titanium, iron, nickel, germanium, zirconium, molybdenum, lanthanum, cerium, neodymium, hafnium, tantalum, tungsten, magnesium, or the like may be contained.

Here, the oxide semiconductor film is assumed to contain indium, an element M, and zinc. Note that the element M is gallium, aluminum, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M. In the description below, the terms of the atomic ratio of indium to the element M and zinc contained in the oxide semiconductor film are denoted by [In], [M], and [Zn], respectively, in some cases.

<4-2. Crystal Structure of Oxide Semiconductor Film>

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion in the CAAC-OS is a portion where the direction of a lattice arrangement changes between a region with a regular lattice arrangement and another region with a regular lattice arrangement in a region in which nanocrystals are connected.

The shape of the nanocrystal is basically hexagon; however, the shape is not always a regular hexagon and is a non-regular hexagon in some cases. At the distortion, a polygonal nanocrystal such as a pentagonal nanocrystal or a heptagonal nanocrystal is included in some cases. Note that a clear grain boundary cannot be observed even in the vicinity of distortion in the CAAC-OS. That is, a lattice arrangement is distorted so that formation of a grain boundary is inhibited. This is probably because the CAAC-OS can tolerate distortion owing to a low density of the atomic arrangement in an a-b plane direction, the interatomic bond distance changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 0.5 nm and less than or equal to 10 nm, in particular, a region with a size greater than or equal to 1 nm and less than or equal to 2 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

The a-like OS has a structure between those of the nc-OS and the amorphous oxide semiconductor. The a-like OS contains a void or a low-density region. That is, the a-like OS has an unstable structure as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

The oxide semiconductor film of one embodiment of the present invention includes a composite oxide semiconductor. Therefore, an oxide semiconductor film may be referred to as a composite oxide semiconductor in the description below. The use of a composite oxide semiconductor can provide a transistor having high field effect mobility.

<4-3. Composite Oxide Semiconductor>

A composite oxide semiconductor in one embodiment of the present invention is described. Samples including oxide semiconductor films are formed, and the results of evaluating the samples are described below.

[Structure of Samples and Formation Method Thereof]

Two samples of one embodiment of the present invention are formed and evaluated. The samples are formed at different substrate temperatures and with different oxygen gas flow rate ratios at the time of forming the oxide semiconductor films. Note that in the following description, the two samples are referred to as Sample A1 and Sample A2 for convenience.

Sample A1 and Sample A2 each include a substrate and an oxide semiconductor film over the substrate.

[Sample A1]

A method for forming Sample A1 is described. In this case, a glass substrate is used as the substrate. Over the glass substrate, a 100-nm-thick In—Ga—Zn oxide is formed as an oxide semiconductor film with a sputtering apparatus. The formation conditions are as follows: the pressure in a chamber is 0.6 Pa, and a metal oxide target (with an atomic ratio of In:Ga:Zn=4:2:4.1) is used as a target. The metal oxide target provided in the sputtering apparatus is supplied with an AC power of 2500 W. As for the conditions in the formation of the oxide, the substrate temperature is set to a temperature that is not increased by intentional heating (hereinafter such a temperature is also referred to as R.T.). As a mixed gas, an Ar gas and an oxygen gas are supplied at 270 sccm and 30 sccm, respectively, into the deposition chamber to form the oxide. That is, the ratio of the flow rate of an oxygen gas to a flow rate of a mixed gas of Ar and oxygen (also referred to as an oxygen gas flow rate ratio) is set to 10%.

[Sample A2]

A method for forming Sample A2 is described. In this case, a glass substrate is used as the substrate. Over the glass substrate, a 100-nm-thick In—Ga—Zn oxide is formed as an oxide semiconductor film with a sputtering apparatus. The formation conditions are as follows: the pressure in a chamber is 0.6 Pa, and a metal oxide target (with an atomic ratio of In:Ga:Zn=4:2:4.1) is used as a target. The metal oxide target provided in the sputtering apparatus is supplied with an AC power of 2500 W. Note that the substrate temperature at the time of forming the oxide is set to 170° C. An oxygen gas is supplied at 300 sccm into the deposition chamber to form the oxide. That is, the ratio of the flow rate of an oxygen gas to a flow rate of a whole gas at the time of forming the oxide (also referred to as an oxygen gas flow rate ratio) is set to 100%.

[Cross-Sectional HAADF-STEM]

Next, the cross-sectional observation of Samples A1 and A2 formed as described above is described. As the cross-sectional observation, HAADF-STEM observation was performed. Note that for the HAADF-STEM observation, JEM-ARM200F manufactured by JEOL Ltd. was used under the conditions where the acceleration voltage was 200 kV.

Figure 19A:
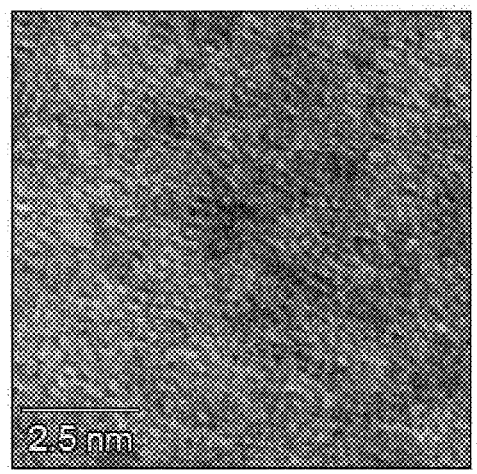
FIGS. 19A and 19B are cross-sectional HAADF-STEM images of composite oxide semiconductors.
Figure 19B:
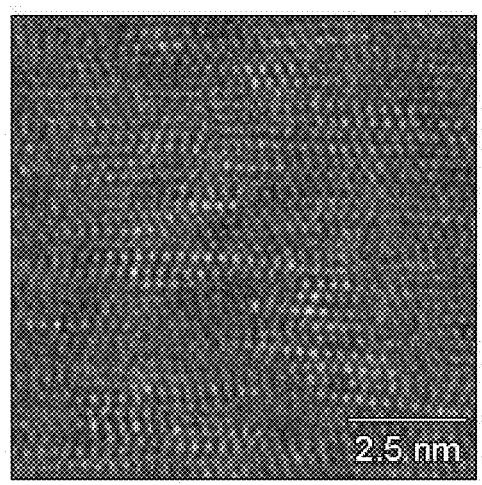

FIGS. 19A and 19B are HAADF-STEM images of Sample A1 and Sample A2, respectively.

In the HAADF-STEM image of Sample A1 shown in FIG. 19A, no clear alignment is observed. In contrast, in the HAADF-STEM image of Sample A2 shown in FIG. 19B, layered alignment in the c-axis direction is observed.

Figure 20:
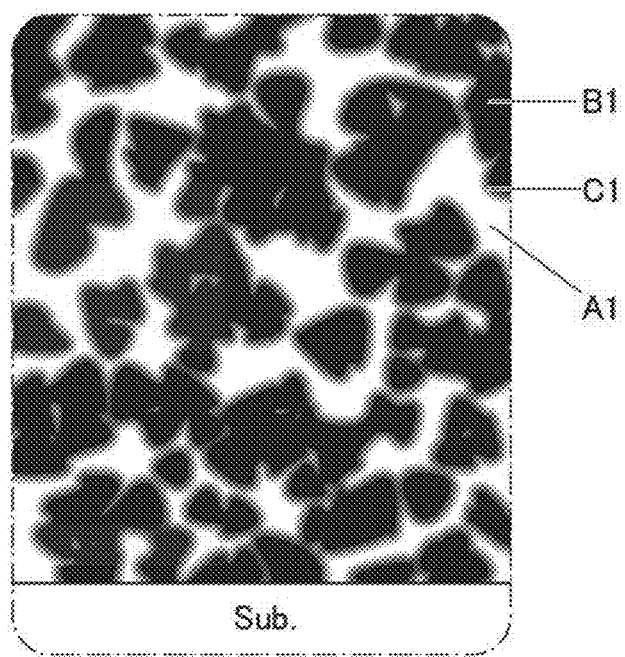
FIG. 20 is a schematic cross-sectional view of a composite oxide semiconductor.

FIG. 20 is a schematic view of the cross section of Sample A1 shown in FIG. 19A.

In FIG. 20, a schematic view of a cross section (here, referred to as a c-axis direction) of the oxide semiconductor film formed over a substrate Sub. is shown. FIG. 20 illustrates an example in which the oxide semiconductor film is formed over the substrate; however, one embodiment of the present invention is not limited to this example and an insulating film such as a base film or an interlayer film or another semiconductor film such as an oxide semiconductor film may be formed between the substrate and the oxide semiconductor film.

The oxide semiconductor film of one embodiment of the present invention is a composite oxide semiconductor having a structure in which Region A1, Region B1, and Region C1 are mixed as illustrated in FIG. 20.

Region A1 shown in FIG. 20 is a region including In with [In]:[M]:[Zn]=x:y:z ($x>0$, $y\geq0$, $z\geq0$). Region B1 is a region including Ga with [In]:[M]:[Zn]=a:b:c ($a\geq0$, $b>0$, $c\geq0$). Region C1 is a region including Zn with [In]:[M]:[Zn]=α:β:γ($\alpha\geq0$, $\beta\geq0$, $\gamma>0$).

Note that in this specification, when the atomic ratio of In to the element M in Region A1 is greater than the atomic ratio of In to the element M in Region B1, Region A1 has a higher In concentration than Region B1. Therefore, in this specification, Region A1 is also referred to as an In-rich region, and Region B1 is also referred to as an In-poor region.

For example, the In concentration in Region A1 is 1.1 or more times, preferably 2 to 10 times that in Region B1. The region A1 is an oxide containing at least In and does not necessarily contain the element M and Zn.

In the oxide semiconductor film of one embodiment of the present invention, Region A1, Region B1, and Region C1 form a composite. That is, carrier movement occurs easily in Region A1, whereas carrier movement does not occur easily in Region B1. Therefore, the oxide semiconductor of one embodiment of the present invention can be used as a material with high carrier mobility, excellent switching characteristics, and favorable semiconductor characteristics. Note that Region C1 is indium zinc oxide, gallium zinc oxide, or indium gallium zinc oxide. Therefore, Region C1 can contribute to both carrier mobility and switching characteristics.

In other words, Region A1 has a lower semiconductor property and higher conductivity than Region B1. Conversely, Region B1 has a higher semiconductor property and lower conductivity than Region A1. Here, a high semiconductor property means a wide band gap, favorable switching characteristics, being close to an i-type semiconductor, or the like.

For example, as shown in FIG. 20, a plurality of Regions A1 are present in particulate form (in cluster form) in the c-axis direction. Note that clusters may be distributed unevenly and irregularly. A plurality of clusters overlap each other or are connected to each other in some cases. For example, in some cases, shapes each including a cluster overlapping with another cluster are connected to each other, so that Region A1 is observed to extend in a cloud-like manner.

In other words, the clusters contained in Region A1 (also referred to as first clusters) have a lower semiconductor property and higher conductivity than the clusters contained in Region B1 (also referred to as second clusters). Conversely, the clusters contained in Region B1 have a higher semiconductor property and lower conductivity than the clusters contained in Region A1. In this structure, Region B1 includes a plurality of second clusters and has a portion where the plurality of second clusters is connected to each other. In other words, the plurality of first clusters included in Region A1 includes a portion where the first cluster and another first cluster are connected to each other in a cloud-like manner, and the plurality of second clusters included in Region B1 includes a portion where the second cluster and another second cluster are connected to each other in a cloud-like manner.

In other words, in the composite oxide semiconductor of one embodiment of the present invention, a first region (Region A1) with a high In concentration and a second region (Region B1) with a low In concentration are connected in a cloud-like manner through Region C1. Alternatively, in the composite oxide semiconductor of one embodiment of the present invention, the first region where In is distributed at a high concentration and the second region where In is not distributed at a high concentration are connected in a cloud-like manner.

As shown in FIG. 20, Regions A1 are connected to each other, so that Regions A1 can serve as a current path. Accordingly, the oxide semiconductor film can have increased conductivity and a transistor using this oxide semiconductor film can have increased field-effect mobility.

In other words, Regions B1 shown in FIG. 20 are scattered in Regions A1. Therefore, Region B1 can exist in a state of being sandwiched three-dimensionally by Regions A1. In other words, Region B1 can exist in a state of being surrounded by Region A1. That is, Region B1 is enclosed by Region A1.

Note that the proportion of scattered Regions A1 can be adjusted by changing, for example, the formation conditions or composition of the composite oxide semiconductor. For example, it is possible to form a composite oxide semiconductor with a low proportion of Regions A1 or a composite oxide semiconductor with a high proportion of Regions A1. In a composite oxide semiconductor of one embodiment of the present invention, the proportion of Regions A1 is not always lower than that of Regions B1. In a composite oxide semiconductor with an extremely high proportion of Regions A1, depending on the observation range, Region B1 is sometimes formed in Region A1. The size of the particulate region of Region A1 can be appropriately adjusted by changing, for example, the formation conditions or composition of the composite oxide semiconductor.

In some cases, the boundary of Region A1, the boundary of Region B1, and the boundary of Region C1 are not clearly observed. The sizes of Region A1, Region B1, and Region C1 can be measured with energy dispersive X-ray spectroscopy (EDX) mapping images obtained by EDX. For example, the diameter of a cluster in Region A1 is greater than or equal to 0.5 nm and less than or equal to 10 nm in the EDX mapping image of a cross-sectional photograph or a plan-view photograph in some cases. Note that the diameter of the cluster is preferably greater than or equal to 1 nm and less than or equal to 2 nm.

As described above, an oxide semiconductor of one embodiment of the present invention is a composite oxide semiconductor in which Region A1 and Region B1 are mixed and have different functions that are complementary to each other.

In contrast, when Region A1 and Region B1 are stacked in a layered manner, for example, interaction does not take place or is unlikely to take place between Region A1 and Region B1, so that the function of Region A1 and that of Region B1 are independently performed in some cases. In that case, even when the carrier mobility is increased owing to Region A1, the off-state current of the transistor might be increased. Therefore, in the case of using the composite oxide semiconductor of one embodiment of the present invention, a function of achieving high carrier mobility and a function of achieving excellent switching characteristics can be obtained at the same time. This is an advantageous effect obtained by using the composite oxide semiconductor of one embodiment of the present invention.

<4-4. Atomic Ratio of Composite Oxide Semiconductor>

The atomic ratio of elements included in the composite oxide semiconductor of one embodiment of the present invention will be described here.

Figure 21A:
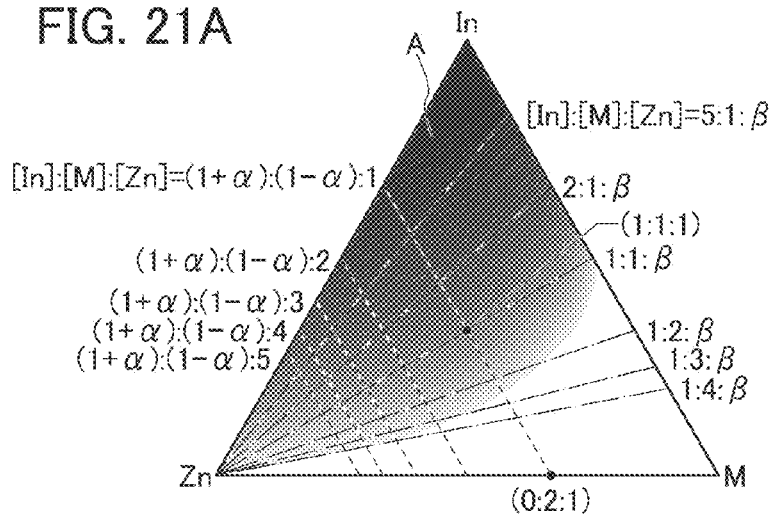
FIGS. 21A to 21C illustrate an atomic ratio of a composite oxide semiconductor.
Figure 21B:
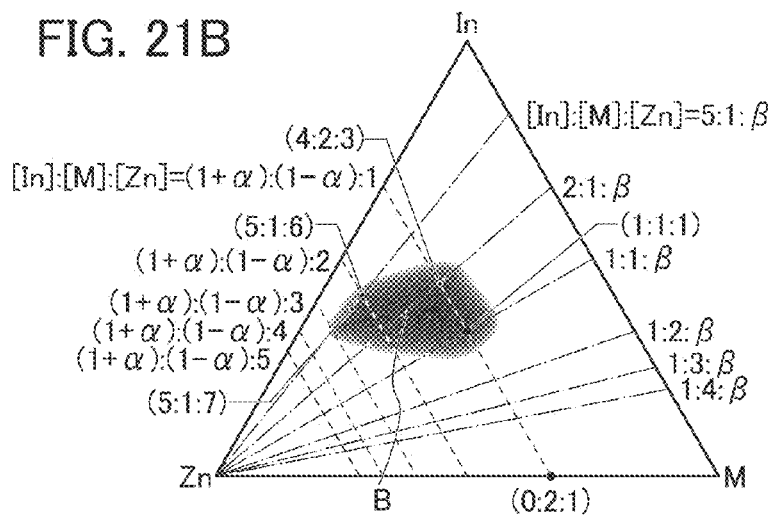
Figure 21C:
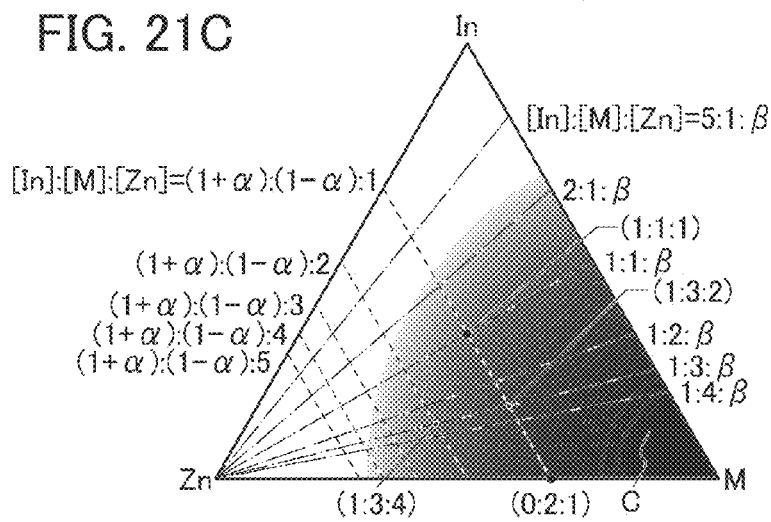

A phase diagram in FIGS. 21A to 21C can be used to show the atomic ratio of elements in the case where Region A1 in the composite oxide semiconductor contains In, the element M, and Zn. The atomic ratio of In to the element M and Zn is denoted by x:y:z. This atomic ratio can be shown as coordinates (x:y:z) in FIGS. 21A to 21C. Note that the proportion of oxygen atoms is not illustrated in FIGS. 21A to 21C.

In FIGS. 21A to 21C, dashed lines correspond to a line representing the atomic ratio of $[In]:[M]:[Zn]=(1+\alpha):(1-\alpha):1$ $(-1 \leq \alpha \leq 1)$, a line representing the atomic ratio of $[In]:[M]:[Zn]=(1+\alpha):(1-\alpha):2$, a line representing the atomic ratio of $[In]:[M]:[Zn]=(1+\alpha):(1-\alpha):3$, a line representing the atomic ratio of $[In]:[M]:[Zn]=(1+\alpha):(1-\alpha):4$, and a line representing the atomic ratio of $[In]:[M]:[Zn]=(1+\alpha):(1-\alpha):5$.

Dashed-dotted lines correspond to a line representing the atomic ratio of $[In]:[M]:[Zn]=1:1:\beta(\beta \geq 0)$, a line representing the atomic ratio of $[In]:[M]:[Zn]=1:2:\beta$, a line representing the atomic ratio of $[In]:[M]:[Zn]=1:3:\beta$, a line representing the atomic ratio of $[In]:[M]:[Zn]=1:4:\beta$, a line representing the atomic ratio of $[In]:[M]:[Zn]=1:7:\beta$, a line representing the atomic ratio of $[In]:[M]:[Zn]=2:1:\beta$, and a line representing the atomic ratio of $[In]:[M]:[Zn]=5:1:\beta$.

An oxide semiconductor having the atomic ratio of $[In]:[M]:[Zn]=0:2:1$ or a neighborhood thereof in FIGS. 21A to 21C tends to have a spinel crystal structure.

Region A2 in FIGS. 21A to 21C represents an example of a preferred range of atomic ratios of indium to the element M and zinc contained in Region A1. Note that Region A2 includes atomic ratios on a line representing the atomic ratio of $[In]:[M]:[Zn]=(1+\gamma):0:(1-\gamma)$ $(-1 \leq \gamma \leq 1)$.

Region B2 in FIGS. 21A to 21C represents an example of a preferred range of atomic ratios of indium to the element M and zinc contained in Region B1. Note that Region B2 includes atomic ratios from $[In]:[M]:[Zn]=4:2:3$ to $[In]:[M]:[Zn]=4:2:4.1$ and neighborhoods thereof. The neighborhoods include an atomic ratio of $[In]:[M]:[Zn]=5:3:4$. Region B2 includes an atomic ratio of $[In]:[M]:[Zn]=5:1:6$ and a neighborhood thereof.

Region A2 with high In concentrations provides a higher conductivity than Region B2 and has a function of increasing carrier mobility (field-effect mobility). Therefore, the on-state current and carrier mobility of a transistor using an oxide semiconductor film including Region A1 can be increased.

In contrast, Region B2 with low In concentrations provides a lower conductivity than Region A2 and has a function of decreasing leakage current. Therefore, the off-state current of a transistor using an oxide semiconductor film including Region B1 can be decreased.

For example, Region A1 is preferably a non-single-crystal. Note that in the case where Region A1 has crystallinity, when Region A1 is formed of indium, Region A1 tends to have a tetragonal crystal structure. Furthermore, when Region A1 is formed of indium oxide ($[In]:[M]:[Zn]=x:0:0$ $(x>0)$), Region A1 tends to have a bixbyite crystal structure. Furthermore, when Region A1 is formed of an In—Zn oxide ($[In]:[M]:[Zn]=x:0:z$ $(x>0, z>0)$), Region A1 tends to have a layered crystal structure.

For example, Region B1 is preferably a non-crystal and includes a CAAC-OS. Note that Region B1 does not necessarily include only a CAAC-OS and may also include a region of a polycrystalline oxide semiconductor, an nc-OS, or the like.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, with the CAAC-OS, a composite oxide semiconductor is physically stable; thus, a composite oxide semiconductor which is resistant to heat and has high reliability can be provided.

Note that in the case where the oxide semiconductor is deposited with a sputtering apparatus, a film having an atomic ratio deviated from the atomic ratio of the target is formed. Especially for zinc, [Zn] in the atomic ratio of a deposited film is smaller than that in the atomic ratio of the target in some cases depending on the substrate temperature during deposition.

Note that characteristics of the composite oxide semiconductor of one embodiment of the present invention are not uniquely determined by the atomic ratio. Therefore, the illustrated regions represent preferred atomic ratios of Region A1 and Region B1 of the composite oxide semiconductor; a boundary therebetween is not clear.

<4-5. Method for Manufacturing Composite Oxide Semiconductor>

An example of a method for manufacturing the composite oxide semiconductor shown in FIG. 20 is described. A composite oxide semiconductor of one embodiment of the present invention can be formed with a sputtering apparatus.

[Sputtering Apparatus]

Figure 22A:
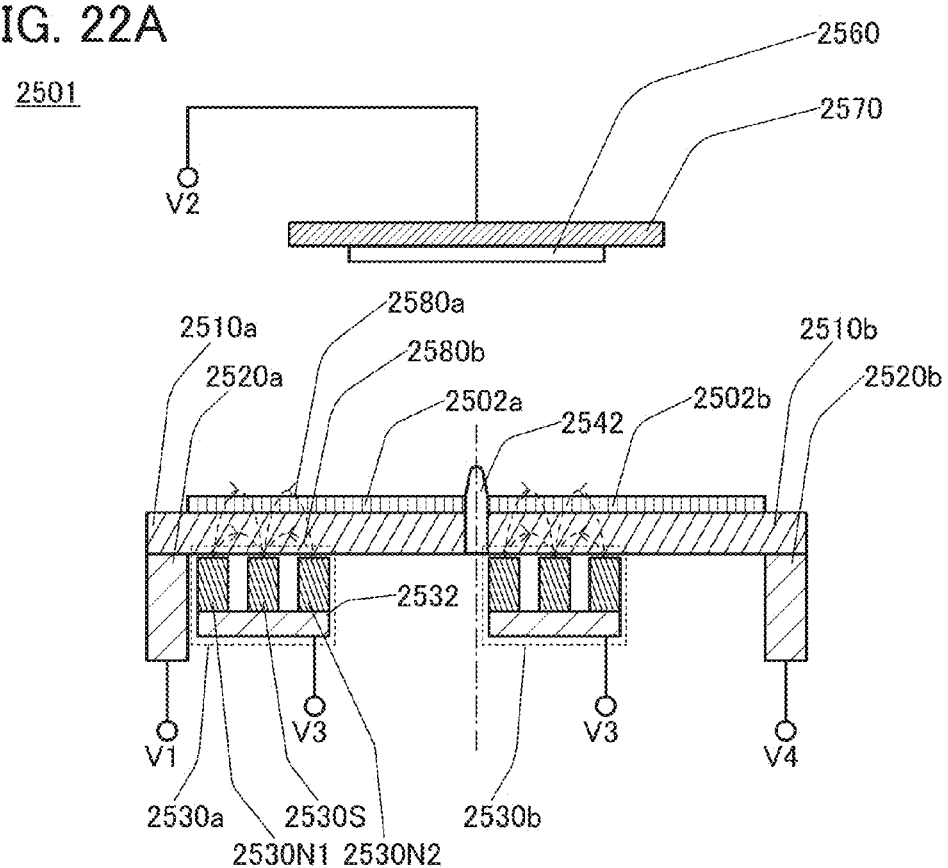
FIGS. 22A and 22B illustrate a sputtering apparatus.
Figure 22B:
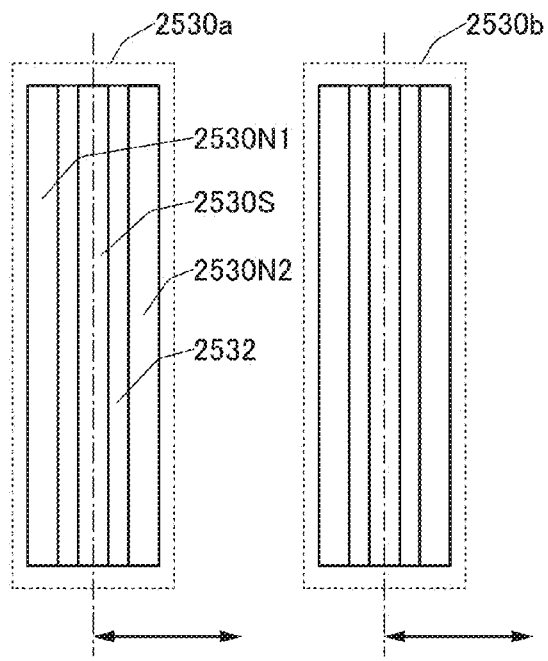

FIG. 22A is a cross-sectional view of a deposition chamber 2501 of the sputtering apparatus. FIG. 22B is a plan view of a magnet unit 2530a and a magnet unit 2530b of the sputtering apparatus.

The deposition chamber 2501 illustrated in FIG. 22A includes a target holder 2520a, a target holder 2520b, a backing plate 2510a, a backing plate 2510b, a target 2502a, a target 2502b, a member 2542, and a substrate holder 2570. Note that the target 2502a is placed over the backing plate 2510a. The backing plate 2510a is placed over the target holder 2520a. The magnet unit 2530a is placed under the target 2502a with the backing plate 2510a therebetween. The target 2502b is placed over the backing plate 2510b. The backing plate 2510b is placed over the target holder 2520b. The magnet unit 2530b is placed under the target 2502b with the backing plate 2510b therebetween.

As illustrated in FIGS. 22A and 22B, the magnet unit 2530a includes a magnet 2530N1, a magnet 2530N2, a magnet 2530S, and a magnet holder 2532. The magnet 2530N1, the magnet 2530N2, and the magnet 2530S are placed over the magnet holder 2532 in the magnet unit 2530a. The magnet 2530N1, the magnet 2530N2, and the magnet 2530S are spaced. Note that the magnet unit 2530b has a structure similar to that of the magnet unit 2530a. When the substrate 2560 is transferred into the deposition chamber 2501, the substrate 2560 is placed in contact with the substrate holder 2570.

The target 2502a, the backing plate 2510a, and the target holder 2520a are separated from the target 2502b, the backing plate 2510b, and the target holder 2520b by the member 2542. Note that the member 2542 is preferably an insulator. The member 2542 may be a conductor or a semiconductor. The member 2542 may be a conductor or a semiconductor whose surface is covered with an insulator.

The target holder 2520a and the backing plate 2510a are fixed to each other with a screw (e.g., a bolt) and have the same potential. The target holder 2520a has a function of supporting the target 2502a with the backing plate 2510a positioned therebetween. The target holder 2520b and the backing plate 2510b are fixed to each other with a screw (e.g., a bolt) and have the same potential. The target holder 2520b has a function of supporting the target 2502b with the backing plate 2510b positioned therebetween.

The backing plate 2510a has a function of fixing the target 2502a. The backing plate 2510b has a function of fixing the target 2502b.

Magnetic lines of force 2580a and 2580b formed by the magnet unit 2530a are illustrated in FIG. 22A.

As illustrated in FIG. 22B, the magnet unit 2530a has a structure in which the magnet 2530N1 having a rectangular or substantially rectangular shape, the magnet 2530N2 having a rectangular or substantially rectangular shape, and the magnet 2530S having a rectangular or substantially rectangular shape are fixed to the magnet holder 2532. The magnet unit 2530a can be oscillated horizontally as shown by an arrow in FIG. 22B. For example, the magnet unit 2530a may be oscillated with a beat of greater than or equal to 0.1 Hz and less than or equal to 1 kHz.

The magnetic field over the target 2502a changes in accordance with oscillation of the magnet unit 2530a. The region with an intense magnetic field is a high-density plasma region; thus, sputtering of the target 2502a easily occurs in the vicinity of the region. The same applies to the magnet unit 2530b.

<4-6. Formation Method of Composite Oxide Semiconductor>

Figure 23:
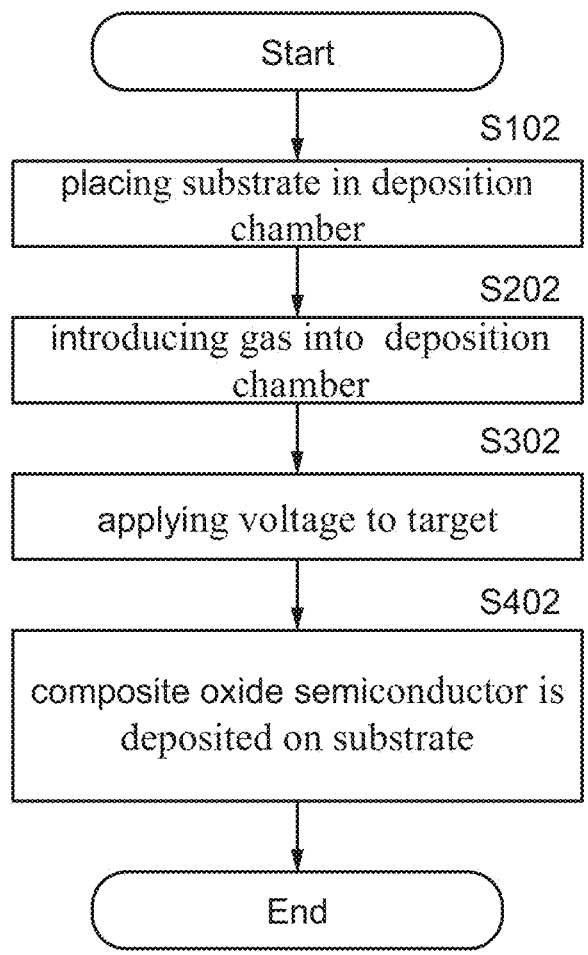
FIG. 23 is a process flow chart illustrating a method for manufacturing a composite oxide semiconductor.

Next, a formation method of a composite oxide semiconductor is described. FIG. 23 is a process flow chart showing the manufacturing method of a composite oxide semiconductor.

A composite oxide semiconductor shown in FIG. 20 are formed through at least first to fourth steps shown in FIG. 23.

[First Process: Process of Placing Substrate in Deposition Chamber]

The first process includes a step of placing a substrate in a deposition chamber (see Step S102 in FIG. 23).

In the first process, for example, the substrate 2560 is placed on the substrate holder 2570 of the deposition chamber 2501 shown in FIGS. 22A and 22B.

The temperature of the substrate 2560 in deposition influences the electrical properties of a composite oxide semiconductor. The higher the substrate temperature is, the higher the crystallinity and reliability of the composite oxide semiconductor can be. In contrast, the lower the substrate temperature is, the lower the crystallinity of the composite oxide semiconductor can be and the higher the carrier mobility thereof can be. In particular, the lower the substrate temperature in deposition is, the more the field-effect mobility at a low gate voltage (e.g., higher than 0 V and lower than or equal to 2 V) is notably increased in a transistor including the composite oxide semiconductor.

The temperature of the substrate 2560 is higher than or equal to room temperature (25° C.) and lower than or equal to 200° C., preferably higher than or equal to room temperature and lower than or equal to 170° C., further preferably higher than or equal to room temperature and lower than or equal to 130° C. Setting the substrate temperature in the above range is favorable for large glass substrates (e.g., the above-described 8th- to 10th-generation glass substrates). In particular, when the substrate temperature in deposition of a composite oxide semiconductor is room temperature, i.e., the substrate is not heated intentionally, the substrate can be favorably prevented from bending or warping.

The substrate 2560 may be cooled with a cooling mechanism or the like provided for the substrate holder 2570.

When the temperature of the substrate 2560 is higher than or equal to 100° C. and lower than or equal to 130° C., water in the composite oxide semiconductor can be removed. Removing water, which is an impurity, in such a manner leads to high field-effect mobility and high reliability.

The temperature of the substrate 2560 is set to higher than or equal to 100° C. and lower than or equal to 130° C. for removal of water, whereby the sputtering apparatus can be prevented from warping due to overheat. This leads to an improvement in productivity of a semiconductor device. The productivity is stabilized, so that a large-scale production apparatus is easy to employ. Thus, a large display device manufactured using a large substrate can be easily manufactured.

When the temperature of the substrate 2560 is high, water in the composite oxide semiconductor can be more effectively removed and moreover, the composite oxide semiconductor can have increased crystallinity. For example, the temperature of the substrate 2560 is set to higher than or equal to 80° C. and lower than or equal to 200° C., preferably higher than or equal to 100° C. and lower than or equal to 170° C., whereby a composite oxide semiconductor with high crystallinity can be formed.

[Second Process: Process of Introducing Gas into Deposition Chamber]

The second step includes a step of introducing gas into the deposition chamber (see step S202 in FIG. 23).

In the second step, for example, gas is introduced into the deposition chamber 2501 shown in FIGS. 22A and 22B. An argon gas and/or an oxygen gas are/is introduced as the gas. Note that instead of an argon gas, an inert gas such as helium, xenon, or krypton can be used.

The oxygen flow rate in forming a composite oxide semiconductor using an oxygen gas shows the following tendency. The higher the oxygen flow rate is, the higher the crystallinity of the composite oxide semiconductor is and the higher the reliability is. In contrast, the lower the oxygen flow rate is, the lower the crystallinity of the composite oxide semiconductor is and the higher the carrier mobility is. Specifically, in a transistor including the composite oxide semiconductor, the smaller the oxygen flow rate is, the more notably the field-effect mobility at a low gate voltage (e.g., higher than 0 V and lower than or equal to 2 V) is increased.

The oxygen flow rate ratio can be appropriately set in the range from 0% to 100% inclusive so that favorable characteristics of the composite oxide semiconductor suitable to the uses can be obtained.

For example, in the case where the composite oxide semiconductor is used for a semiconductor layer of a transistor having high field-effect mobility, the oxygen flow rate is set to higher than or equal to 0% and lower than or equal to 30%, preferably higher than or equal to 5% and lower than or equal to 30%, further preferably higher than or equal to 7% and lower than or equal to 15% in deposition of the composite oxide semiconductor.

To make both the field-effect mobility and reliability of a transistor high, the oxygen flow rate ratio in deposition of the composite oxide semiconductor is set to higher than 30% and lower than 70%, preferably higher than 30% and lower than or equal to 50%. Alternatively, the oxygen flow rate ratio in deposition of the composite oxide semiconductor is set to higher than or equal to 10% and lower than or equal to 50%, preferably higher than 30% and lower than or equal to 50%.

To make the reliability of a transistor high, the oxygen flow rate ratio in deposition of the composite oxide semiconductor is set to higher than or equal to 70% and lower than or equal to 100%.

When the substrate temperature and the oxygen flow rate ratio in deposition are controlled in this manner, a composite oxide semiconductor that provides desired electrical characteristics can be deposited. For example, a reduction (an increase) of substrate temperature and a reduction (an increase) of oxygen flow rate ratio contribute to the field-effect mobility to the same degree, in some cases. Therefore, even when the substrate temperature cannot be increased sufficiently with the constraints of an apparatus, for example, a transistor having field-effect mobility substantially the same as that when the substrate temperature is increased can be obtained by increasing the oxygen flow rate ratio.

Impurities in the oxide semiconductor film are reduced by the method in Embodiment 1, whereby a highly reliable transistor can be obtained.

[Third Process: Process of Applying Voltage to Target]

The third process includes a step of applying voltage to a target (see Step S302 in FIG. 23).

In the third process, for example, voltage is applied to the target holder 2520a and the target holder 2520b in FIGS. 22A and 22B. As an example, a potential applied to a terminal V1 connected to the target holder 2520a is lower than a potential applied to a terminal V2 connected to the substrate holder 2570. A potential applied to a terminal V4 connected to the target holder 2520b is lower than the potential applied to the terminal V2 connected to the substrate holder 2570. The potential applied to the terminal V2 connected to the substrate holder 2570 is a ground potential. A potential applied to a terminal V3 connected to the magnet holder 2532 is a ground potential.

Note that the potentials applied to the terminals V1, V2, V3, and V4 are not limited to the above potentials. Not all the target holder 2520, the substrate holder 2570, and the magnet holder 2532 are necessarily supplied with potentials. For example, the substrate holder 2570 may be electrically floating. Note that it is assumed that a power source capable of controlling a potential applied to the terminal V1 is electrically connected to the terminal V1. As the power source, a DC power source, an AC power source, or an RF power source may be used.

As the target 2502a and the target 2502b, a target including indium, the element M (M is Ga, Al, Y, or Sn), zinc, and oxygen is preferably used. For example, an In—Ga—Zn metal oxide target (In:Ga:Zn=4:2:4.1 [atomic ratio]) or an In—Ga—Zn metal oxide target (In:Ga:Zn=5:1:7 [atomic ratio]) can be used as the target 2502a and the target 2502b. In the following description, the case of using an In—Ga—Zn metal oxide target (In:Ga:Zn=4:2:4.1 [atomic ratio]) is described.

[Fourth Process: Process of Depositing Composite Oxide Semiconductor on Substrate]

The fourth process includes a step in which sputtered particles are ejected from the target and a composite oxide semiconductor is deposited on the substrate (see Step S402 in FIG. 23).

In the fourth process, for example, in the deposition chamber 2501 illustrated in FIGS. 22A and 22B, an argon gas or an oxygen gas is ionized to be separated into cations and electrons, and plasma is created. Then, the cations in the plasma are accelerated toward the targets 2502a and 2502b by the potentials applied to the target holders 2520a and 2520b. Sputtered particles are generated when the cations collide with the In—Ga—Zn metal oxide target, and the sputtered particles are deposited on the substrate 2560.

Note that in an In—Ga—Zn metal oxide target with an atomic ratio of In:Ga:Zn=4:2:4.1 or 5:1:7 that is used as the targets 2502a and 2502b, a plurality of crystal grains with different compositions are included in some cases. In most cases, for example, the diameters of the plurality of crystal grains are each 10 μm or less. In the case where, for example, crystal grains with a high proportion of In are included in the In—Ga—Zn metal oxide target, the proportion of Region A1 described above is increased in some cases.

<4-7. Deposition Model>

Figure 24A:
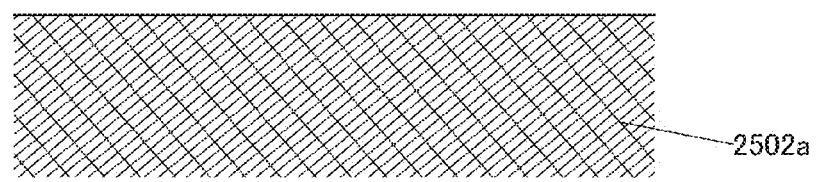
FIGS. 24A to 24C illustrate a cross section of the vicinity of a target.
Figure 24B:
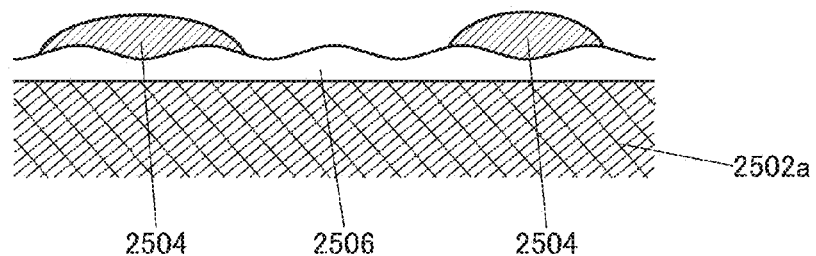
Figure 24C:
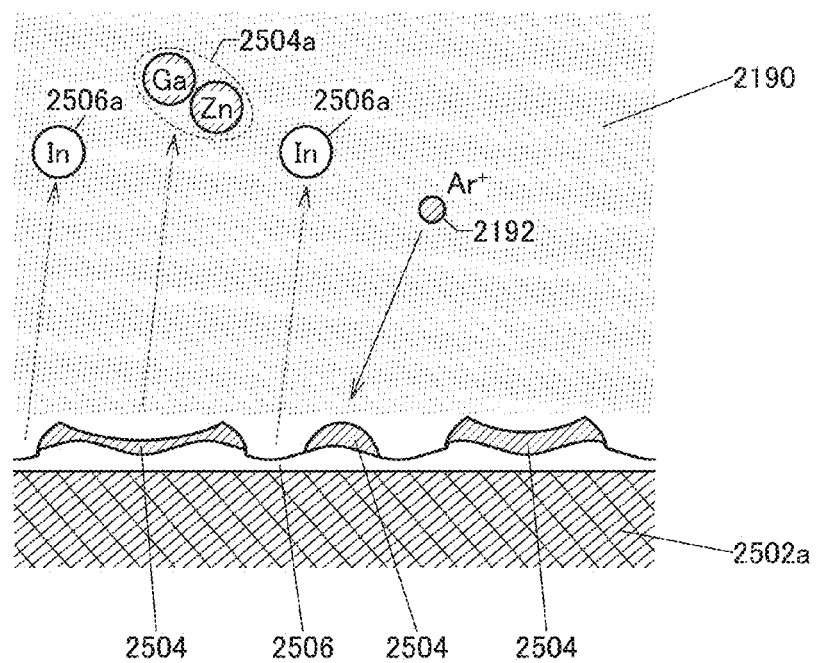

In the fourth process, a deposition model shown in FIGS. 24A to 24C can be presumed.

FIGS. 24A to 24C are cross-sectional views of the vicinity of the target 2502a shown in FIGS. 22A and 22B. Note that FIG. 24A shows the state of the target before use, FIG. 24B shows the state of the target before deposition, and FIG. 24C shows the state of the target during the deposition. In FIGS. 24A to 24C, the target 2502a, plasma 2190, cations 2192, sputtered particles 2504a and 2506a, and the like are shown.

In FIG. 24A, a surface of the target 2502a is relatively flat and its composition (e.g., the composition ratio between In, Ga, and Zn) is uniform. In contrast, in FIG. 24B, unevenness is formed on the surface of the target 2502a by sputtering treatment performed in advance or the like, and compositional segregation occurs. The unevenness and the segregation can occur because of plasma (e.g., Ar plasma) generated in the sputtering treatment performed in advance. Note that FIG. 24B illustrates a segregation region 2504 and a segregation region 2506. Here, the segregation region 2504 is a region containing a large amount of Ga and a large amount of Zn (a Ga,Zn-rich region), and the segregation region 2506 is a region containing a large amount of In (an In-rich region). The segregation region 2504, which contains a large amount of Ga, is formed because the melting point of Ga lower than that of In allows part of Ga to be melted by heat applied to the target 2502a during the plasma treatment and aggregate.

[First Step]

In FIG. 24C, an argon gas or an oxygen gas is separated into the cation 2192 and an electron (not illustrated), and the plasma 2190 is created. After that, the cations 2192 in the plasma 2190 are accelerated toward the target 2502a (here, an In—Ga—Zn oxide target). The cations 2192 collide with the In—Ga—Zn oxide target, whereby the sputtered particles 2504a and 2506a are generated and ejected from the In—Ga—Zn oxide target. Note that since the sputtered particles 2504a are ejected from the segregation region 2504, they form a Ga,Zn-rich cluster in some cases. Since the sputtered particles 2506a are ejected from the segregation region 2506, they form an In-rich cluster in some cases.

When an In—Ga—Zn oxide target is used, presumably, the sputtered particles 2504a are preferentially sputtered first from the segregation region 2504. This is because Ga and Zn, which have lower relative atomic masses than In, are preferentially ejected from the In—Ga—Zn oxide target by collision of the cation 2192 with the In—Ga—Zn oxide target. The sputtered particles 2504a are deposited over the substrate, thereby forming Region B1 illustrated in FIG. 20.

[Second Step]

Next, as illustrated in FIG. 24C, the sputtered particles 2506a are sputtered from the segregation region 2506. The sputtered particles 2506a collide with Region B1 that has been formed over the substrate, thereby forming Region A1 illustrated in FIG. 20.

As illustrated in FIG. 24C, the target 2502a is subjected to sputtering throughout the deposition; thus, generation of the segregation region 2504 and disappearance of the segregation region 2504 occur intermittently.

The deposition model including the first step and the second step is repeated, whereby the composite oxide semiconductor that is one embodiment of the present invention and shown in FIG. 20 can be obtained.

That is, the sputtered particles (2506a and 2504a) are respectively ejected from the In-rich segregation region 2506 and the Ga, Zn-rich segregation region 2504 to be deposited over the substrate. The In-rich regions are connected to each other in a cloud-like manner over the substrate, so that a composite oxide semiconductor of one embodiment of the present invention as illustrated in FIGS. 19A and 19B can be formed. In a film of the composite oxide semiconductor, the In-rich regions are connected to each other in a cloud-like manner. Thanks to this, a transistor using the composite oxide semiconductor has a high on-state current ($I_{on}$) and high field-effect mobility (μFE).

In this manner, for a transistor having a high on-state current ($I_{on}$) and high field-effect mobility (μFE), In is of importance and other metals (e.g., Ga) are not always necessary.

Note that described above as an example is a model in which a composite oxide semiconductor is formed with the use of an argon gas. In that case, the composite oxide semiconductor might contain many oxygen vacancies. When the composite oxide semiconductor contains many oxygen vacancies, shallow defect states (also referred to as sDOS) are formed in the composite oxide semiconductor in some cases. When sDOS is formed in the composite oxide semiconductor, the sDOS serves as a carrier trap, resulting in a reduction in on-state current and field-effect mobility.

Therefore, when a composite oxide semiconductor is formed with the use of an argon gas, it is preferable to supply oxygen into the composite oxide semiconductor after formation thereof so that oxygen vacancies in the composite oxide semiconductor are compensated and sDOS is reduced.

Such oxygen supply can be conducted by, for example, performing heat treatment in an atmosphere that contains oxygen after the formation of the composite oxide semiconductor, or performing plasma treatment in an atmosphere that contains oxygen. Alternatively, either an insulating film that is in contact with the composite oxide semiconductor or an insulating film in the vicinity of the composite oxide semiconductor is made to contain excess oxygen. The mode in which such an insulating film contains excess oxygen are described in Embodiment 2.

Note that one embodiment of the present invention is not limited to the above-mentioned manufacturing method by a sputtering method. A pulsed laser deposition (PLD) method, a plasma-enhanced chemical vapor deposition (PECVD) method, a thermal chemical vapor deposition (CVD) method, an atomic layer deposition (ALD) method, a vacuum evaporation method, or the like may be used. As an example of a thermal CVD method, a metal organic chemical vapor deposition (MOCVD) method can be given.

<4-8. Transistor Including Oxide Semiconductor Film>

Next, a transistor including an oxide semiconductor film is described.

Note that when the composite oxide semiconductor is used for a transistor, the transistor can have high carrier mobility and excellent switching characteristics. In addition, the transistor can have high reliability.

An oxide semiconductor film with a low carrier density is preferably used for a transistor. For example, an oxide semiconductor film whose carrier density is lower than $8 \times 10^{11}/cm^3$, preferably lower than $1 \times 10^{11}/cm^3$, or further preferably lower than $1 \times 10^{10}/cm^3$, and greater than or equal to $1 \times 10^{-9}/cm^3$ is used as the oxide semiconductor film.

An oxide semiconductor film of one embodiment of the present invention is a highly purified intrinsic or substantially highly purified intrinsic oxide semiconductor film as described above. A highly purified intrinsic or substantially highly purified intrinsic oxide semiconductor film has few carrier generation sources, and thus can have a low carrier density. A highly purified intrinsic or substantially highly purified intrinsic oxide semiconductor film has a low density of defect states and accordingly has a low density of trap states in some cases.

Charges trapped by the trap states in the oxide semiconductor film take a long time to be released and may behave like fixed charges. Thus, the transistor whose channel region is formed in the oxide semiconductor having a high density of trap states has unstable electrical characteristics in some cases.

To obtain stable electrical characteristics of the transistor, it is effective to reduce the concentration of impurities in the oxide semiconductor film. In order to reduce the concentration of impurities in the oxide semiconductor film, the concentration of impurities in a film that is adjacent to the oxide semiconductor film is preferably reduced. As examples of the impurities, hydrogen, nitrogen, alkali metal, alkaline earth metal, iron, nickel, silicon, and the like are given.

Here, the influence of impurities in the oxide semiconductor film will be described.

When silicon or carbon that is one of Group 14 elements is contained in the oxide semiconductor film, defect states are formed in the oxide semiconductor. Thus, the concentration of silicon or carbon in the oxide semiconductor and around an interface with the oxide semiconductor (measured by secondary ion mass spectrometry (SIMS)) is set lower than or equal to $2 \times 10^{18}$ atoms/$cm^3$, and preferably lower than or equal to $2 \times 10^{17}$ atoms/$cm^3$.

When the oxide semiconductor film contains alkali metal or alkaline earth metal, defect states are formed and carriers are generated, in some cases. Thus, a transistor including an oxide semiconductor film which contains alkali metal or alkaline earth metal is likely to be normally on. Therefore, it is preferable to reduce the concentration of alkali metal or alkaline earth metal in the oxide semiconductor film. Specifically, the concentration of alkali metal or alkaline earth metal in the oxide semiconductor film measured by SIMS is set lower than or equal to $1 \times 10^{18}$ atoms/cm$^3$, and preferably lower than or equal to $2 \times 10^{16}$ atoms/cm$^3$.

When the oxide semiconductor film contains nitrogen, the oxide easily becomes n-type by generation of electrons serving as carriers and an increase of carrier density. Thus, a transistor whose semiconductor includes an oxide semiconductor that contains nitrogen is likely to be normally-on. For this reason, nitrogen in the oxide semiconductor is preferably reduced as much as possible; the nitrogen concentration measured by SIMS is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide semiconductor film reacts with oxygen bonded to a metal atom to be water, and thus causes an oxygen vacancy ($V_o$), in some cases. Due to entry of hydrogen into the oxygen vacancy ($V_o$), an electron serving as a carrier is generated in some cases. In some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

Note that oxygen vacancies ($V_o$) in the oxide semiconductor film can be reduced by introduction of oxygen into the oxide semiconductor. That is, the oxygen vacancies ($V_o$) in the oxide semiconductor film disappear when the oxygen vacancies ($V_o$) are filled with oxygen. Accordingly, diffusion of oxygen into the oxide semiconductor film can reduce the amount of oxygen vacancies ($V_o$) in a transistor and improve the reliability of the transistor.

As a method for introducing oxygen into the oxide semiconductor film, for example, an oxide in which oxygen content is higher than that in the stoichiometric composition is provided in contact with the oxide semiconductor. That is, in the oxide, a region including oxygen in excess of that in the stoichiometric composition (hereinafter also referred to as an excess oxygen region) is preferably formed. In particular, in the case of using an oxide semiconductor film in a transistor, an oxide including an excess-oxygen region is provided in a base film, an interlayer film, or the like in the vicinity of the transistor, whereby oxygen vacancies in the transistor are reduced, and the reliability can be improved.

When an oxide semiconductor film with sufficiently reduced impurity concentration is used for a channel formation region in a transistor, the transistor can have stable electrical characteristics.

At least part of this embodiment can be implemented in combination with any of the other embodiments described in this specification as appropriate.

Embodiment 5

In this embodiment, examples of a display device that includes the transistor described in the above embodiments are described below with reference to FIG. 25 to FIG. 27.

Figure 25:
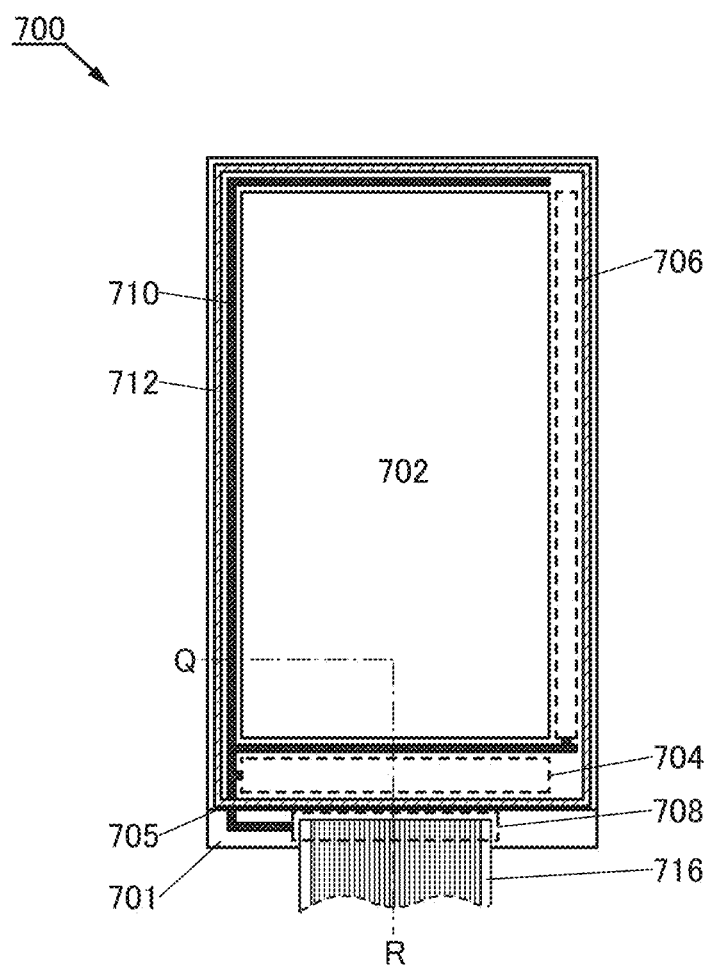
FIG. 25 is a top view of one mode of a display device.

FIG. 25 is a top view illustrating an example of a display device. A display device 700 in FIG. 25 includes a pixel portion 702 provided over a first substrate 701, a source driver circuit portion 704 and a gate driver circuit portion 706 that are provided over the first substrate 701, a sealant 712 provided to surround the pixel portion 702, the source driver circuit portion 704, and the gate driver circuit portion 706, and a second substrate 705 provided to face the first substrate 701. The first substrate 701 and the second substrate 705 are sealed with the sealant 712. That is, the pixel portion 702, the source driver circuit portion 704, and the gate driver circuit portion 706 are enclosed by the first substrate 701, the sealant 712, and the second substrate 705. Although not illustrated in FIG. 25, a display element is provided between the first substrate 701 and the second substrate 705.

In the display device 700, a flexible printed circuit (FPC) terminal portion 708 that is electrically connected to the pixel portion 702, the source driver circuit portion 704, and the gate driver circuit portion 706 is provided in a region different from the region that is over the first substrate 701 and surrounded by the sealant 712. Furthermore, an FPC 716 is connected to the FPC terminal portion 708, and a variety of signals and the like are supplied from the FPC 716 to the pixel portion 702, the source driver circuit portion 704, and the gate driver circuit portion 706. Furthermore, a signal line 710 is connected to the pixel portion 702, the source driver circuit portion 704, the gate driver circuit portion 706, and the FPC terminal portion 708. Through the signal line 710, a variety of signals and the like are supplied from the FPC 716 to the pixel portion 702, the source driver circuit portion 704, the gate driver circuit portion 706, and the FPC terminal portion 708.

A plurality of gate driver circuit portions 706 may be provided in the display device 700. The structure of the display device 700 is not limited to the example shown here, in which the source driver circuit portion 704 and the gate driver circuit portion 706 as well as the pixel portion 702 are formed over the first substrate 701. For example, only the gate driver circuit portion 706 may be formed over the first substrate 701, or only the source driver circuit portion 704 may be formed over the first substrate 701. In this case, a substrate over which a source driver circuit, a gate driver circuit, or the like is formed (e.g., a driver circuit board formed using a single crystal semiconductor film or a polycrystalline semiconductor film) may be formed on the first substrate 701. Note that there is no particular limitation on the method for connecting the separately prepared driver circuit board, and a chip on glass (COG) method, a wire bonding method, or the like can be used.

The pixel portion 702, the source driver circuit portion 704, and the gate driver circuit portion 706 included in the display device 700 include a plurality of transistors. The transistor which is a semiconductor device of one embodiment of the present invention can be used.

The display device 700 can include a variety of elements. As examples of the elements, electroluminescent (EL) element (e.g., an EL element containing organic and inorganic materials, an organic EL element, an inorganic EL element, or an LED), a light-emitting transistor element (a transistor that emits light depending on current), an electron emitter, a liquid crystal element, an electronic ink display, an electrophoretic element, an electrowetting element, a plasma display panel (PDP), micro electro mechanical systems (MEMS) display (e.g., a grating light valve (GLV), a digital micromirror device (DMD), a digital micro shutter (DMS) element, or an interferometric modulator display (IMOD) element), a piezoelectric ceramic display, and the like can be given.

An example of a display device including an EL element is an EL display. Examples of a display device including an electron emitter include a field emission display (FED) and an SED-type flat panel display (SED: surface-conduction electron-emitter display). An example of a display device including a liquid crystal element is a liquid crystal display (a transmissive liquid crystal display, a transflective liquid crystal display, a reflective liquid crystal display, a direct-view liquid crystal display, or a projection liquid crystal display). An example of a display device including an electronic ink display or an electrophoretic element is electronic paper. In a transflective liquid crystal display or a reflective liquid crystal display, some or all of pixel electrodes may function as reflective electrodes. For example, some or all of pixel electrodes may contain aluminum, silver, or the like. In this case, a memory circuit such as an SRAM can be provided under the reflective electrodes, leading to lower power consumption.

As a display system of the display device 700, a progressive system, an interlace system, or the like can be employed. Furthermore, color elements controlled in pixels at the time of color display are not limited to three colors: R, G, and B (R, G, and B correspond to red, green, and blue, respectively). For example, four pixels of an R pixel, a G pixel, a B pixel, and a W (white) pixel may be used. Alternatively, a color element may be composed of two colors of R, G, and B as in PenTile layout. The two colors may differ depending on the color elements. Alternatively, one or more colors of yellow, cyan, magenta, and the like may be added to RGB. Note that the size of a display region may differ between dots of color elements. One embodiment of the disclosed invention is not limited to a color display device; the disclosed invention can also be applied to a monochrome display device.

A coloring layer (also referred to as a color filter) may be used to obtain a full-color display device in which white light (W) is used for a backlight (e.g., an organic EL element, an inorganic EL element, an LED, or a fluorescent lamp). For example, a red (R) coloring layer, a green (G) coloring layer, a blue (B) coloring layer, and a yellow (Y) coloring layer can be combined as appropriate. With the use of the coloring layer, high color reproducibility can be obtained as compared with the case without the coloring layer. Here, by providing a region with a coloring layer and a region without a coloring layer, white light in the region without the coloring layer may be directly utilized for display. By partly providing the region without a coloring layer, a decrease in the luminance of a bright image due to the coloring layer can be suppressed, and power consumption can be reduced by approximately 20% to 30% in some cases. In the case where full-color display is performed using a self-luminous element such as an organic EL element or an inorganic EL element, elements may emit light in their respective colors R, G, B, Y, and W. By using a self-luminous element, power consumption may be further reduced as compared with the case of using a coloring layer.

As a coloring system, any of the following systems may be used: the above-described color filter system in which part of white light is converted into red light, green light, and blue light through color filters; a three-color system in which red light, green light, and blue light are used; and a color conversion system or a quantum dot system in which part of blue light is converted into red light or green light.

In this embodiment, a structure including a liquid crystal element as a display element and a structure including an EL element as a display element are described with reference to FIG. 26 and FIG. 27. FIG. 26 is a cross-sectional view taken along dashed-dotted line Q-R in FIG. 25 and illustrate the structure including a liquid crystal element as a display element. FIG. 27 is a cross-sectional view taken along dashed-dotted line Q-R in FIG. 25 and illustrates the structure including an EL element as a display element.

Figure 26:
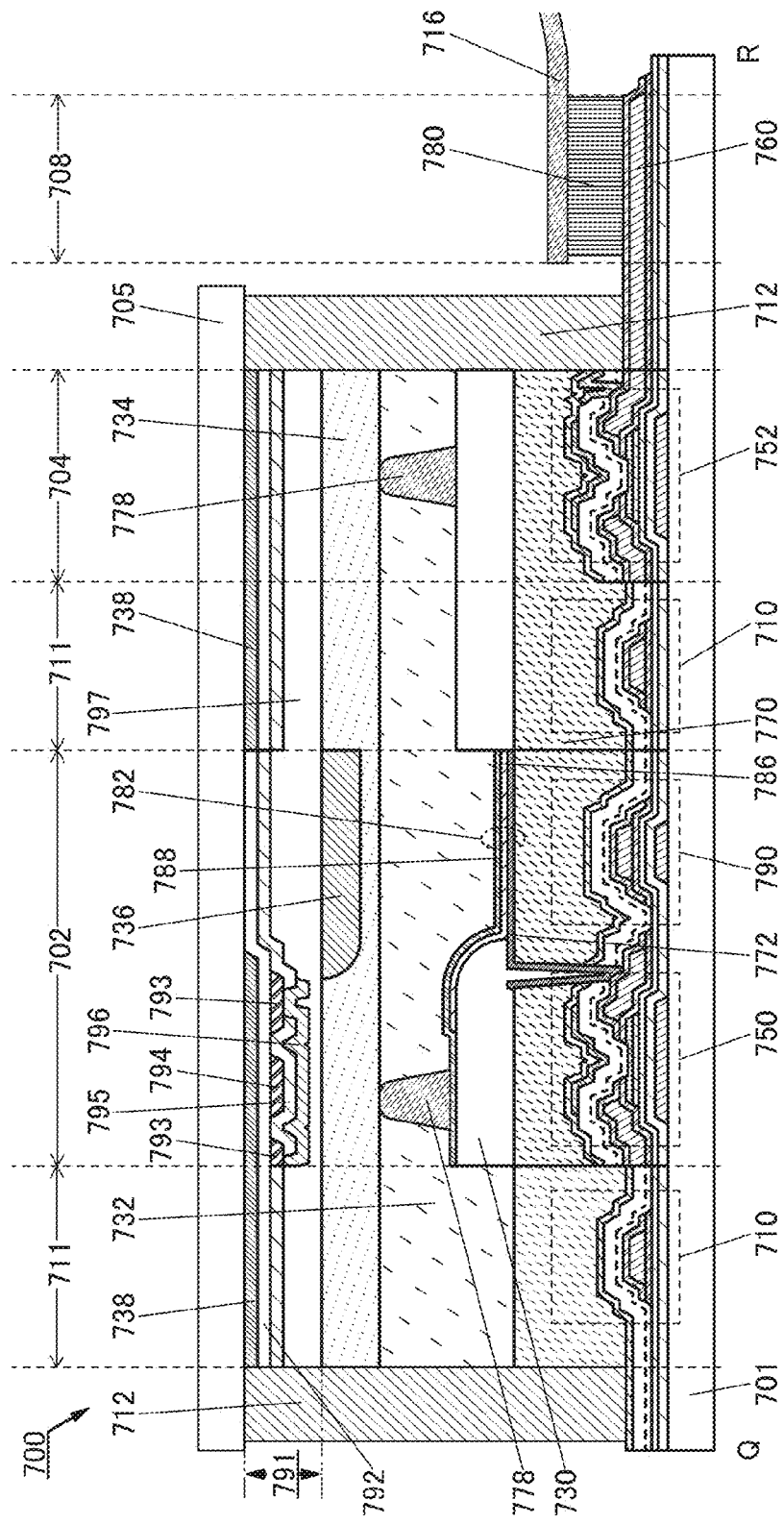
FIG. 26 is a cross-sectional view of one mode of a display device.
Figure 27:
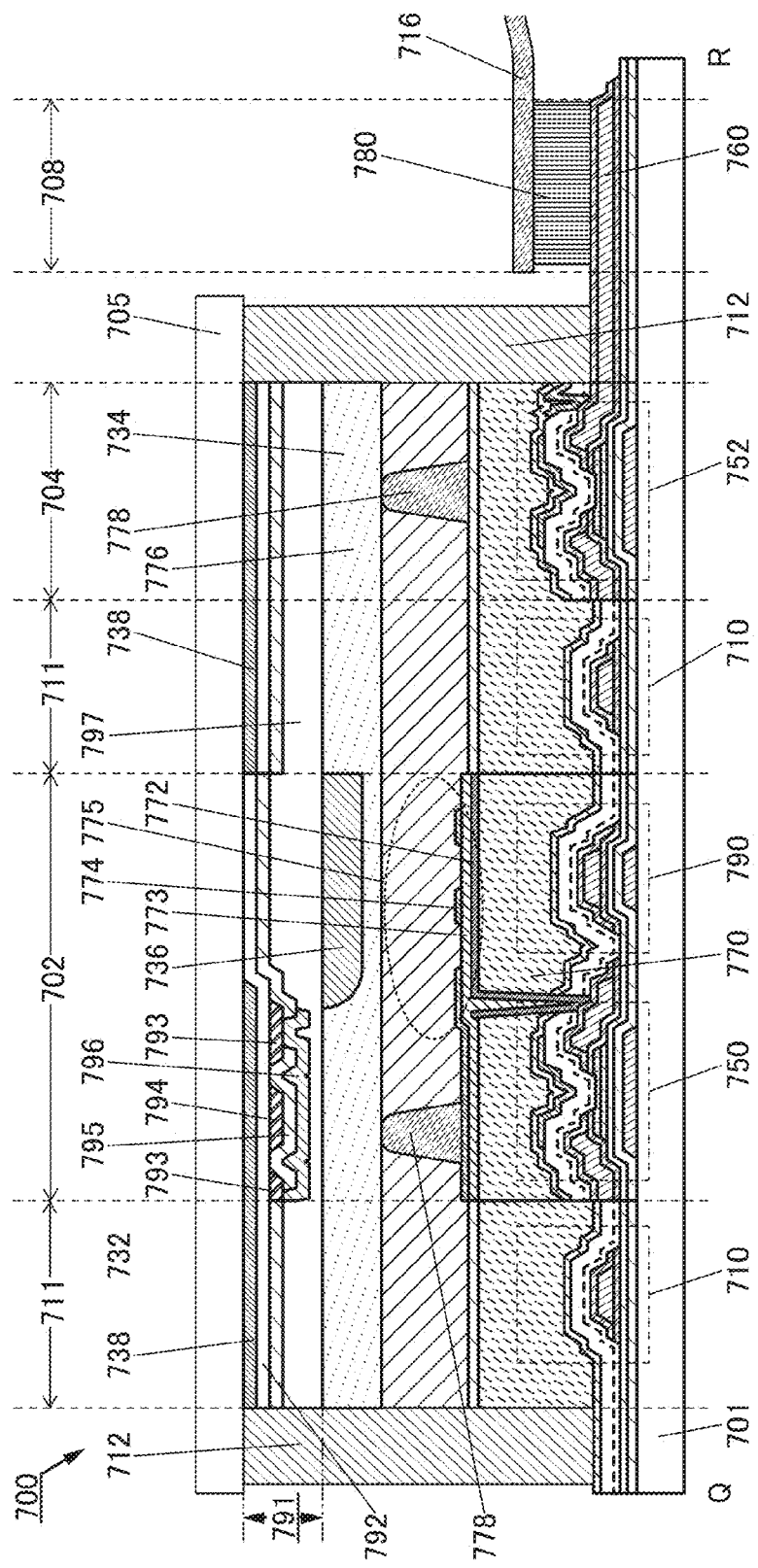
FIG. 27 is a cross-sectional view of one mode of a display device.

Portions common to FIG. 26 and FIG. 27 are described first, and then, different portions are described.

<5-1. Portions Common to Display Devices>

The display device 700 in FIG. 26 and FIG. 27 includes a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752.

The transistor 750 and the transistor 752 each have a structure similar to that of the transistor 100D described above. Note that the transistor 750 and the transistor 752 may each have the structure of any of the other transistors described in the above embodiments.

The transistor used in this embodiment includes an oxide semiconductor film that is highly purified and in which formation of oxygen vacancies is inhibited. The transistor can have a low off-state current. Accordingly, an electrical signal such as an image signal can be held for a long time, and a long writing interval can be set in an on state. Accordingly, the frequency of refresh operation can be reduced, which suppresses power consumption.

In addition, the transistor used in this embodiment can have relatively high field-effect mobility and thus is capable of high-speed operation. For example, in a liquid crystal display device that includes such a transistor capable of high-speed operation, a switching transistor in a pixel portion and a driver transistor in a driver circuit portion can be formed over one substrate. That is, no additional semiconductor device formed using a silicon wafer or the like is needed as a driver circuit; therefore, the number of components of the semiconductor device can be reduced. In addition, by using the transistor capable of high-speed operation in the pixel portion, a high-quality image can be provided.

The capacitor 790 includes a lower electrode and an upper electrode. The lower electrode is formed through a step of processing a conductive film to be a conductive film functioning as a first gate electrode of the transistor 750. The upper electrode is formed through a step of processing a conductive film to be a conductive film functioning as source and drain electrodes. Between the lower electrode and the upper electrode, an insulating film formed through a step of forming an insulating film to be an insulating film functioning as a first gate insulating film of the transistor 750 is provided. That is, the capacitor 790 has a stacked-layer structure in which an insulating film functioning as a dielectric film is positioned between the pair of electrodes.

In FIG. 26 and FIG. 27, a planarization insulating film 770 is provided over the transistor 750, the transistor 752, and the capacitor 790.

The planarization insulating film 770 can be formed using a heat-resistant organic material such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

Although FIG. 26 and FIG. 27 each illustrate an example in which the transistor 750 included in the pixel portion 702 and the transistor 752 included in the source driver circuit portion 704 have the same structure, one embodiment of the present invention is not limited thereto. For example, the pixel portion 702 and the source driver circuit portion 704 may include different transistors. Specifically, a structure in which a staggered transistor is used in the pixel portion 702 and an inverted-staggered transistor described in Embodiment 1 is used in the source driver circuit portion 704, or a structure in which the inverted-staggered transistor described in Embodiment 1 is used in the pixel portion 702 and the staggered transistor is used in the source driver circuit portion 704 may be employed. Note that the term "source driver circuit portion 704" can be replaced by the term "gate driver circuit portion."

The signal line 710 is formed through the same process as the conductive films functioning as source electrodes and drain electrodes of the transistors 750 and 752. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed through the same process as the conductive films functioning as source electrodes and drain electrodes of the transistors 750 and 752. The connection electrode 760 is electrically connected to a terminal included in the FPC 716 through the anisotropic conductive film 780.

For example, glass substrates can be used as the first substrate 701 and the second substrate 705. As the first substrate 701 and the second substrate 705, flexible substrates may also be used. An example of the flexible substrate is a plastic substrate.

A structure 778 is provided between the first substrate 701 and the second substrate 705. The structure 778 is a columnar spacer obtained by selective etching of an insulating film and is provided to control the distance (cell gap) between the first substrate 701 and the second substrate 705. Alternatively, a spherical spacer may also be used as the structure 778.

A light-blocking film 738 functioning as a black matrix, a coloring film 736 functioning as a color filter, and an insulating film 734 in contact with the light-blocking film 738 and the coloring film 736 are provided on the second substrate 705 side.

<5-2. Structure Example of Input/Output Device of Display Device>

In the display device 700 shown in FIG. 26 and FIG. 27, a touch panel 791 as an input/output device is provided. Note that the display device 700 that does not include the touch panel 791 may be used.

The touch panel 791 illustrated in FIG. 26 and FIG. 27 is what is called an in-cell touch panel provided between the second substrate 705 and the coloring film 736. The touch panel 791 is formed on the second substrate 705 side before the coloring film 736 is formed.

The touch panel 791 includes the light-blocking film 738, an insulating film 792, an electrode 793, an electrode 794, an insulating film 795, an electrode 796, and an insulating film 797. A change in the mutual capacitance between the electrode 793 and the electrode 794 can be sensed when an object such as a finger or a stylus approaches, for example.

A portion in which the electrode 793 intersects with the electrode 794 is illustrated in the upper portion of the transistor 750 illustrated in FIG. 26 and FIG. 27. The electrode 796 is electrically connected to the two electrodes 793 between which the electrode 794 is sandwiched through openings provided in the insulating film 795. Note that a structure in which a region where the electrode 796 is provided is provided in the pixel portion 702 is illustrated in FIG. 26 and FIG. 27 as an example; however, one embodiment of the present invention is not limited thereto. For example, the region where the electrode 796 is provided may be provided in the source driver circuit portion 704.

The electrode 793 and the electrode 794 are provided in a region overlapping with the light-blocking film 738. As illustrated in FIG. 26, it is preferable that the electrode 793 not overlap with the light-emitting element 782. As illustrated in FIG. 27, it is preferable that the electrode 793 not overlap with the liquid crystal element 775. In other words, the electrode 793 has an opening in a region overlapping with the light-emitting element 782 and the liquid crystal element 775. That is, the electrode 793 has a mesh shape. With such a structure, the electrode 793 does not block light emitted from the light-emitting element 782, or alternatively the electrode 793 does not block light transmitted through the liquid crystal element 775. Thus, since luminance is hardly reduced even when the touch panel 791 is provided, a display device with high visibility and low power consumption can be obtained. Note that the electrode 794 can have a structure similar to that of the electrode 793.

Since the electrode 793 and the electrode 794 do not overlap with the light-emitting element 782, a metal material having low transmittance with respect to visible light can be used for the electrode 793 and the electrode 794. Furthermore, since the electrode 793 and the electrode 794 do not overlap with the liquid crystal element 775, a metal material having low transmittance with respect to visible light can be used for the electrode 793 and the electrode 794.

Thus, as compared with the case of using an oxide material whose transmittance of visible light is high, resistance of the electrodes 793 and 794 can be reduced, whereby sensitivity of the sensor of the touch panel can be increased.

For example, a conductive nanowire may be used for the electrodes 793, 794, and 796. The nanowire may have a mean diameter of greater than or equal to 1 nm and less than or equal to 100 nm, preferably greater than or equal to 5 nm and less than or equal to 50 nm, further preferably greater than or equal to 5 nm and less than or equal to 25 nm. As the nanowire, a carbon nanotube or a metal nanowire such as an Ag nanowire, a Cu nanowire, or an Al nanowire may be used. For example, in the case where an Ag nanowire is used for any one of or all of electrodes 664, 665, and 667, the transmittance of visible light can be greater than or equal to 89% and the sheet resistance can be greater than or equal to 40 $\Omega$/sq. and less than or equal to 100 $\Omega$/sq.

Although the structure of the in-cell touch panel is illustrated in FIG. 26 and FIG. 27, one embodiment of the present invention is not limited thereto. For example, a touch panel formed over the display device 700, what is called an on-cell touch panel, or a touch panel attached to the display device 700, what is called an out-cell touch panel may be used. In this manner, the display device 700 of one embodiment of the present invention can be combined with various types of touch panels.

<5-3. Display Device Including Light-Emitting Element>

The display device 700 illustrated in FIG. 26 includes a light-emitting element 782. The light-emitting element 782 includes a conductive film 772, an EL layer 786, and a conductive film 788. The display device 700 illustrated in FIG. 26 can display an image by utilizing light emission from the EL layer 786 of the light-emitting element 782.

Note that the EL layer 786 contains an organic compound or an inorganic compound such as a quantum dot.

Examples of materials that can be used for an organic compound include a fluorescent material and a phosphorescent material. Examples of materials that can be used for a quantum dot include a colloidal quantum dot material, an alloyed quantum dot material, a core-shell quantum dot material, and a core quantum dot material. A material containing elements belonging to Groups 12 and 16, elements belonging to Groups 13 and 15, or elements belonging to Groups 14 and 16, may be used. Alternatively, a quantum dot material containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

In the display device 700 in FIG. 26, the insulating film 730 is provided over the planarization insulating film 770 and the conductive film 772. The insulating film 730 covers part of the conductive film 772. Note that the light-emitting element 782 has a top-emission structure. Thus, the conductive film 788 has a light-transmitting property and transmits light emitted from the EL layer 786. Although the top-emission structure is described as an example in this embodiment, the structure is not limited thereto. For example, a bottom-emission structure in which light is emitted to the conductive film 772 side or a dual-emission structure in which light is emitted to both the conductive film 772 side and the conductive film 788 side may also be employed.

The coloring film 736 is provided to overlap with the light-emitting element 782, and the light-blocking film 738 is provided in the lead wiring portion 711 and the source driver circuit portion 704 to overlap with the insulating film 730. The coloring film 736 and the light-blocking film 738 are covered with the insulating film 734. A space between the light-emitting element 782 and the insulating film 734 is filled with a sealing film 732. The structure of the display device 700 is not limited to the example in FIG. 26, in which the coloring film 736 is provided. For example, a structure without the coloring film 736 may also be employed in the case where the EL layer 786 is formed by separate coloring.

<5-4. Structure Example of Display Device Including Liquid Crystal Element>

The display device 700 illustrated in FIG. 27 includes a liquid crystal element 775. The liquid crystal element 775 includes a conductive film 772, an insulating film 773, a conductive film 774, and a liquid crystal layer 776. In such a structure, the conductive film 774 functions as a common electrode, and an electric field generated between the conductive film 772 and the conductive film 774 through the insulating film 773 can control the alignment state in the liquid crystal layer 776. The display device 700 in FIG. 27 is capable of displaying an image in such a manner that transmission or non-transmission is controlled by change in the alignment state of the liquid crystal layer 776 depending on a voltage applied to the conductive film 772 and the conductive film 774.

The conductive film 772 is electrically connected to the conductive film functioning as the source electrode or the drain electrode of the transistor 750. The conductive film 772 is formed over the planarization insulating film 770 and functions as a pixel electrode, that is, one electrode of the display element.

A conductive film that transmits visible light or a conductive film that reflects visible light can be used as the conductive film 772. For example, a material containing an element selected from indium (In), zinc (Zn), and tin (Sn) is preferably used for the conductive film that transmits visible light. For example, a material containing aluminum or silver is preferably used for the conductive film that reflects visible light. In this embodiment, the conductive film that reflects visible light is used for the conductive film 772.

Although FIG. 27 illustrates an example in which the conductive film 772 is connected to the conductive film functioning as the drain electrode of the transistor 750, one embodiment of the present invention is not limited to this example. For example, the conductive film 772 may be electrically connected to the conductive film functioning as the drain electrode of the transistor 750 through a conductive film functioning as a connection electrode.

Although not shown in FIG. 27, an alignment film may be provided in contact with the liquid crystal layer 776. Although not illustrated in FIG. 27, an optical member (optical substrate) and the like such as a polarizing member, a retardation member, or an anti-reflection member may be provided as appropriate. For example, circular polarization may be employed by using a polarizing substrate and a retardation substrate. In addition, a backlight, a side light, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase when the temperature of a cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition containing a liquid crystal exhibiting a blue phase and a chiral material has a short response time and optical isotropy, which eliminates the need for an alignment process. An alignment film does not need to be provided, and thus, rubbing treatment is not necessary; accordingly, electrostatic discharge damage caused by the rubbing treatment can be prevented, and defects and damage of a liquid crystal display device in the manufacturing process can be reduced. Moreover, the liquid crystal material that exhibits a blue phase has small viewing angle dependence.

In the case where a liquid crystal element is used as a display element, a twisted nematic (TN) mode, an in-plane switching (IPS) mode, a fringe field switching (FFS) mode, an axially symmetric aligned micro-cell (ASM) mode, an optical compensated birefringence (OCB) mode, a ferroelectric liquid crystal (FLC) mode, an anti-ferroelectric liquid crystal (AFLC) mode, or the like can be used.

Furthermore, a normally black liquid crystal display device such as a vertical alignment (VA) mode transmissive liquid crystal display device may also be used. There are some examples of a vertical alignment mode; for example, a multi-domain vertical alignment (MVA) mode, a patterned vertical alignment (PVA) mode, and an ASV mode, or the like can be employed.

At least part of this embodiment can be implemented in combination with any of the other embodiments described in this specification as appropriate.

Embodiment 6

In this embodiment, an example of a display panel which can be used for a display portion or the like in a display device including the semiconductor device of one embodiment of the present invention is described with reference to FIG. 28 and FIG. 29. The display panel described below as an example includes both a reflective liquid crystal element and a light-emitting element and can display an image in both the transmissive mode and the reflective mode.

<6-1. Structure Example of Display Panel>

Figure 28:
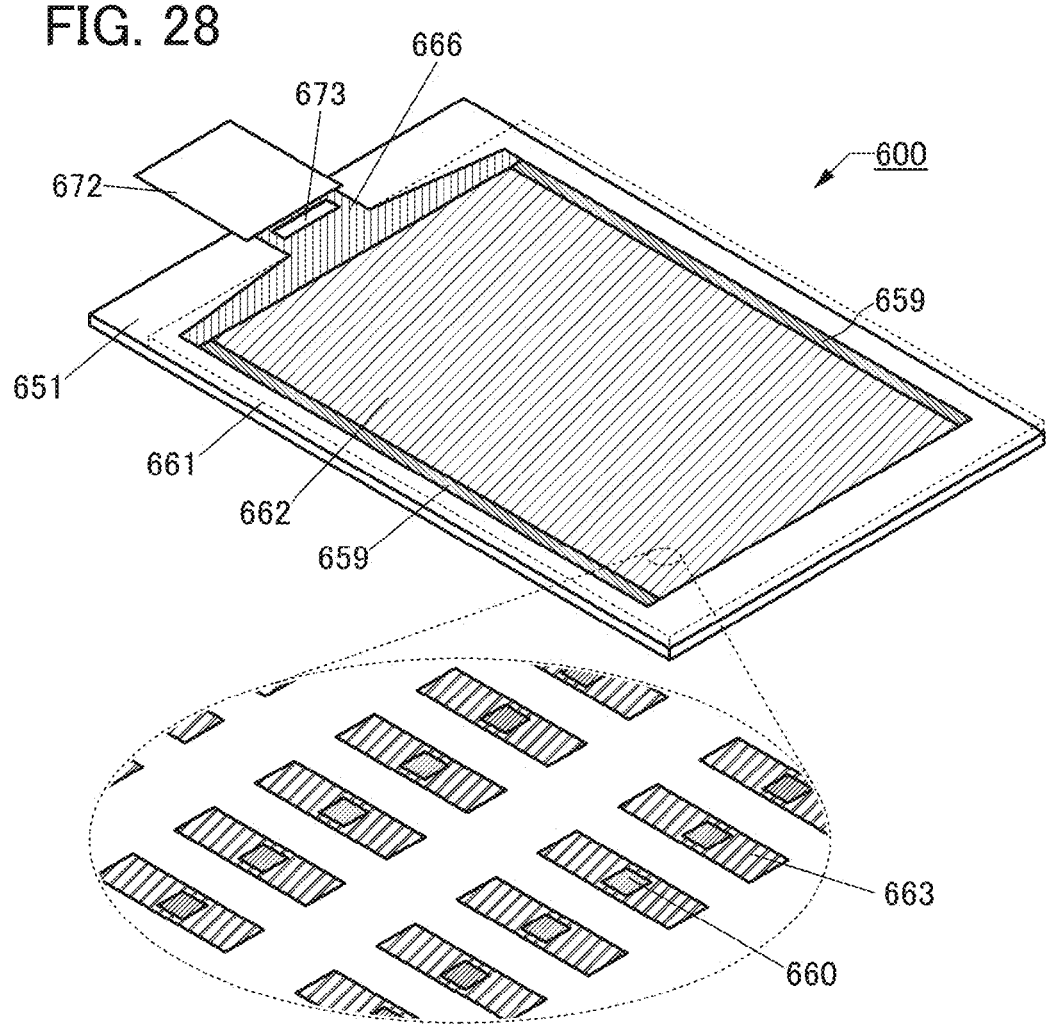
FIG. 28 illustrates a structure example of a display panel.

FIG. 28 is a schematic perspective view illustrating a display panel 600 of one embodiment of the present invention. In the display panel 600, a substrate 651 and a substrate 661 are attached to each other. In FIG. 28, the substrate 661 is denoted by a dashed line.

The display panel 600 includes a display portion 662, a circuit 659, a wiring 666, and the like. The substrate 651 is provided with the circuit 659, the wiring 666, a conductive film 663 which serves as a pixel electrode, and the like. In FIG. 28, an IC 673 and an FPC 672 are mounted on the substrate 651. Thus, the structure illustrated in FIG. 28 can be referred to as a display module including the display panel 600, the FPC 672, and the IC 673.

As the circuit 659, for example, a circuit functioning as a scan line driver circuit can be used.

The wiring 666 has a function of supplying a signal or electric power to the display portion or the circuit 659. The signal or electric power is input to the wiring 666 from the outside through the FPC 672 or from the IC 673.

FIG. 28 shows an example in which the IC 673 is provided on the substrate 651 by a chip on glass (COG) method or the like. As the IC 673, an IC functioning as a scan line driver circuit, a signal line driver circuit, or the like can be used. Note that it is possible that the IC 673 is not provided when, for example, the display panel 600 includes circuits serving as a scan line driver circuit and a signal line driver circuit and when the circuits serving as a scan line driver circuit and a signal line driver circuit are provided outside and a signal for driving the display panel 600 is input through the FPC 672. Alternatively, the IC 673 may be mounted on the FPC 672 by a chip on film (COF) method or the like.

FIG. 28 also shows an enlarged view of part of the display portion 662. The conductive films 663 included in a plurality of display elements are arranged in a matrix in the display portion 662. The conductive film 663 has a function of reflecting visible light and serves as a reflective electrode of a liquid crystal element 640 described later.

As illustrated in FIG. 28, the conductive film 663 has an opening. A light-emitting element 660 is positioned closer to the substrate 651 than the conductive film 663 is. Light is emitted from the light-emitting element 660 to the substrate 661 side through the opening in the conductive film 663.

<6-2. Cross-Sectional Structure Example>

Figure 29:
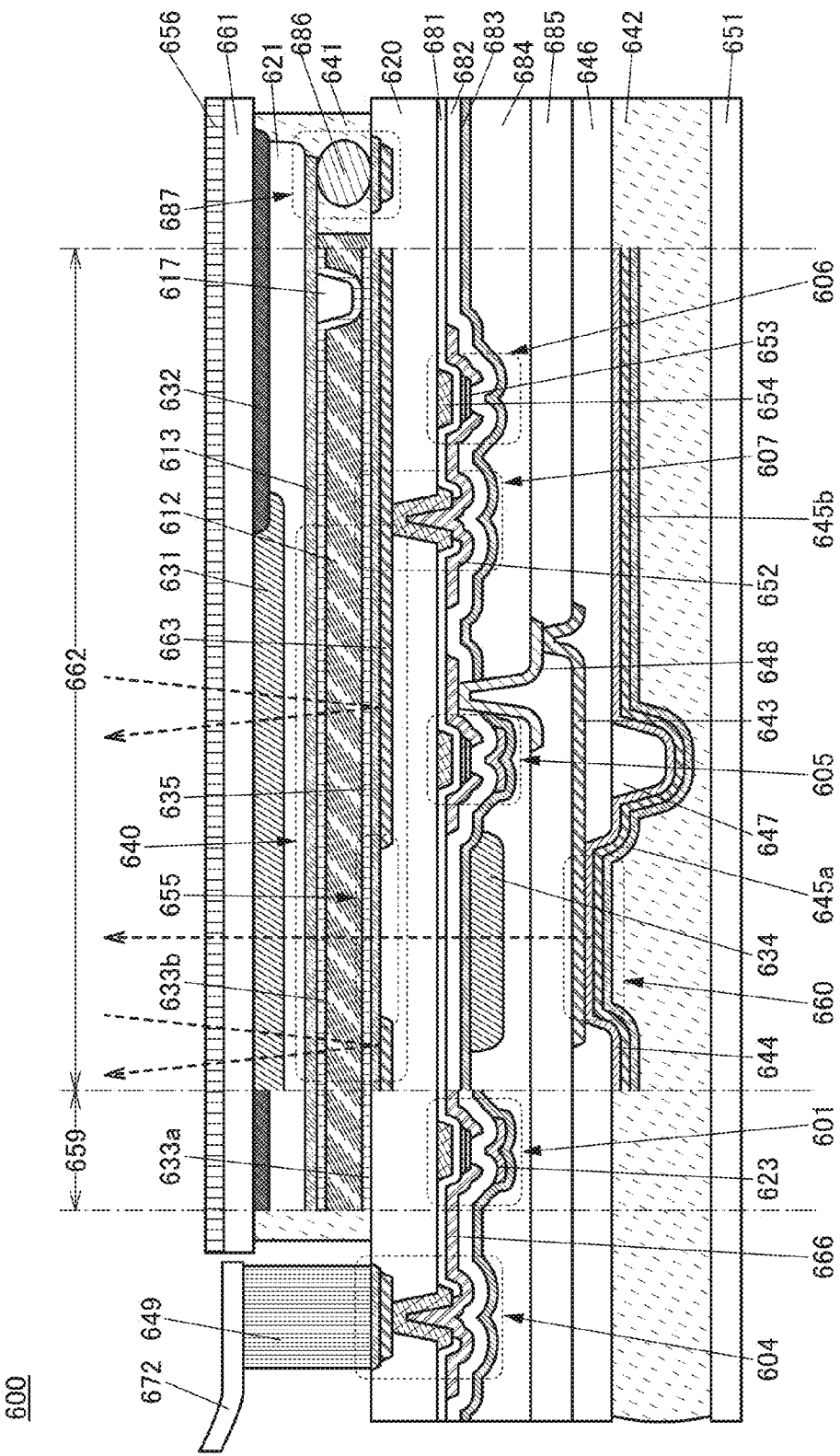
FIG. 29 illustrates a structure example of a display panel.

FIG. 29 shows an example of cross sections of part of a region including the FPC 672, part of a region including the circuit 659, and part of a region including the display portion 662 of the display panel illustrated in FIG. 28.

The display panel includes an insulating film 620 between the substrates 651 and 661. The display panel also includes the light-emitting element 660, a transistor 601, a transistor 605, a transistor 606, a coloring layer 634, and the like between the substrate 651 and the insulating film 620. Furthermore, the display panel includes the liquid crystal element 640, a coloring layer 631, and the like between the insulating film 620 and the substrate 661. The substrate 661 and the insulating film 620 are bonded with an adhesive layer 641. The substrate 651 and the insulating film 620 are bonded with an adhesive layer 642.

The transistor 606 is electrically connected to the liquid crystal element 640 and the transistor 605 is electrically connected to the light-emitting element 660. Since the transistors 605 and 606 are formed on a surface of the insulating film 620 which is on the substrate 651 side, the transistors 605 and 606 can be formed through the same process.

The substrate 661 is provided with the coloring layer 631, a light-blocking film 632, an insulating film 621, a conductive film 613 serving as a common electrode of the liquid crystal element 640, an alignment film 633b, an insulating film 617, and the like. The insulating film 617 serves as a spacer for holding a cell gap of the liquid crystal element 640.

Insulating layers such as an insulating film 681, an insulating film 682, an insulating film 683, an insulating film 684, and an insulating film 685 are provided on the substrate 651 side of the insulating film 620. Part of the insulating film 681 functions as a gate insulating layer of each transistor. The insulating films 682, 683, and 684 are provided to cover each transistor. The insulating film 685 is provided to cover the insulating film 684. The insulating films 684 and 685 each function as a planarization layer. Note that an example where the three insulating layers, the insulating films 682, 683, and 684, are provided to cover the transistors and the like is described here; however, one embodiment of the present invention is not limited to this example, and four or more insulating layers, a single insulating layer, or two insulating layers may be provided. The insulating film 684 functioning as a planarization layer is not necessarily provided when not needed.

The transistors 601, 605, and 606 each include a conductive film 654 part of which functions as a gate, a conductive film 652 part of which functions as a source or a drain, and a semiconductor film 653. Here, a plurality of layers obtained by processing the same conductive film are shown with the same hatching pattern.

The liquid crystal element 640 is a reflective liquid crystal element. The liquid crystal element 640 has a stacked structure of a conductive film 635, a liquid crystal layer 612, and the conductive film 613. In addition, the conductive film 663 which reflects visible light is provided in contact with the surface of the conductive film 635 that faces the substrate 651. The conductive film 663 includes an opening 655. The conductive films 635 and 613 contain a material transmitting visible light. In addition, an alignment film 633a is provided between the liquid crystal layer 612 and the conductive film 635 and the alignment film 633b is provided between the liquid crystal layer 612 and the conductive film 613. A polarizing plate 656 is provided on an outer surface of the substrate 661.

In the liquid crystal element 640, the conductive film 663 has a function of reflecting visible light and the conductive film 613 has a function of transmitting visible light. Light entering from the substrate 661 side is polarized by the polarizing plate 656, passes through the conductive film 613 and the liquid crystal layer 612, and is reflected by the conductive film 663. Then, the light passes through the liquid crystal layer 612 and the conductive film 613 again and reaches the polarizing plate 656. In this case, alignment of the liquid crystal is controlled with a voltage that is applied between the conductive film 613 and the conductive film 663, and thus optical modulation of light can be controlled. That is, the intensity of light emitted through the polarizing plate 656 can be controlled. Light excluding light in a particular wavelength region is absorbed by the coloring layer 631, and thus, emitted light is red light, for example.

The light-emitting element 660 is a bottom-emission light-emitting element. The light-emitting element 660 has a structure in which a conductive film 643, an EL layer 644, and a conductive film 645b are stacked in this order from the insulating film 620 side. In addition, a conductive film 645a is provided to cover the conductive film 645b. The conductive film 645b contains a material reflecting visible light, and the conductive films 643 and 645a contain a material transmitting visible light. Light is emitted from the light-emitting element 660 to the substrate 661 side through the coloring layer 634, the insulating film 620, the opening 655, the conductive film 613, and the like.

Here, as illustrated in FIG. 29, the conductive film 635 transmitting visible light is preferably provided for the opening 655. Accordingly, the liquid crystal is aligned in a region overlapping with the opening 655 as well as in the other regions, in which case an alignment defect of the liquid crystal is prevented from being generated in the boundary portion of these regions and undesired light leakage can be suppressed.

As the polarizing plate 656 provided on an outer surface of the substrate 661, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 640 are controlled depending on the kind of the polarizing plate so that desirable contrast is obtained.

In addition, an insulating film 647 is provided on the insulating film 646 covering an end portion of the conductive film 643. The insulating film 647 has a function as a spacer for preventing the insulating film 620 and the substrate 651 from getting closer more than necessary. In the case where the EL layer 644 or the conductive film 645a is formed using a blocking mask (metal mask), the insulating film 647 may have a function of preventing the blocking mask from being in contact with a surface on which the EL layer 644 or the conductive film 645a is formed. Note that the insulating film 647 is not necessarily provided when not needed.

One of a source and a drain of the transistor 605 is electrically connected to the conductive film 643 of the light-emitting element 660 through a conductive film 648.

One of a source and a drain of the transistor 606 is electrically connected to the conductive film 663 through a connection portion 607. The conductive films 663 and 635 are in contact with and electrically connected to each other. Here, in the connection portion 607, the conductive layers provided on both surfaces of the insulating film 620 are connected to each other through an opening in the insulating film 620.

A connection portion 604 is provided in a region where the substrate 651 and the substrate 661 do not overlap with each other. The connection portion 604 is electrically connected to the FPC 672 through a connection layer 649. The connection portion 604 has a structure similar to that of the connection portion 607. On the top surface of the connection portion 604, a conductive layer obtained by processing the same conductive film as the conductive film 635 is exposed. Thus, the connection portion 604 and the FPC 672 can be electrically connected to each other through the connection layer 649.

A connection portion 687 is provided in part of a region where the adhesive layer 641 is provided. In the connection portion 687, the conductive layer obtained by processing the same conductive film as the conductive film 635 is electrically connected to part of the conductive film 613 with a connector 686. Accordingly, a signal or a potential input from the FPC 672 connected to the substrate 651 side can be supplied to the conductive film 613 formed on the substrate 661 side through the connection portion 687.

As the connector 686, a conductive particle can be used, for example. As the conductive particle, a particle of an organic resin, silica, or the like coated with a metal material can be used. It is preferable to use nickel or gold as the metal material because contact resistance can be reduced. It is also preferable to use a particle coated with layers of two or more kinds of metal materials, such as a particle coated with nickel and further with gold. As the connector 686, a material capable of elastic deformation or plastic deformation is preferably used. As illustrated in FIG. 29, the connector 686 which is the conductive particle has a shape that is vertically crushed in some cases. With the crushed shape, the contact area between the connector 686 and a conductive layer electrically connected to the connector 686 can be increased, thereby reducing contact resistance and suppressing the generation of problems such as disconnection.

The connector 686 is preferably provided so as to be covered with the adhesive layer 641. For example, the connectors 686 are dispersed in the adhesive layer 641 before curing of the adhesive layer 641.

FIG. 29 illustrates an example of the circuit 659 in which the transistor 601 is provided.

The structure in which the semiconductor film 653 where a channel is formed is provided between two gates is used as an example of the transistors 601 and 605 in FIG. 29. One gate is formed using the conductive film 654 and the other gate is formed using a conductive film 623 overlapping with the semiconductor film 653 with the insulating film 682 provided therebetween. Such a structure enables control of threshold voltages of a transistor. In that case, the two gates may be connected to each other and supplied with the same signal to operate the transistor. Such a transistor can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a display panel in which the number of wirings is increased because of increase in size or resolution.

Note that the transistor included in the circuit 659 and the transistor included in the display portion 662 may have the same structure. A plurality of transistors included in the circuit 659 may have the same structure or different structures. A plurality of transistors included in the display portion 662 may have the same structure or different structures.

A material through which impurities such as water and hydrogen do not easily diffuse is preferably used for at least one of the insulating films 682 and 683 which cover the transistors. That is, the insulating film 682 or the insulating film 683 can function as a barrier film. Such a structure can effectively suppress diffusion of the impurities into the transistors from the outside, and a highly reliable display panel can be provided.

The insulating film 621 is provided on the substrate 661 side to cover the coloring layer 631 and the light-blocking film 632. The insulating film 621 may have a function as a planarization layer. The insulating film 621 enables the conductive film 613 to have an almost flat surface, resulting in a uniform alignment state of the liquid crystal layer 612.

An example of the method for manufacturing the display panel 600 is described. For example, the conductive film 635, the conductive film 663, and the insulating film 620 are formed in order over a support substrate provided with a separation layer, and the transistor 605, the transistor 606, the light-emitting element 660, and the like are formed. Then, the substrate 651 and the support substrate are bonded with the adhesive layer 642. After that, separation is performed at the interface between the separation layer and each of the insulating film 620 and the conductive film 635, whereby the support substrate and the separation layer are removed. Separately, the coloring layer 631, the light-blocking film 632, the conductive film 613, and the like are formed over the substrate 661 in advance. Then, the liquid crystal is dropped onto the substrate 651 or 661 and the substrates 651 and 661 are bonded with the adhesive layer 641, whereby the display panel 600 can be manufactured.

A material for the separation layer can be selected such that separation at the interface with the insulating film 620 and the conductive film 635 occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer be used as the insulating film 620 over the separation layer. The use of the high-melting-point metal material for the separation layer can increase the formation temperature of a layer formed in a later step, which reduces impurity concentration and achieves a highly reliable display panel.

As the conductive film 635, an oxide or a nitride such as a metal oxide, a metal nitride, or an oxide semiconductor whose resistance is reduced is preferably used. In the case of using an oxide semiconductor, a material in which at least one of the concentrations of hydrogen, boron, phosphorus, nitrogen, and other impurities and the number of oxygen vacancies is made to be higher than those in a semiconductor layer of a transistor is used for the conductive film 635.

<6-3. Components>

The above components will be described below. Note that descriptions of structures having functions similar to those in the above embodiments are omitted.

[Adhesive Layer]

As the adhesive layer, a variety of curable adhesives such as a reactive curable adhesive, a thermosetting adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layer, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

<6-4. Manufacturing Method Example>

A manufacturing method example of a display panel using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a support substrate that is different from the substrate and then to separate the element layer from the support substrate to be transferred to the substrate. Although not described in detail here, in addition to the above two methods, there is a method in which an element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to the support substrate, in which case transfer thereof in an apparatus and between apparatuses can be easy.

In the case of employing the method in which the element layer is formed over the support substrate and then transferred to the substrate, first, a separation layer and an insulating layer are stacked over the support substrate, and then the element layer is formed over the insulating layer. Next, the element layer is separated from the support substrate and then transferred to the substrate. At this time, selected is a material with which separation at an interface between the support substrate and the separation layer, at an interface between the separation layer and the insulating layer, or in the separation layer occurs. With the method, it is preferable that a material having high heat resistance be used for the support substrate or the separation layer, in which case the upper limit of the temperature applied when the element layer is formed can be increased, and an element layer including a more highly reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer.

As the method for separating the support substrate from the element layer, applying mechanical force, etching the separation layer, and making a liquid permeate the separation interface are given as examples. Alternatively, separation may be performed by heating or cooling two layers of the separation interface by utilizing a difference in thermal expansion coefficient.

The separation layer is not necessarily provided in the case where the separation can be performed at an interface between the support substrate and the insulating layer.

For example, glass and an organic resin such as polyimide can be used as the support substrate and the insulating layer, respectively. In that case, a separation trigger may be formed by, for example, locally heating part of the organic resin with laser light or the like, or by physically cutting part of or making a hole through the organic resin with a sharp tool, and separation may be performed at an interface between the glass and the organic resin. As the above-described organic resin, a photosensitive material is preferably used because an opening or the like can be easily formed. The above-described laser light preferably has a wavelength region, for example, from visible light to ultraviolet light. For example, light having a wavelength of greater than or equal to 200 nm and less than or equal to 400 nm, preferably greater than or equal to 250 nm and less than or equal to 350 nm can be used. In particular, an excimer laser having a wavelength of 308 nm is preferably used because the productivity is increased. Alternatively, a solid-state UV laser (also referred to as a semiconductor UV laser), such as a UV laser having a wavelength of 355 nm which is the third harmonic of an Nd:YAG laser, may be used.

Alternatively, a heat generation layer may be provided between the support substrate and the insulating layer formed of an organic resin, and separation may be performed at an interface between the heat generation layer and the insulating layer by heating the heat generation layer. For the heat generation layer, any of a variety of materials such as a material which generates heat by feeding current, a material which generates heat by absorbing light, and a material which generates heat by applying a magnetic field can be used. For example, for the heat generation layer, a material selected from a semiconductor, a metal, and an insulator can be used.

In the above-described methods, the insulating layer formed of an organic resin can be used as a substrate after the separation.

The above is the description of a manufacturing method of a flexible display panel.

At least part of this embodiment can be implemented in combination with any of the other embodiments and the other examples described in this specification as appropriate.

Embodiment 7

In this embodiment, a display device including a semiconductor device of one embodiment of the present invention is described with reference to FIGS. 30A to 30C.

<7. Circuit Configuration of Display Device>

A display device illustrated in FIG. 30A includes a region including pixels of display elements (hereinafter referred to as a pixel portion 502), a circuit portion that is provided outside the pixel portion 502 and includes a circuit for driving the pixels (hereinafter, the circuit portion is referred to as a driver circuit portion 504), circuits having a function of protecting elements (hereinafter, the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed. Thus, the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X (X is a natural number of 2 or more) rows and Y (Y is a natural number of 2 or more) columns (hereinafter, the circuits are referred to as pixel circuits 501). The driver circuit portion 504 includes driver circuits such as a circuit for supplying a signal (scan signal) to select a pixel (hereinafter, the circuit is referred to as a gate driver 504a) and a circuit for supplying a signal (data signal) to drive a display element in a pixel (hereinafter, the circuit is referred to as a source driver 504b).

The gate driver 504a includes a shift register or the like. The gate driver 504a receives a signal for driving the shift register through the terminal portion 507 and outputs a signal. For example, the gate driver 504a receives a start pulse signal, a clock signal, or the like and outputs a pulse signal. The gate driver 504a has a function of controlling the potentials of wirings supplied with scan signals (hereinafter referred to as scan lines GL_1 to GL_X). Note that a plurality of gate drivers 504a may be provided to control the scan lines GL_1 to GL_X separately. Alternatively, the gate driver 504a has a function of supplying an initialization signal. Without being limited thereto, another signal can be supplied from the gate driver 504a.

The source driver 504b includes a shift register or the like. The source driver 504b receives a signal (image signal) from which a data signal is generated, as well as a signal for driving the shift register, through the terminal portion 507. The source driver 504b has a function of generating a data signal to be written to the pixel circuit 501 from the image signal. In addition, the source driver 504b has a function of controlling output of a data signal in response to a pulse signal produced by input of a start pulse signal, a clock signal, or the like. Furthermore, the source driver 504b has a function of controlling the potentials of wirings supplied with data signals (hereinafter referred to as data lines DL_1 to DL_Y). Alternatively, the source driver 504b has a function of supplying an initialization signal. Without being limited thereto, another signal can be supplied from the source driver 504b.

The source driver 504b includes a plurality of analog switches, for example. The source driver 504b can output, as data signals, time-divided image signals obtained by sequentially turning on the plurality of analog switches. The source driver 504b may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal in each of the plurality of pixel circuits 501 are controlled by the gate driver 504a. For example, to the pixel circuit 501 in the m-th row and the n-th column (m is a natural number of X or less, and n is a natural number of Y or less), a pulse signal is input from the gate driver 504a through the scan line GL_m, and a data signal is input from the source driver 504b through the data line DL_n in accordance with the potential of the scan line GL_m.

Figure 30A:
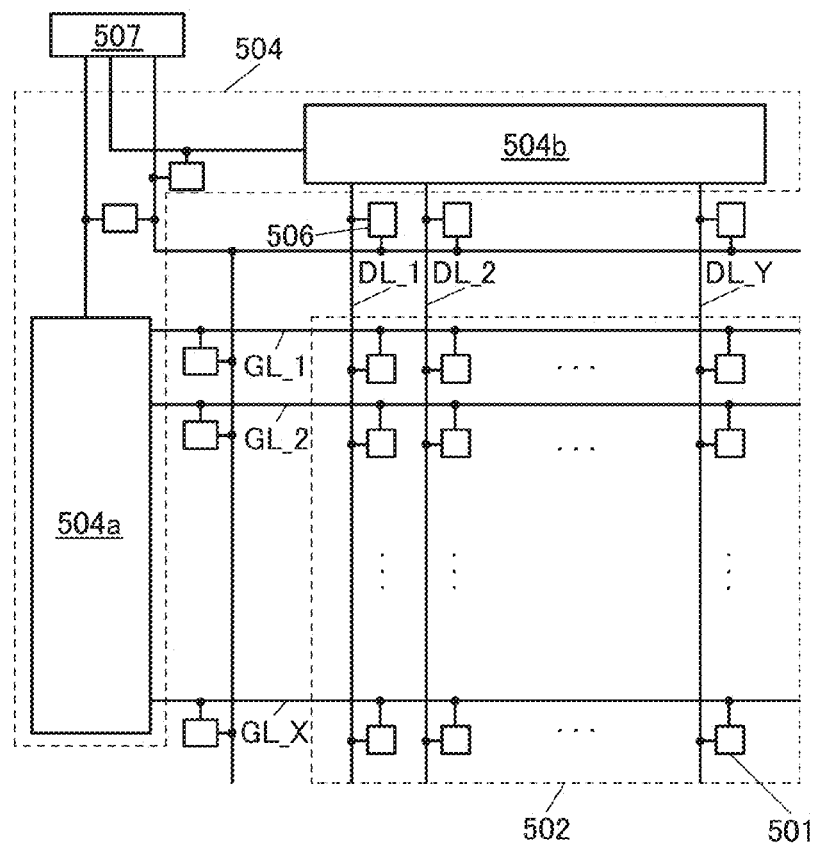
FIGS. 30A to 30C are a block diagram and circuit diagrams illustrating a display device.

The protection circuit 506 in FIG. 30A is connected to, for example, the scan line GL between the gate driver 504a and the pixel circuit 501. Alternatively, the protection circuit 506 is connected to the data line DL between the source driver 504b and the pixel circuit 501. Alternatively, the protection circuit 506 can be connected to a wiring between the gate driver 504a and the terminal portion 507. Alternatively, the protection circuit 506 can be connected to a wiring between the source driver 504b and the terminal portion 507. Note that the terminal portion 507 refers to a portion having terminals for inputting power, control signals, and image signals from external circuits to the display device.

The protection circuit 506 electrically connects a wiring connected to the protection circuit to another wiring when a potential out of a certain range is supplied to the wiring connected to the protection circuit.

As illustrated in FIG. 30A, the protection circuits 506 provided for the pixel portion 502 and the driver circuit portion 504 can improve the resistance of the display device to overcurrent generated by electrostatic discharge (ESD) or the like. Note that the configuration of the protection circuits 506 is not limited thereto; for example, the protection circuit 506 can be connected to the gate driver 504a or the source driver 504b. Alternatively, the protection circuit 506 can be connected to the terminal portion 507.

One embodiment of the present invention is not limited to the example in FIG. 30A, in which the driver circuit portion 504 includes the gate driver 504a and the source driver 504b. For example, only the gate driver 504a may be formed, and a separately prepared substrate over which a source driver circuit is formed (e.g., a driver circuit board formed using a single crystal semiconductor film or a polycrystalline semiconductor film) may be mounted.

Figure 30B:
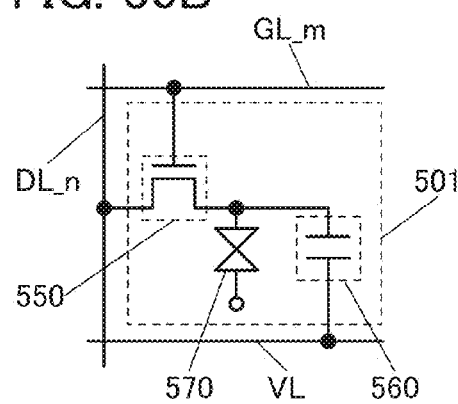

Each of the plurality of pixel circuits 501 in FIG. 30A can have the configuration illustrated in FIG. 30B, for example.

The pixel circuit 501 in FIG. 30B includes a liquid crystal element 570, a transistor 550, and a capacitor 560. As the transistor 550, the transistor described in the above embodiment can be used.

The potential of one of a pair of electrodes of the liquid crystal element 570 is set as appropriate in accordance with the specifications of the pixel circuit 501. The alignment state of the liquid crystal element 570 depends on data written thereto. A common potential may be supplied to the one of the pair of electrodes of the liquid crystal element 570 included in each of the plurality of pixel circuits 501. The potential supplied to the one of the pair of electrodes of the liquid crystal element 570 in the pixel circuit 501 may differ between rows.

Examples of a method for driving the display device including the liquid crystal element 570 include a TN mode, an STN mode, a VA mode, an axially symmetric aligned micro-cell (ASM) mode, an optically compensated birefringence (OCB) mode, a ferroelectric liquid crystal (FLC) mode, an anti-ferroelectric liquid crystal (AFLC) mode, an MVA mode, a patterned vertical alignment (PVA) mode, an IPS mode, an FFS mode, and a transverse bend alignment (TBA) mode. Other examples of the method for driving the display device include an electrically controlled birefringence (ECB) mode, a polymer-dispersed liquid crystal (PDLC) mode, a polymer network liquid crystal (PNLC) mode, and a guest-host mode. Without being limited thereto, various liquid crystal elements and driving methods can be used.

In the pixel circuit 501 in the m-th row and the n-th column, one of a source electrode and a drain electrode of the transistor 550 is electrically connected to the data line DL_n, and the other of the source electrode and the drain electrode of the transistor 550 is electrically connected to the other of the pair of electrodes of the liquid crystal element 570. A gate electrode of the transistor 550 is electrically connected to the scan line GL_m. The transistor 550 is configured to be turned on or off to control whether a data signal is written.

One of a pair of electrodes of the capacitor 560 is electrically connected to a wiring through which a potential is supplied (hereinafter referred to as a potential supply line VL), and the other of the pair of electrodes of the capacitor 560 is electrically connected to the other of the pair of electrodes of the liquid crystal element 570. The potential of the potential supply line VL is set as appropriate in accordance with the specifications of the pixel circuit 501. The capacitor 560 functions as a storage capacitor for storing written data.

For example, in the display device including the pixel circuits 501 in FIG. 30B, the gate driver 504a in FIG. 30A sequentially selects the pixel circuits 501 row by row to turn on the transistors 550, and data signals are written.

When the transistor 550 is turned off, the pixel circuit 501 to which the data has been written is brought into a holding state. This operation is sequentially performed row by row; thus, an image can be displayed.

Figure 30C:
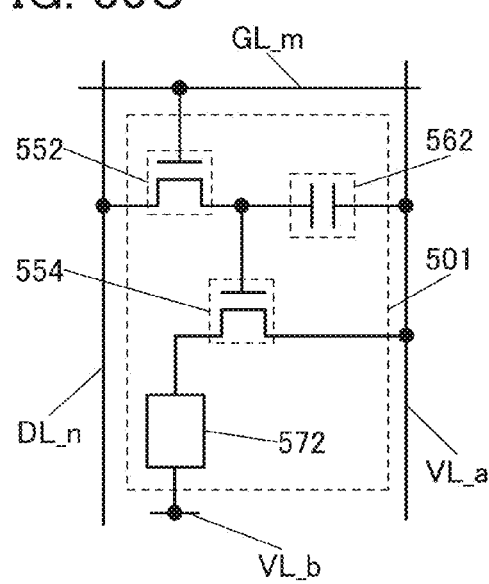

Alternatively, each of the plurality of pixel circuits 501 in FIG. 30A can have the configuration illustrated in FIG. 30C, for example.

The pixel circuit 501 in FIG. 30C includes transistors 552 and 554, a capacitor 562, and a light-emitting element 572. The transistor described in the above embodiment can be used as the transistor 552 and/or the transistor 554.

One of a source electrode and a drain electrode of the transistor 552 is electrically connected to a wiring through which a data signal is supplied (hereinafter referred to as a data line DL_n). A gate electrode of the transistor 552 is electrically connected to a wiring through which a gate signal is supplied (hereinafter referred to as a scan line GL_m).

The transistor 552 is configured to be turned on or off to control whether a data signal is written.

One of a pair of electrodes of the capacitor 562 is electrically connected to a wiring through which a potential is supplied (hereinafter referred to as a potential supply line VL_a), and the other of the pair of electrodes of the capacitor 562 is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. A gate electrode of the transistor 554 is electrically connected to the other of the source electrode and the drain electrode of the transistor 552.

One of an anode and a cathode of the light-emitting element 572 is electrically connected to a potential supply line VL_b, and the other of the anode and the cathode of the light-emitting element 572 is electrically connected to the other of the source electrode and the drain electrode of the transistor 554.

As the light-emitting element 572, an organic electroluminescent element (also referred to as an organic EL element) can be used, for example. Note that the light-emitting element 572 is not limited thereto and may be an inorganic EL element including an inorganic material.

A high power supply potential $V_{DD}$ is supplied to one of the potential supply line VL_a and the potential supply line VL_b, and a low power supply potential $V_{SS}$ is supplied to the other of the potential supply line VL_a and the potential supply line VL_b.

In the display device including the pixel circuits 501 in FIG. 30C, the gate driver 504a in FIG. 30A sequentially selects the pixel circuits 501 row by row to turn on the transistors 552, and data signals are written.

When the transistor 552 is turned off, the pixel circuit 501 to which the data has been written is brought into a holding state. Furthermore, the amount of current flowing between the source electrode and the drain electrode of the transistor 554 is controlled in accordance with the potential of the written data signal. The light-emitting element 572 emits light with a luminance corresponding to the amount of flowing current. This operation is sequentially performed row by row; thus, an image can be displayed.

At least part of this embodiment can be implemented in combination with any of the other embodiments described in this specification as appropriate.

Embodiment 8

In this embodiment, a display module and electronic devices, each of which includes a semiconductor device of one embodiment of the present invention, are described with reference to FIG. 31, FIGS. 32A to 32E, and FIGS. 33A to 33G.

<8-1. Display Module>

Figure 31:
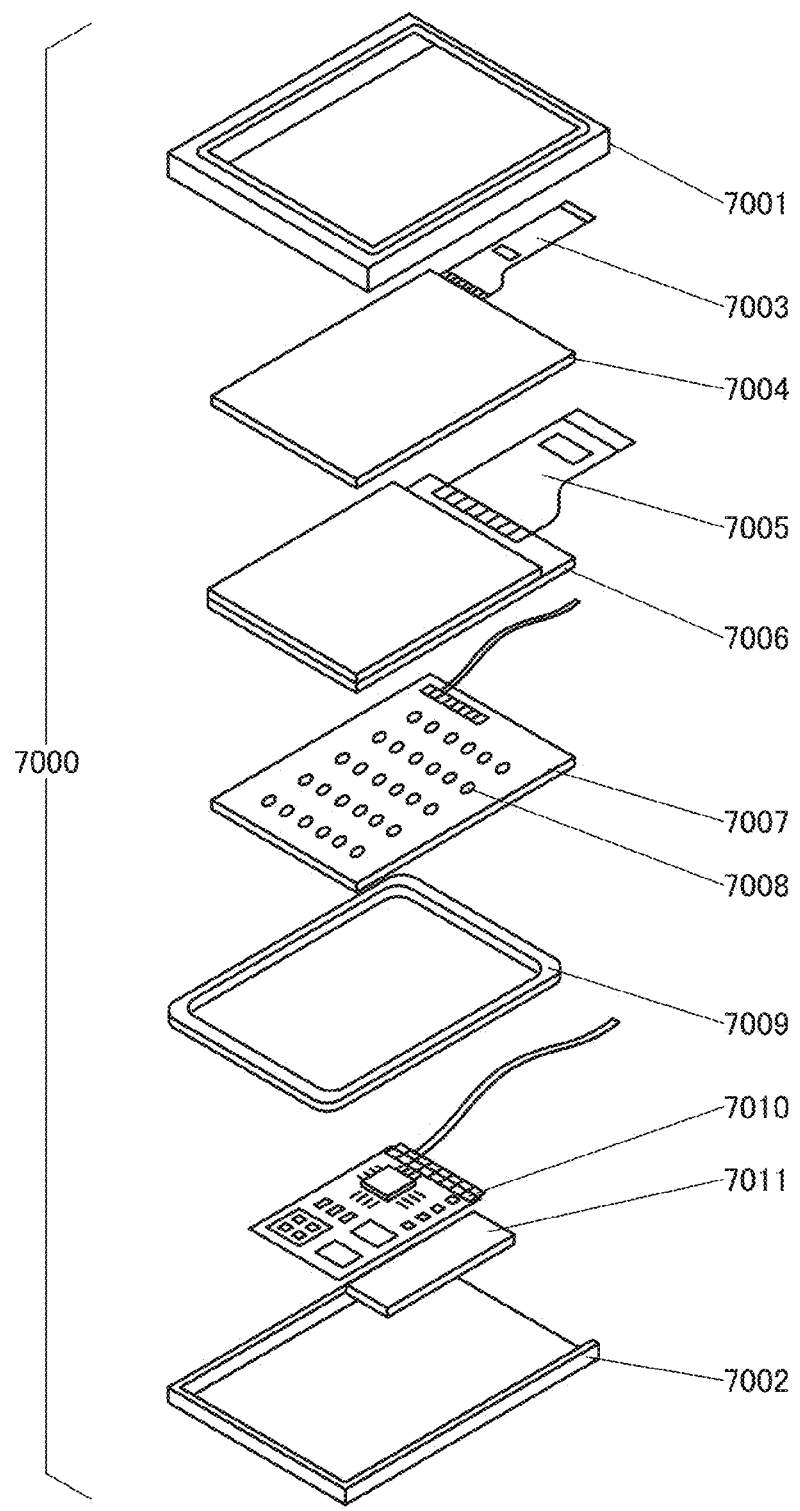
FIG. 31 illustrates a display module.

In a display module 7000 illustrated in FIG. 31, a touch panel 7004 connected to an FPC 7003, a display panel 7006 connected to an FPC 7005, a backlight 7007, a frame 7009, a printed-circuit board 7010, and a battery 7011 are provided between an upper cover 7001 and a lower cover 7002.

The semiconductor device of one embodiment of the present invention can be used for the display panel 7006, for example.

The shapes and sizes of the upper cover 7001 and the lower cover 7002 can be changed as appropriate in accordance with the sizes of the touch panel 7004 and the display panel 7006.

The touch panel 7004 can be a resistive touch panel or a capacitive touch panel and overlap with the display panel 7006. Alternatively, a counter substrate (sealing substrate) of the display panel 7006 can have a touch panel function. Alternatively, a photosensor may be provided in each pixel of the display panel 7006 to form an optical touch panel.

The backlight 7007 includes a light source 7008. One embodiment of the present invention is not limited to the structure in FIG. 31, in which the light source 7008 is provided over the backlight 7007. For example, a structure in which the light source 7008 is provided at an end portion of the backlight 7007 and a light diffusion plate is further provided may be employed. Note that the backlight 7007 need not be provided in the case where a self-luminous light-emitting element such as an organic EL element is used or in the case where a reflective panel or the like is employed.

The frame 7009 protects the display panel 7006 and functions as an electromagnetic shield for blocking electromagnetic waves generated by the operation of the printed-circuit board 7010. The frame 7009 may also function as a radiator plate.

The printed-circuit board 7010 includes a power supply circuit and a signal processing circuit for outputting a video signal and a clock signal. As a power source for supplying power to the power supply circuit, an external commercial power source or the separate battery 7011 may be used. The battery 7011 can be omitted in the case where a commercial power source is used.

The display module 7000 may be additionally provided with a member such as a polarizing plate, a retardation plate, or a prism sheet.

<8-2. Electronic Device 1>

Next, FIGS. 32A to 32E illustrate examples of electronic devices.

Figure 32A:
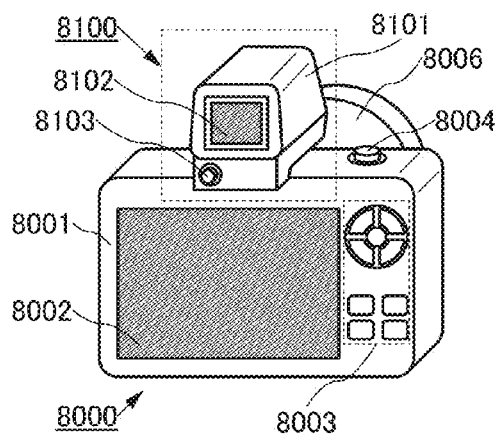
FIGS. 32A to 32E illustrate electronic devices.

FIG. 32A is an external view of a camera 8000 to which a finder 8100 is attached.

The camera 8000 includes a housing 8001, a display portion 8002, an operation button 8003, a shutter button 8004, and the like. Furthermore, an attachable lens 8006 is attached to the camera 8000.

Although the attachable lens 8006 of the camera 8000 here is detachable from the housing 8001 for replacement, the attachable lens 8006 may be included in the housing 8001.

Images can be taken with the camera 8000 at the press of the shutter button 8004. In addition, images can be taken at the touch of the display portion 8002 that serves as a touch panel.

The housing 8001 of the camera 8000 includes a mount including an electrode, so that the finder 8100, a stroboscope, or the like can be connected to the housing 8001.

The finder 8100 includes a housing 8101, a display portion 8102, a button 8103, and the like.

The housing 8101 includes a mount for engagement with the mount of the camera 8000 so that the finder 8100 can be connected to the camera 8000. The mount includes an electrode, and an image or the like received from the camera 8000 through the electrode can be displayed on the display portion 8102.

The button 8103 serves as a power button. The display portion 8102 can be turned on and off with the button 8103.

A display device of one embodiment of the present invention can be used in the display portion 8002 of the camera 8000 and the display portion 8102 of the finder 8100.

Although the camera 8000 and the finder 8100 are separate and detachable electronic devices in FIG. 32A, the housing 8001 of the camera 8000 may include a finder having a display device.

Figure 32B:
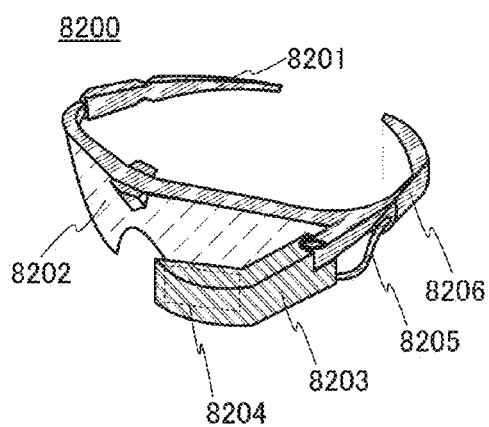

FIG. 32B is an external view of a head-mounted display 8200.

The head-mounted display 8200 includes a mounting portion 8201, a lens 8202, a main body 8203, a display portion 8204, a cable 8205, and the like. The mounting portion 8201 includes a battery 8206.

Power is supplied from the battery 8206 to the main body 8203 through the cable 8205. The main body 8203 includes a wireless receiver or the like to receive video data, such as image data, and display it on the display portion 8204. The movement of the eyeball and the eyelid of a user is captured by a camera in the main body 8203 and then coordinates of the points the user looks at are calculated using the captured data to utilize the eye of the user as an input means.

The mounting portion 8201 may include a plurality of electrodes so as to be in contact with the user. The main body 8203 may be configured to sense current flowing through the electrodes with the movement of the user's eyeball to recognize the direction of his or her eyes. The main body 8203 may be configured to sense current flowing through the electrodes to monitor the user's pulse. The mounting portion 8201 may include sensors, such as a temperature sensor, a pressure sensor, or an acceleration sensor so that the user's biological information can be displayed on the display portion 8204. The main body 8203 may be configured to sense the movement of the user's head or the like to move an image displayed on the display portion 8204 in synchronization with the movement of the user's head or the like.

The display device of one embodiment of the present invention can be used in the display portion 8204.

Figure 32C:
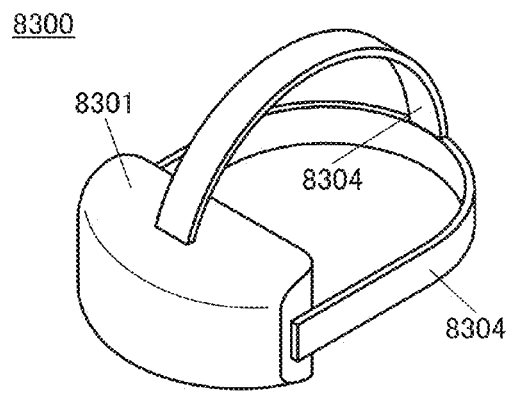
Figure 32D:
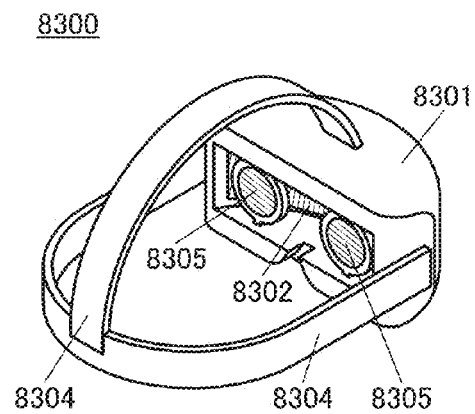
Figure 32E:
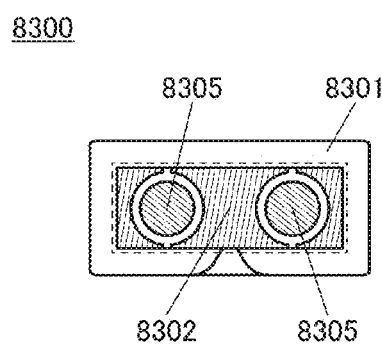

FIGS. 32C to 32E are external views of a head-mounted display 8300. The head-mounted display 8300 includes a housing 8301, a display portion 8302, an object for fixing, such as a band, 8304, and a pair of lenses 8305.

A user can see display on the display portion 8302 through the lenses 8305. It is favorable that the display portion 8302 be curved. When the display portion 8302 is curved, a user can feel high realistic sensation of images. Although the structure described in this embodiment as an example has one display portion 8302, the number of the display portions 8302 provided is not limited to one. For example, two display portions 8302 may be provided, in which case one display portion is provided for one corresponding user's eye, so that three-dimensional display using parallax or the like is possible.

The display device of one embodiment of the present invention can be used in the display portion 8302. The display device including the semiconductor device of one embodiment of the present invention has an extremely high resolution; thus, even when an image is magnified using the lenses 8305 as illustrated in FIG. 32E, the user does not perceive pixels, and thus a more realistic image can be displayed.

<8-3. Electronic Device 2>

Next, FIGS. 33A to 33G illustrate examples of electronic devices that are different from those illustrated in FIGS. 32A to 32E.

Electronic devices illustrated in FIGS. 33A to 33G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic devices in FIGS. 33A to 33G have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions of the electronic devices in FIGS. 33A to 33G are not limited thereto, and the electronic devices can have a variety of functions. Although not illustrated in FIGS. 33A to 33G, the electronic devices may each have a plurality of display portions. Furthermore, the electronic devices may each be provided with a camera and the like to have a function of taking a still image, a function of taking a moving image, a function of storing the taken image in a memory medium (an external memory medium or a memory medium incorporated in the camera), a function of displaying the taken image on the display portion, or the like.

The electronic devices in FIGS. 33A to 33G are described in detail below.

Figure 33A:
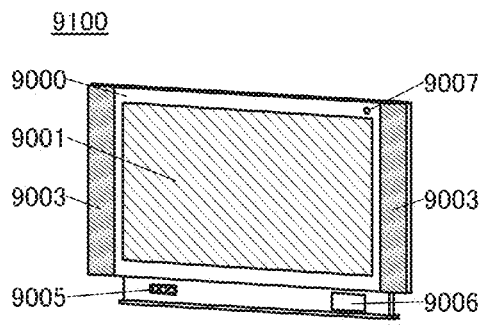
FIGS. 33A to 33G illustrate electronic devices.

FIG. 33A is a perspective view illustrating a television device 9100. The television device 9100 can include the display portion 9001 having a large screen size of, for example, 50 inches or more, or 100 inches or more.

Figure 33D:
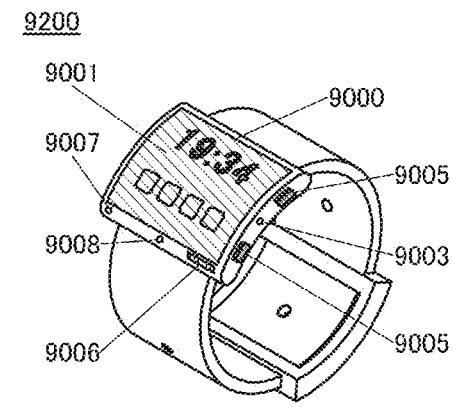
Figure 33B:
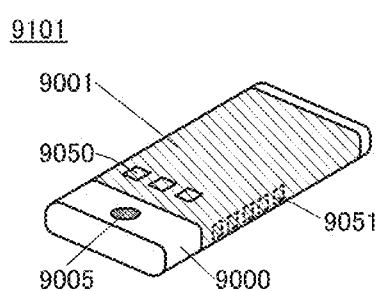

FIG. 33B is a perspective view of a portable information terminal 9101. The portable information terminal 9101 functions as, for example, one or more of a telephone set, a notebook, and an information browsing system. Specifically, the portable information terminal 9101 can be used as a smartphone. Note that the portable information terminal 9101 may include a speaker, a connection terminal, a sensor, or the like. The portable information terminal 9101 can display text and image information on its plurality of surfaces. For example, three operation buttons 9050 (also referred to as operation icons or simply as icons) can be displayed on one surface of the display portion 9001. Furthermore, information 9051 indicated by dashed rectangles can be displayed on another surface of the display portion 9001. Examples of the information 9051 include display indicating reception of an e-mail, a social networking service (SNS) message, or a telephone call, the title and sender of an e-mail or an SNS message, date, time, remaining battery, and reception strength of an antenna. Alternatively, the operation buttons 9050 or the like may be displayed in place of the information 9051.

Figure 33E:
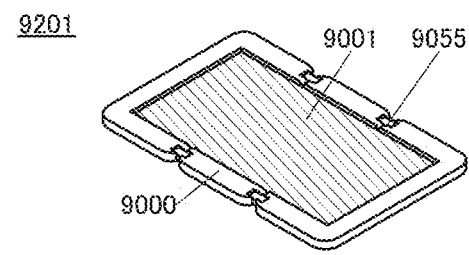
Figure 33C:
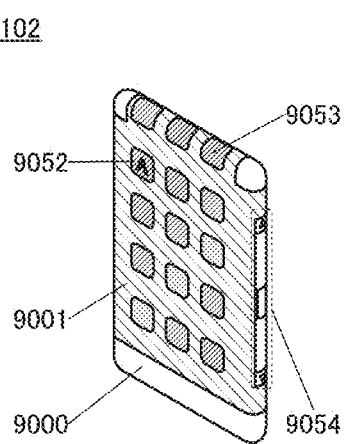

FIG. 33C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) on the portable information terminal 9102 put in a breast pocket of his/her clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

FIG. 33D is a perspective view of a watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is curved, and display can be performed on the curved display surface. The portable information terminal 9200 can employ near field communication conformable to a communication standard. For example, hands-free calling can be achieved by mutual communication between the portable information terminal 9200 and a headset capable of wireless communication. Moreover, the portable information terminal 9200 includes the connection terminal 9006 and can perform direct data communication with another information terminal via a connector. Charging through the connection terminal 9006 is also possible. Note that the charging operation may be performed by wireless power feeding without using the connection terminal 9006.

Figure 33F:
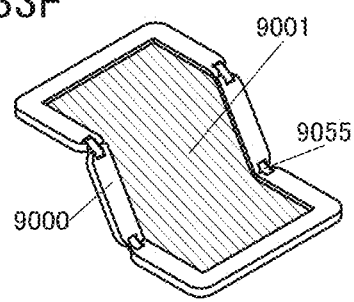
Figure 33G:
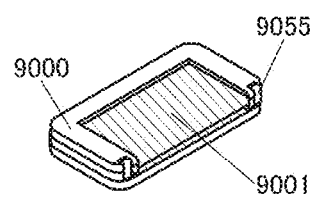

FIGS. 33E, 33F, and 33G are perspective views of a foldable portable information terminal 9201 that is opened, that is shifted from the opened state to the folded state or from the folded state to the opened state, and that is folded, respectively. The portable information terminal 9201 is highly portable when folded. When the portable information terminal 9201 is opened, a seamless large display region is highly browsable. The display portion 9001 of the portable information terminal 9201 is supported by three housings 9000 joined by hinges 9055. By being folded at the hinges 9055 between the two adjacent housings 9000, the portable information terminal 9201 can be reversibly changed in shape from the opened state to the folded state. For example, the portable information terminal 9201 can be bent with a radius of curvature greater than or equal to 1 mm and less than or equal to 150 mm.

The electronic devices described in this embodiment each include the display portion for displaying some sort of data. Note that the semiconductor device of one embodiment of the present invention can also be used for an electronic device that does not have a display portion.

At least part of this embodiment can be implemented in combination with any of the other embodiments and the other examples described in this specification as appropriate.

Example 1

In this example, an oxide semiconductor film that can be used for a semiconductor device of one embodiment of the present invention was formed and evaluated. Note that in this example, Sample B1 and Sample B2 were formed, and each of Sample B1 and Sample B2 was observed and analyzed by HAADF-STEM.

<1-1. Sample Conditions>

Sample B1 was formed under the conditions similar to those used to form Sample A1 described in Embodiment 4. Sample B2 was formed under the conditions similar to those used to form Sample A2 described in Embodiment 4.

<1-2. Analysis of TEM Images>

Next, plan-view TEM images of Sample B1 and Sample B2 were analyzed. Note that the plan-view TEM images were observed with a spherical aberration corrector function. Note that the plan-view TEM images were obtained using an atomic resolution analytical electron microscope JEM-ARM200F manufactured by JEOL Ltd. under the following conditions: the acceleration voltage was 200 kV, and irradiation with an electron beam with a diameter of approximately 0.1 nmϕ was performed.

Then, the plan-view TEM images of Sample B1 and Sample B2 were each subjected to image processing and image analysis.

In the image processing, the plan-view TEM images were subjected to fast Fourier transform (FFT), so that FFT images were obtained. Then, the obtained FFT images were subjected to mask processing except for a range from 2.8 nm$^{-1}$ to 5.0 nm$^{-1}$. After that, the FFT images subjected to mask processing were subjected to inverse fast Fourier transform (IFFT) to obtain FFT filtering images.

In the image analysis, lattice points were extracted from the FFT filtering images. Extraction of lattice points was performed in the following manner. First, noise in the FFT filtering images was removed. To remove the noise, the luminance of a region within a 0.05-nm radius was smoothed using the following formula.

[Formula 1]

$$S\_Int(x, y) = \sum_{r \leq 0.05} \frac{Int(x', y')}{r} \quad (1)$$

Note that S_Int(x,y) represents the smoothed luminance at the coordinates (x,y), r represents the distance between the coordinates (x,y) and the coordinates (x',y'), and Int(x',y') represents the luminance at the coordinates (x',y'). In the calculation, r was regarded as 1 when it was 0.

Then, a search for lattice points was conducted. The coordinates with higher luminance than the other candidate lattice points within a 0.22-nm radius were regarded as a lattice point. At this point, a candidate lattice point was extracted. Within a 0.22-nm radius, detection errors of lattice points due to noise can be less frequent. Note that adjacent lattice points are a certain distance away from each other in the TEM image; thus, two or more lattice points are unlikely to be observed within a 0.22-nm radius.

Subsequently, coordinates with the highest luminance within a 0.22-nm radius from the extracted candidate lattice point were extracted to redetermine a candidate lattice point. The extraction of a candidate lattice point was repeated in this manner until no new candidate lattice point appeared; the coordinates at that point were determined as a lattice point. Similarly, determination of another lattice point was performed at a position more than 0.22 nm away from the determined lattice point. In this manner, lattice points were determined in the entire region. The determined lattice points are collectively called a lattice point group.

Here, a method for deriving an orientation of a hexagonal lattice from the extracted lattice point group is described with reference to schematic diagrams in FIGS. 34A to 34C and a flow chart in FIG. 34D.

Figure 34A:
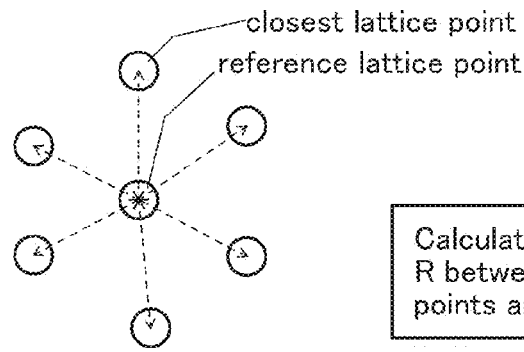
FIGS. 34A to 34D illustrate a method for deriving a rotation angle of a hexagon.
Figure 34B:
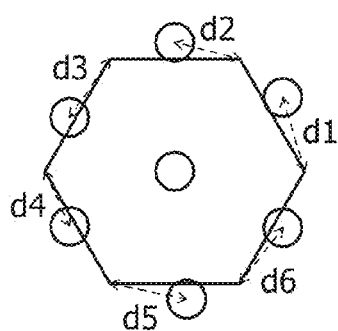
Figure 34C:
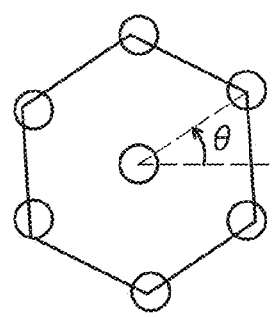
Figure 34D:
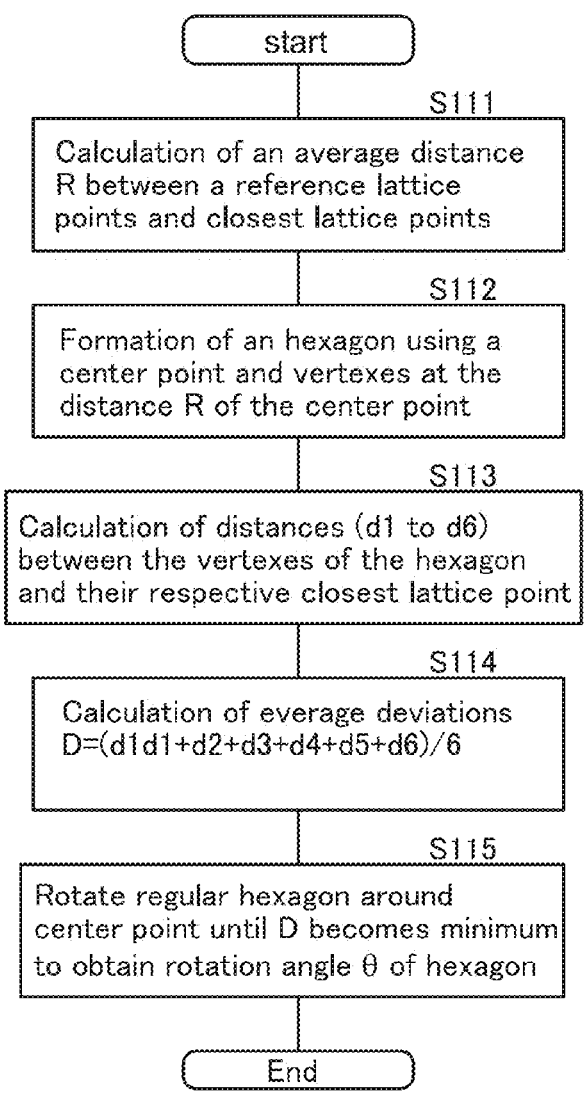

First, a reference lattice point was determined and the six closest lattice points to the reference lattice point were connected to form a hexagonal lattice (FIG. 34A and Step S111 in FIG. 34D). After that, an average distance R between the reference lattice point, which is the center point of the hexagonal lattice, and each of the lattice points, which is a vertex, was calculated. Then, a regular hexagon was formed with the use of the reference lattice point as the center point and the calculated distance R as the distance from the center point to each vertex (see Step S112 in FIG. 34D). The distances from the vertices of the regular hexagon to their respective closest lattice points are regarded as a distance d1, a distance d2, a distance d3, a distance d4, a distance d5, and a distance d6 (see Step S113 in FIG. 34D). Next, the regular hexagon was rotated around the center point through 60° by 0.1°, and the average deviation between the hexagonal lattice and the rotated regular hexagon [D=(d1+d2+d3+d4+d5+d6)/6] was calculated (Step S114 in FIG. 34D). Then, a rotation angle θ of the regular hexagon when the average deviation D became minimum was calculated as the angle of the hexagonal lattice (Step S115 in FIG. 34D).

Next, the observation range of the plan-view TEM image was adjusted so that the hexagonal lattices whose angles are 30° account for the highest percentage. The average orientation of hexagonal lattice within a 1-nm radius was calculated. Then, the plan-view TEM images obtained through the image processing were shown with gradation depending on the orientation of the hexagonal lattice in the region.

Figure 35A:
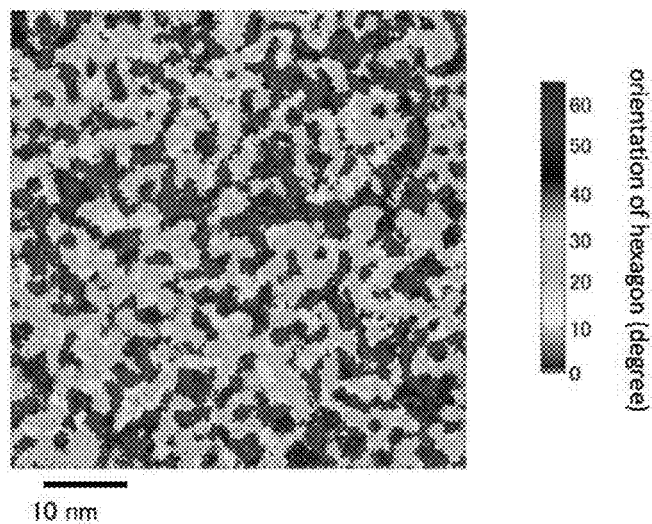
FIGS. 35A and 35B are images obtained through image processing of plan-view TEM images of samples.
Figure 35B:
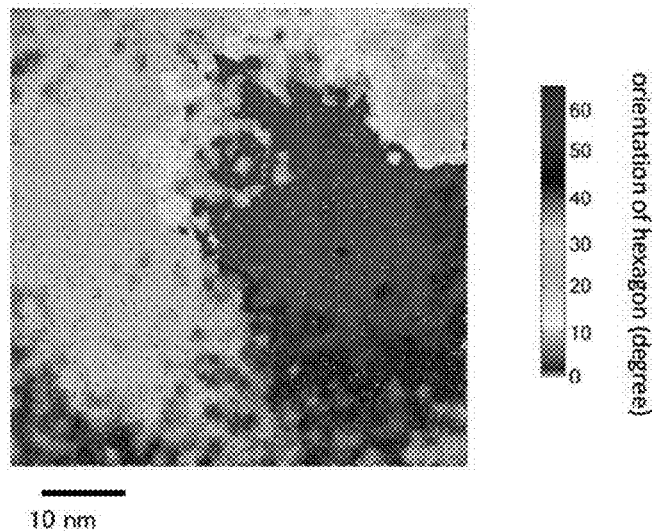

FIG. 35A shows the image processing results of the plan-view TEM image of Sample B1, and FIG. 35B shows the image processing results of the plan-view TEM image of Sample B2.

The images in FIGS. 35A and 35B that are obtained through the image processing of the plan-view TEM images are shown with gradation depending on the orientation of the hexagonal lattice. That is, the images obtained through the image processing of the plan-view TEM images are each an image in which the orientation of Voronoi regions formed by lattice points in each certain wavenumber range is extracted by dividing a certain wavenumber range and providing gradation in the divided ranges in the FFT filtering image of the plan-view TEM image.

The results shown in FIG. 35A reveal that, in Sample B1, orientations of hexagons are random and nanocrystals are distributed in a mosaic pattern. The results shown in FIG. 35B reveal that, in Sample B2, a region with uniformly oriented hexagons covers a large area of several tens of nanometers. The region covering a large area appears to form one large grain. Note that in a region between the grain and another grain, nanocrystals with randomly oriented hexagons are distributed in a mosaic pattern as in Sample B1 and appear to connect the grains to each other in a continuous manner.

Thus, the results shown in FIGS. 35A and 35B suggest that regions with randomly oriented hexagons and distributed in a mosaic pattern are formed more easily with a lower substrate temperature or a lower oxygen gas flow rate ratio at the time of forming an oxide semiconductor film.

Through the analysis of the plan-view TEM images in the above-described manner, a boundary portion where angles of hexagonal lattices change can be examined.

<1-3. Voronoi Analysis>

Next, Voronoi diagrams of Sample B1 and Sample B2 were formed, and the Voronoi diagrams were analyzed.

A Voronoi diagram is an image partitioned by regions including a lattice point group. Each lattice point is closer to regions surrounding the lattice point than to any other lattice point. Hereinafter, a method for forming a Voronoi diagram is described in detail using schematic diagrams in FIGS. 36A to 36D and a flow chart in FIG. 36E.

Figure 36A:
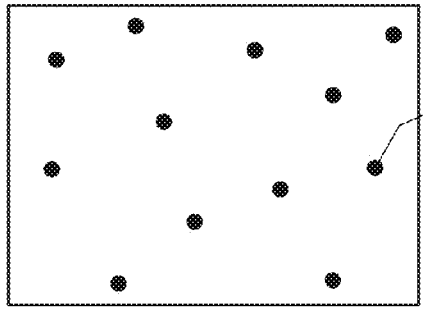
FIGS. 36A to 36E illustrate a method for forming a Voronoi diagram.
Figure 36B:
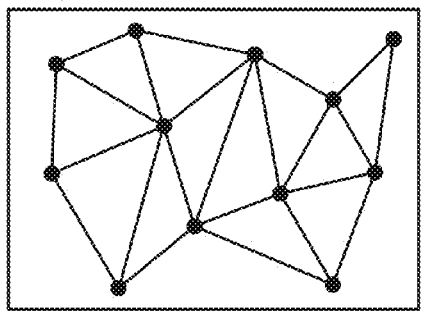
Figure 36C:
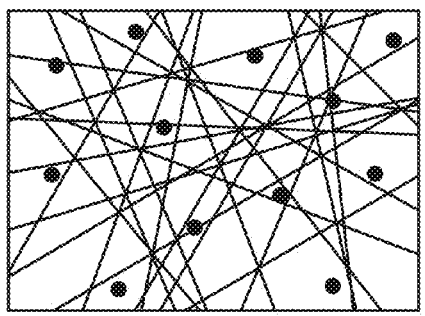
Figure 36D:
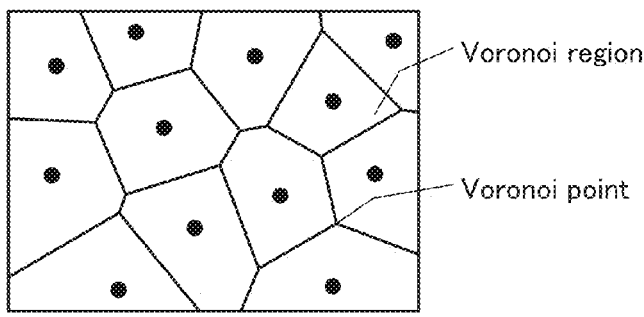
Figure 36E:
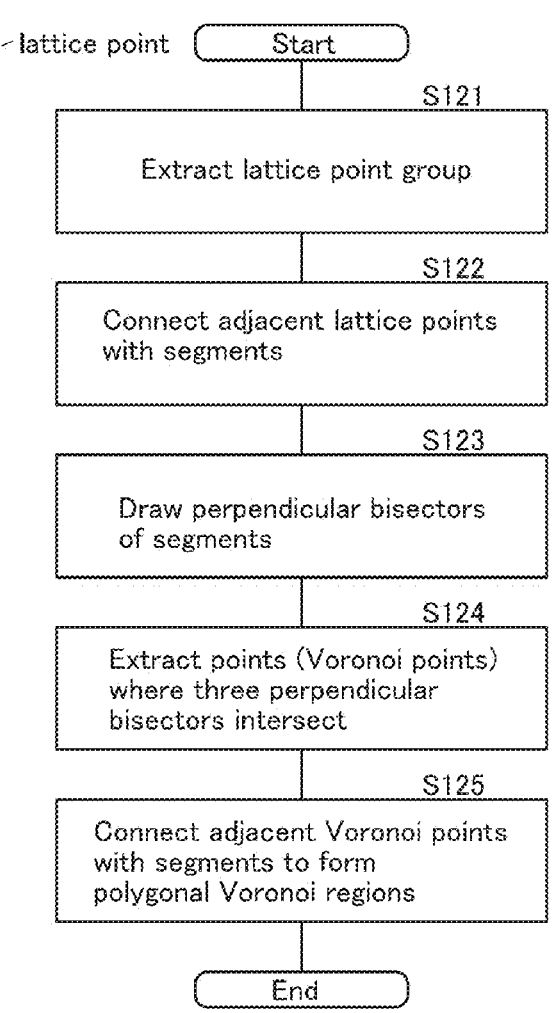

First, a lattice point group was extracted by the method described using FIGS. 34A to 34D or the like (FIG. 36A and Step S121 in FIG. 36E). Next, adjacent lattice points were connected with segments (FIG. 36B and Step S122 in FIG. 36E). Then, perpendicular bisectors of the segments were drawn (FIG. 36C and Step S123 in FIG. 36E). Subsequently, points where three perpendicular bisectors intersect were extracted (Step S124 in FIG. 36E). The points are called Voronoi points. After that, adjacent Voronoi points were connected with segments (FIG. 36D and Step S125 in FIG. 36E). A polygonal region surrounded by the segments at this point is called a Voronoi region. In the above method, a Voronoi diagram can be formed.

Then, Voronoi analysis was performed using the formed Voronoi diagrams.

Figure 37A:
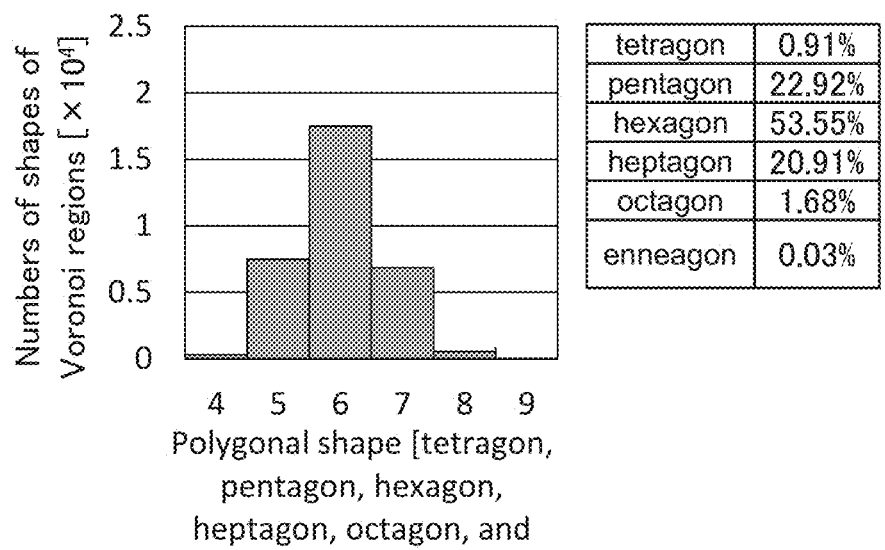
FIGS. 37A and 37B show the proportions and the numbers of shapes of Voronoi regions.
Figure 37B:
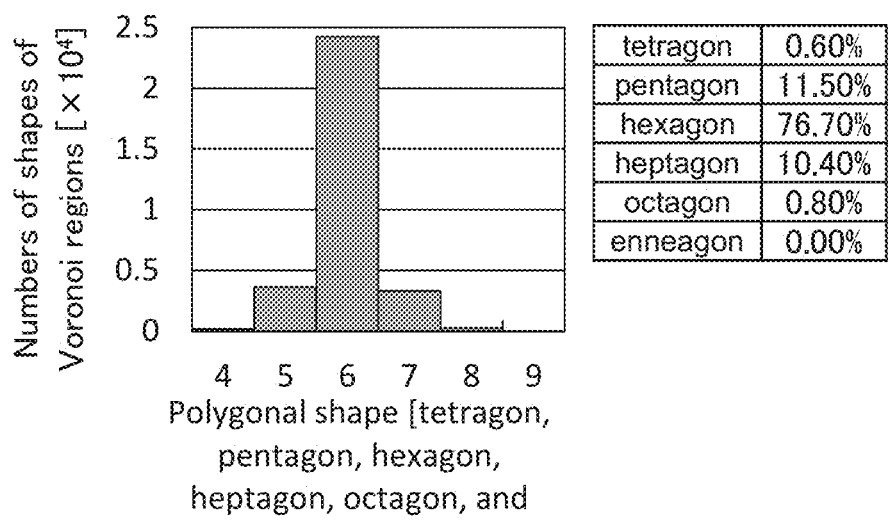

FIG. 37A shows Voronoi analysis results of Sample B1, and FIG. 37B shows Voronoi analysis results of Sample B2.

The proportions and the numbers of the shapes of Voronoi regions (tetragon, pentagon, hexagon, heptagon, octagon, and enneagon) in Sample B1 and Sample B2 are shown in FIGS. 37A and 37B. In bar graphs, the numbers of the shapes of Voronoi regions (tetragon, pentagon, hexagon, heptagon, octagon, and enneagon) in the samples are shown. In tables, the proportions of the shapes of Voronoi regions (tetragon, pentagon, hexagon, heptagon, octagon, and enneagon) in the samples are shown.

As shown in FIG. 37A, the proportion of hexagons in Sample B1 was 53.55%. As shown in FIG. 37B, the proportion of hexagons in Sample B2 was 76.70%.

It is confirmed from the results shown in FIGS. 37A and 37B that crystal states of oxide are largely different depending on the difference in film formation conditions of the oxide semiconductor film. That is, it is suggested that the lower the substrate temperature or the oxygen gas flow rate ratio at the time of forming the oxide semiconductor film is, the lower the proportion of hexagons is.

Note that at least part of this example can be implemented in combination with any of the embodiments described in this specification as appropriate.

Example 2

In this example, an oxide semiconductor film that can be used in a semiconductor device of one embodiment of the present invention was formed, and wet etching rates of the oxide semiconductor film were evaluated.

Note that in this example, conditions of ten levels in total were employed. The substrate temperature at the time of forming the oxide semiconductor film was set at two levels (Tsub.=130° C. and 170° C.), and the oxygen flow rate ratio at the time of forming the oxide semiconductor film was set at five levels (02=10%, 30%, 50%, 70%, and 100%). Note that the oxide semiconductor films of the ten levels were each formed having a thickness of 100 nm and using a metal oxide target with an atomic ratio of In:Ga:Zn=4:2:4.1. The oxide semiconductor films were each etched with an etchant (obtained in such a manner that a phosphoric acid solution at a concentration of 85% was diluted with pure water by 100 times) for 60 seconds.

<2. Wet Etching Rate>

Table 1 shows wet etching rates of the formed oxide semiconductor films of the ten levels.

TABLE 1

|  | $O_2 = 10\%$ | $O_2 = 30\%$ | $O_2 = 50\%$ | $O_2 = 70\%$ | $O_2 = 100\%$ |
|---|---|---|---|---|---|
| Tsub. = 130° C. | 19.2 | 13.7 | 12.5 | 13.8 | 12.6 |
| Tsub. = 170° C. | 15.2 | 12.5 | 11.5 | 10.9 | 10.4 |

As shown in Table 1, a higher substrate temperature at the time of forming the oxide semiconductor film results in a lower wet etching rate, and a lower oxygen flow rate ratio at the time of forming the oxide semiconductor film results in a higher wet etching rate.

As described above, by changing the substrate temperature and the oxygen flow rate ratio at the time of forming oxide semiconductor films, oxide semiconductor films differing in wet etching rate can be formed.

Note that at least part of this example can be implemented in combination with any of the embodiments described in this specification as appropriate.

Example 3

In this example, a transistor corresponding to the transistor 100E shown in FIGS. 10A to 10C was formed, and $I_d$-$V_g$ characteristics evaluation, reliability tests, and cross-sectional observation were performed on the transistor.

Note that samples formed in this example are a transistor having a channel length L of 2 μm and a channel width W of 50 μm, a transistor having a channel length L of 3 μm and a channel width W of 50 μm, and a transistor having a channel length L of 6 μm and a channel width W of 50 μm. As transistors of each of the three kinds, 10 transistors were formed.

The samples formed in this example are described below. Note that the reference numerals used for the transistor 100E in FIGS. 10A to 10D are used in the following description.
<3-1. Formation Method of Sample>

First, the conductive film 104 was formed over the substrate 102. As the substrate 102, a glass substrate was used. As the conductive film 104, a 100-nm-thick tungsten film was formed with a sputtering apparatus.

Then, the insulating film was formed over the substrate 102 and the conductive film 104. As the insulating film 106, a 400-nm-thick silicon nitride film and a 15-nm-thick silicon oxynitride film were formed with a PECVD apparatus.

Then, the oxide semiconductor film 108_1 and the oxide semiconductor film 108_2 were formed over the insulating film 106. The oxide semiconductor film 108_1 and the oxide semiconductor film 108_2 were each formed using In—Ga—Zn oxide with a sputtering apparatus.

The oxide semiconductor film 108_1 was formed of In—Ga—Zn oxide having a thickness of 10 nm, and the oxide semiconductor film 108_2 was formed of In—Ga—Zn oxide having a thickness of 25 nm. Note that the oxide semiconductor film 108_1 was formed under the conditions where the substrate temperature was 130° C., an argon gas at a flow rate of 180 sccm and an oxygen gas at a flow rate of 20 sccm were introduced into a chamber, the pressure was 0.6 Pa, and an AC power of 2500 W was applied to a metal oxide sputtering target (having an atomic ratio of In:Ga:Zn=4:2:4.1). Note that the oxide semiconductor film 108_2 was formed under the conditions where the substrate temperature was 130° C., an oxygen gas at a flow rate of 100 sccm was introduced into a chamber, the pressure was 0.6 Pa, and an AC power of 2500 W was applied to a metal oxide sputtering target (having an atomic ratio of In:Ga:Zn=4:2:4.1). Note that the oxide semiconductor film 108_1 and the oxide semiconductor film 108_2 were successively formed in a vacuum chamber of a sputtering apparatus.

Next, the conductive films 112a and 112b were formed over the insulating film 106 and the oxide semiconductor film 108_2. As the conductive films 112a and 112b, a 30-nm-thick titanium film, a 200-nm-thick copper film, and a 50-nm-thick titanium film were successively formed in vacuum with a sputtering apparatus.

Then, the insulating film 114 and the insulating film 116 were formed over the insulating film 106, the oxide semiconductor film 108, and the conductive films 112a and 112b. As the insulating film 114, a 30-nm-thick silicon oxynitride film was formed with a PECVD apparatus. As the insulating film 116, a 400-nm-thick silicon oxynitride film was formed with a PECVD apparatus. Note that the insulating film 114 and the insulating film 116 were formed successively in vacuum with a PECVD apparatus.

Then, first heat treatment was performed. The first heat treatment was performed at 350° C. for 1 hour in a nitrogen gas atmosphere.

Next, the insulating film 118 was formed over the insulating film 116. As the insulating film 118, a 100-nm-thick silicon nitride film was formed with a PECVD apparatus.

Next, the opening 142a reaching the conductive film 112b and the opening 142b reaching the conductive film 104 were formed. The openings 142a and 142b were formed with a dry etching apparatus.

Next, a conductive film was formed over the insulating film 118 to cover the openings 142a and 142b and processed to form the conductive films 120a and 120b. For the conductive films 120a and 120b, a 100-nm-thick In—Sn—Si oxide was formed with a sputtering apparatus.

Then, second heat treatment was performed. The second heat treatment was performed at 250° C. for 1 hour in a nitrogen gas atmosphere.

Through the above process, the samples of this example was manufactured.
<3-2. $I_d$-$V_g$ Characteristics>

Figure 38A:
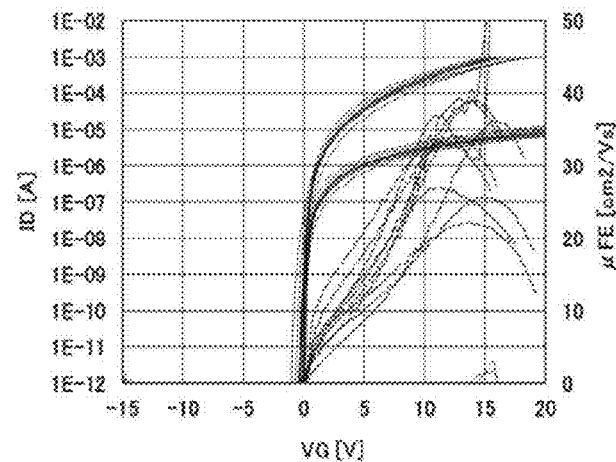
FIGS. 38A to 38C show $I_d$-$V_g$ characteristics of transistors in an example.
Figure 38B:
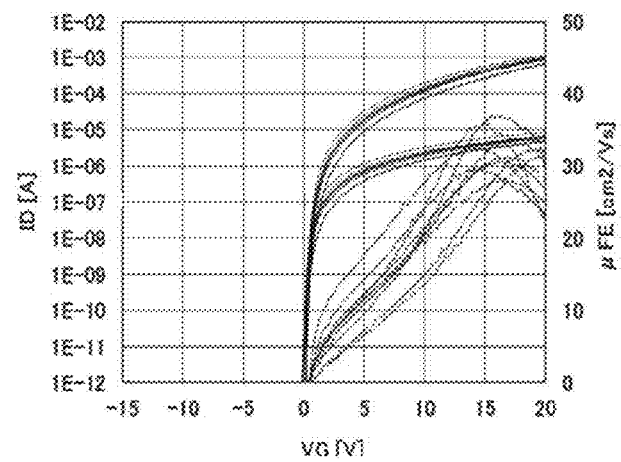
Figure 38C:
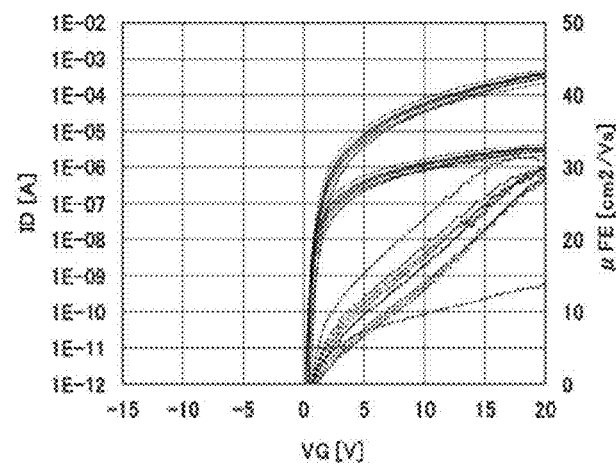

Next, the $I_d$-$V_g$ characteristics of the samples formed as described above were measured. FIGS. 38A to 38C show the $I_d$-$V_g$ characteristics of the samples of this example.

FIG. 38A shows the $I_d$-$V_g$ characteristics of transistors each having a channel length L of 2 μm and a channel width W of 50 μm. FIG. 38B shows the $I_d$-$V_g$ characteristics of transistors each having a channel length L of 3 μm and a channel width W of 50 μm. FIG. 38C shows the $I_d$-$V_g$ characteristics of transistors each having a channel length L of 6 μm and a channel width W of 50 μm. FIGS. 38A to 38C each show superimposed $I_d$-$V_g$ characteristics of the 10 transistors.

A voltage applied to the conductive film 104 that functions as a first gate electrode (hereinafter the voltage is also referred to as a gate voltage ($V_g$)) of the transistor 100E and a voltage applied to the conductive film 120a that functions as a second gate electrode ($V_{bg}$) of the transistor 100E were each changed from −15 V to +20 V in increments of 0.25 V. A voltage applied to the conductive film 112a that functions as a source electrode (hereinafter the voltage is also referred to as a source voltage (VS)) was 0 V (comm), and a voltage applied to the conductive film 112b that functions as a drain electrode (hereinafter the voltage is also referred to as a drain voltage (VD)) was 1 V or 10 V.

It is confirmed from the results shown in FIGS. 38A to 38C that the samples manufactured in this example exhibit favorable electrical characteristics.

<3-3. Reliability Tests>

Next, reliability tests were performed on the samples formed as described above. For the reliability tests, bias-temperature stress tests (hereinafter referred to as GBT tests) were performed.

The GBT tests in this example were performed under the conditions where the gate voltage (VG) was ±30 V; the drain voltage (VD) and the source voltage (VS) were 0 V (COMMON); the stress temperature was 60° C.; the time for stress application was 1 hour; and two kinds of measurement environments, a dark environment and a photo environment (irradiation with light having approximately 10000 1x with a white LED), were employed. In other words, the source electrode and the drain electrode of the transistor were set at the same potential, and a potential different from that of the source and drain electrodes was applied to the gate electrode for a certain time (one hour, here). A case where the potential applied to the gate electrode is higher than that of the source and drain electrodes is called positive stress, and a case where the potential applied to the gate electrode is lower than that of the source and drain electrodes is called negative stress. Thus, the reliability tests were performed under four conditions in total, including the measurement environments. That is, the reliability tests were performed under positive BT stress (PBTS), negative BT stress (NBTS), positive bias illumination temperature stress (PBITS), and negative bias illumination temperature stress (NBITS).

Figure 39:
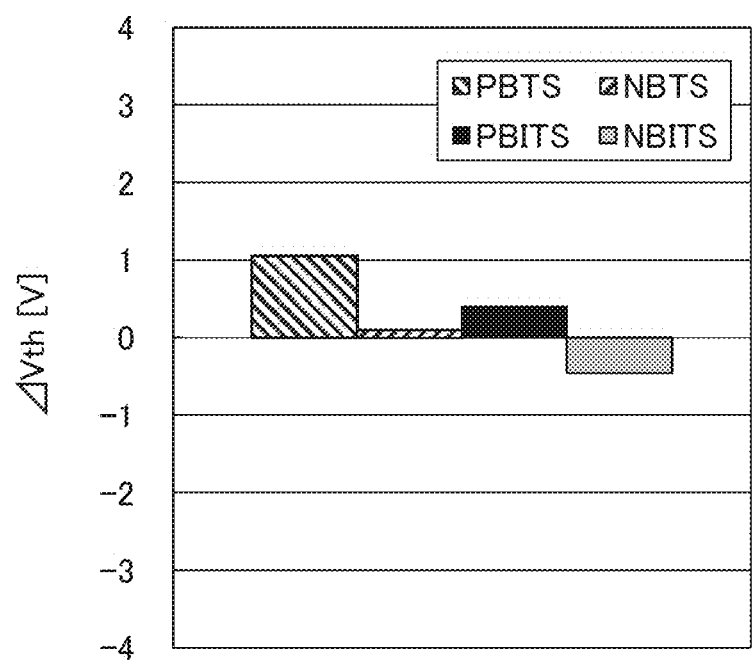
FIG. 39 shows results of reliability tests performed on transistors in an example.

FIG. 39 shows BT test results. In FIG. 39, the vertical axis represents the amount of change in the threshold voltage of the transistor (ΔVth), and the horizontal axis represents the conditions.

It is confirmed from the results shown in FIG. 39 that the samples formed in this example have favorable reliability in which the amount of threshold voltage change is within +1.5 V under all of the conditions.

<3-4. Cross-Sectional Observation>

Next, the cross section of the sample formed as described above was observed. Note that a transmission electron microscope (TEM) was used for the cross-sectional observation.

Figure 40A:
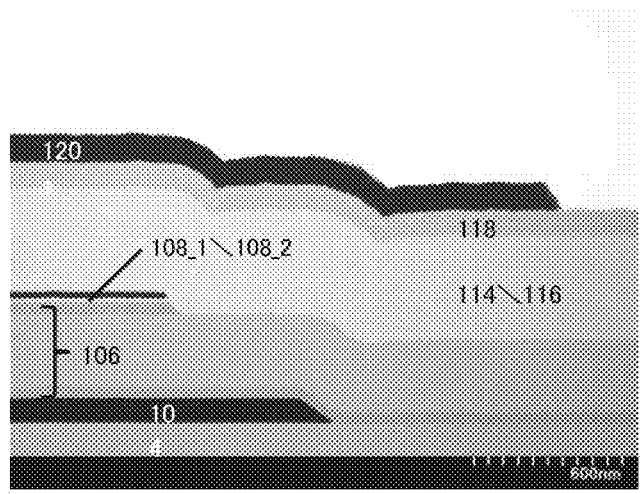
FIGS. 40A and 40B are cross-sectional TEM images of a transistor in an example.
Figure 40B:
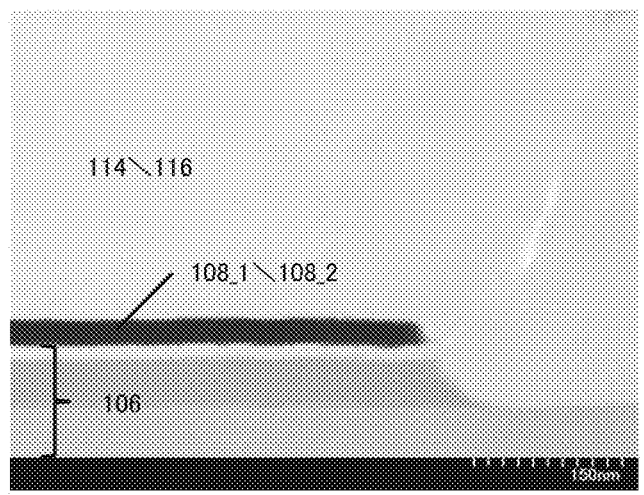

FIGS. 40A and 40B are cross-sectional TEM images of the sample. FIG. 40A is a cross-sectional TEM image of the transistor 100E that was observed at a magnification of 50,000 times, and FIG. 40B is a cross-sectional TEM image of the vicinity of the oxide semiconductor film 108_1 and the oxide semiconductor film 108_2 that was observed at a magnification of 200,000 times. As shown in FIGS. 40A and 40B, the sample formed in this example was confirmed to have a favorable cross-sectional shape. In particular, the oxide semiconductor film 108_1 and the oxide semiconductor film 108_2 have favorable cross-sectional shapes.

The structure described in this example can be combined with any of the embodiments or the other examples as appropriate.

Example 4

In this example, an oxide semiconductor film that can be used in a semiconductor device of one embodiment of the present invention was formed, and impurities in the oxide semiconductor film were evaluated.

<4-1. Formation Method of Sample>

In this example, first, Sample D1 and Sample D2 described below were formed. Formation methods of the samples are described.

[Sample D1]

In Sample D1, the oxide semiconductor film 108_1 was formed over a glass substrate, and the oxide semiconductor film 108_2 was formed over the oxide semiconductor film 108_1. The oxide semiconductor film 108_1 was formed of In—Ga—Zn oxide having a thickness of 100 nm, and the oxide semiconductor film 108_2 was formed of In—Ga—Zn oxide having a thickness of 100 nm. The oxide semiconductor film 108_1 was formed under the conditions where the substrate temperature was 130° C., an argon gas at a flow rate of 180 sccm and an oxygen gas at a flow rate of 20 sccm were introduced into a chamber, the pressure was 0.6 Pa, and an AC power of 2500 W was applied to a metal oxide sputtering target (having an atomic ratio of In:Ga:Zn=4:2:4.1). The oxide semiconductor film 108_2 was formed under the conditions where the substrate temperature was 130° C., an oxygen gas at a flow rate of 100 sccm was introduced into a chamber, the pressure was 0.6 Pa, and an AC power of 2500 W was applied to a metal oxide sputtering target (having an atomic ratio of In:Ga:Zn=4:2:4.1). Note that the oxide semiconductor film 108_1 and the oxide semiconductor film 108_2 were successively formed in a vacuum chamber of a sputtering apparatus.

[Sample D2]

In Sample D2, the oxide semiconductor film 108_1 was formed over a glass substrate, and the oxide semiconductor film 108_2 was formed over the oxide semiconductor film 108_1. The oxide semiconductor film 108_1 was formed of In—Ga—Zn oxide having a thickness of 100 nm, and the oxide semiconductor film 108_2 was formed of In—Ga—Zn oxide having a thickness of 100 nm. The oxide semiconductor film 108_1 was formed under the conditions where the substrate temperature was 130° C., an argon gas at a flow rate of 180 sccm and an oxygen gas at a flow rate of 20 sccm were introduced into a chamber, the pressure was 0.6 Pa, and an AC power of 2500 W was applied to a metal oxide sputtering target (having an atomic ratio of In:Ga:Zn=4:2:4.1). The oxide semiconductor film 108_2 was formed under the conditions where the substrate temperature was 170° C., an argon gas at a flow rate of 50 sccm and an oxygen gas at a flow rate of 50 sccm were introduced into a chamber, the pressure was 0.2 Pa, and an AC power of 500 W was applied to a metal oxide sputtering target (having an atomic ratio of In:Ga:Zn=1:1:1.2).

Impurities in the oxide semiconductor films were analyzed by SIMS measurement. Note that SIMS measurement was performed by using an ADEPT-1010 quadrupole mass spectrometry instrument manufactured by ULVAC-PHI, Inc.

<4-2. SIMS Analysis>

Figure 41:
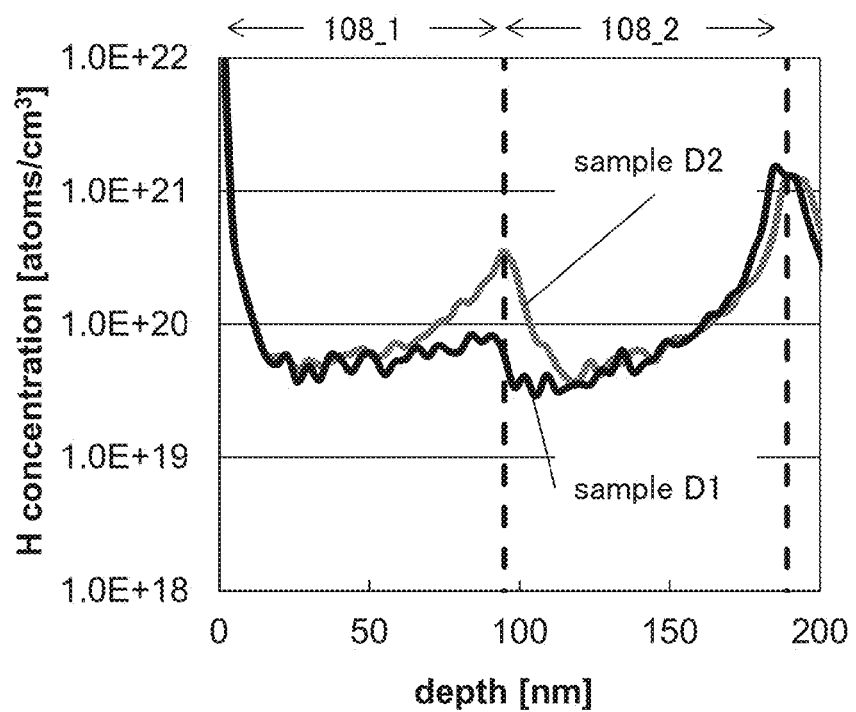
FIG. 41 shows hydrogen concentration in samples in an example.

The analysis results of impurities in the oxide semiconductor films in this example are shown in FIG. 41 and FIGS. 42A and 42B.

FIG. 41 shows hydrogen concentration in the oxide semiconductor films, FIG. 42A shows carbon concentration in the oxide semiconductor films, and FIG. 42B shows nitrogen concentration in the oxide semiconductor films.

It is shown from FIG. 41 and FIGS. 42A and 42B that Sample D1 has lower concentrations of impurities (hydrogen, carbon, and nitrogen) at the interface between the oxide semiconductor film 108_1 and the oxide semiconductor film 108_2 than Sample D2. Sample D1 includes the oxide semiconductor films 108_1 and 108_2 successively formed using the metal oxide targets with the same composition and in the same vacuum chamber; thus, the impurity concentration at the interface between the oxide semiconductor films 108_1 and 108_2 can be reduced.

The structure described in this example can be combined with any of the embodiments or the other examples as appropriate.

Example 5

In this example, an oxide semiconductor film that can be used in a semiconductor device of one embodiment of the present invention was formed, and constituent elements and defect states in the oxide semiconductor film were examined.

<5-1. Formation Method of Sample>

In this example, first, Sample E1 and Sample E2 described below were formed. Formation methods of the samples are described.

[Sample E1]

Sample E1 includes a 100-nm-thick first silicon oxynitride film over a glass substrate, a 100-nm-thick oxide semiconductor film (hereinafter referred to as the oxide semiconductor film 108_1) over the first silicon oxynitride film, an oxide semiconductor film (hereinafter referred to as the oxide semiconductor film 108_2) over the oxide semiconductor film 108_1, and a second silicon oxynitride film over the oxide semiconductor film 108_2.

The first silicon oxynitride film was formed with a PECVD apparatus. The substrate temperature at the time of forming the first silicon oxynitride film was 350° C.

The oxide semiconductor film 108_1 and the oxide semiconductor film 108_2 were each In—Ga—Zn oxide. The oxide semiconductor film 108_1 was formed under the conditions where the substrate temperature was 130° C.; an argon gas at a flow rate of 180 sccm and an oxygen ($^{16}$O) gas at a flow rate of 20 sccm were introduced into a chamber; the pressure was 0.6 Pa; and an AC power of 2500 W was applied to a metal oxide sputtering target (having an atomic ratio of In:Ga:Zn=4:2:4.1). The oxide semiconductor film 108_2 was formed under the conditions where the substrate temperature was 130° C., an oxygen ($^{18}$O) gas at a flow rate of 100 sccm was introduced into a chamber, the pressure was 0.6 Pa, and an AC power of 2500 W was applied to a metal oxide sputtering target (having an atomic ratio of In:Ga:Zn=4:2:4.1).

The second silicon oxynitride film was formed with a PECVD apparatus. The substrate temperature at the time of forming the second silicon oxynitride film was 220° C.

[Sample E2]

In Sample E2, a structure similar to that of Sample E1 was used, and the oxide semiconductor film 108_2 was formed under the conditions different from the formation conditions of the oxide semiconductor film 108_2 of Sample E1.

The oxide semiconductor film 108_2 of Sample E2 was formed under the conditions where the substrate temperature was 130° C., an argon gas at a flow rate of 180 sccm and an oxygen ($^{18}$O) gas at a flow rate of 20 sccm were introduced into a chamber, the pressure was 0.6 Pa, and an AC power of 2500 W was applied to a metal oxide sputtering target (having an atomic ratio of In:Ga:Zn=4:2:4.1).

Note that in this example, $^{18}$O was used as oxygen of the film formation gas at the time of forming the oxide semiconductor film 108_2 in each of Samples E1 and E2. Since the oxide semiconductor films 108_1 and 108_2 included oxygen ($^{16}$O) at a main component level, oxygen ($^{18}$O) was used to measure the amount of oxygen introduced into the oxide semiconductor film 108_1 at the time of forming the oxide semiconductor film 108_2.

Impurities in the oxide semiconductor films were analyzed by SIMS measurement. Note that SIMS measurement was performed by using an ADEPT-1010 quadrupole mass spectrometry instrument manufactured by ULVAC-PHI, Inc.

<5-2. SIMS Analysis>

Figure 43:
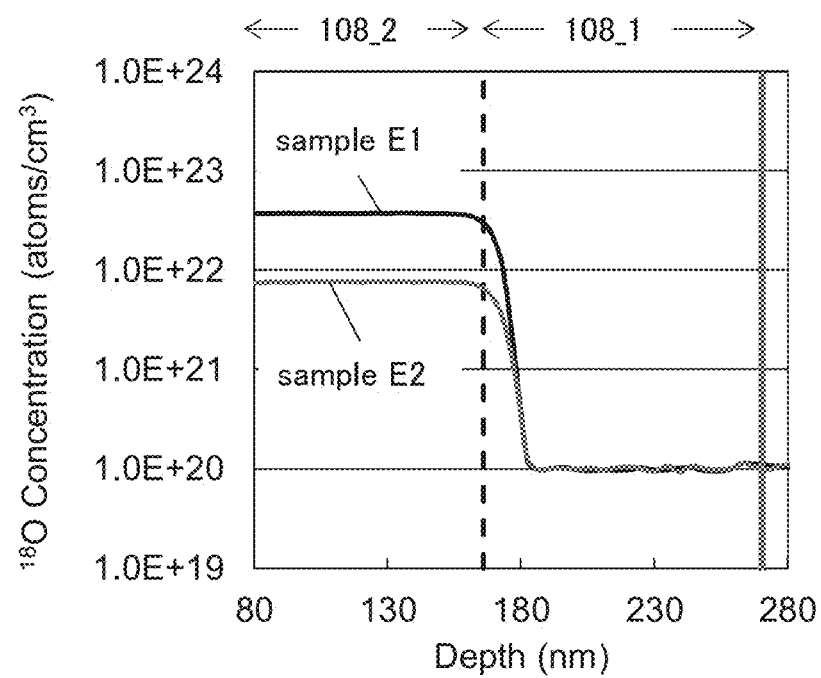
FIG. 43 shows oxygen concentration in samples in an example.

The results of SIMS analysis in the oxide semiconductor films in this example are shown in FIG. 43. Note that FIG. 43 shows oxygen ($^{18}$O) concentration in the oxide semiconductor films.

It is shown from the results in FIG. 43 that Sample E1 has a higher concentration of $^{18}$O introduced at the interface between the oxide semiconductor films 108_1 and 108_2 and into the oxide semiconductor film 108_1 than Sample E2. It is also shown that, in each of Samples E1 and E2, $^{18}$O is introduced to a depth of approximately 15 nm in the oxide semiconductor film 108_1.

<5-3. Defect Examination in Oxide Semiconductor Film>

Next, defects in oxide semiconductor films of samples corresponding to Samples E1 and E2 formed as described above were examined. In this example, spin density corresponding to a signal that appears at g=1.93 was measured by ESR. Note that the spin density corresponding to a signal that appears at g=1.93 is due to oxygen vacancies ($V_o$) that may be included in the oxide semiconductor films or hydrogen that has introduced into the oxygen vacancies ($V_oH$).

Figure 44:
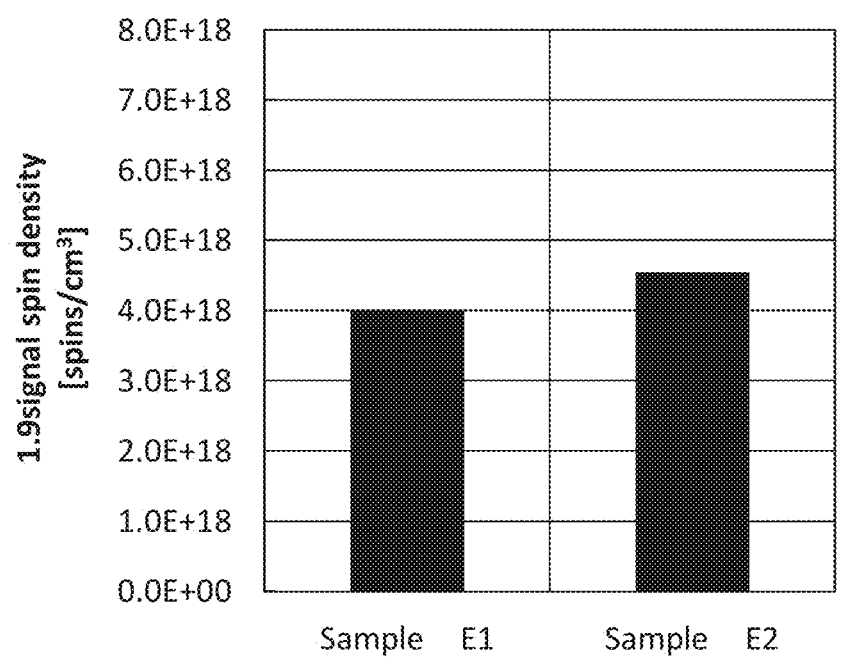
FIG. 44 shows spin densities of samples in an example.

FIG. 44 shows ESR measurement results of the samples corresponding to Samples E1 and E2.

It is shown from FIG. 44 that Sample E1 has lower spin density corresponding to a signal that appears at g=1.93 in the stacked-layer structure of the oxide semiconductor films 108_1 and 108_2 than Sample E2. It is suggested that this is because oxygen vacancies in the oxide semiconductor films 108_1 and 108_2 are filled by increasing the oxygen flow rate ratio at the time of forming the oxide semiconductor film 108_2.

The structure described in this example can be combined with any of the embodiments or the other examples as appropriate.

REFERENCE NUMERALS

100: transistor, 100A: transistor, 100B: transistor, 100C: transistor, 100D: transistor, 100E: transistor, 102: substrate, 104: conductive film, 106: insulating film, 108: oxide semiconductor film, 108_1: oxide semiconductor film, 108_1_0: oxide semiconductor film, 108_2: oxide semiconductor film, 108_2_0: oxide semiconductor film, 108_3: oxide semiconductor film, 109_2: oxide semiconductor film, 112: conductive film, 112a: conductive film, 112a_1: conductive film, 112a_2: conductive film, 112a_3: conductive film, 112b: conductive film, 112b_1: conductive film, 112b_2: conductive film, 112b_3: conductive film, 114: insulating film, 116: insulating film, 118: insulating film, 120: conductive film, 120a: conductive film, 120b: conductive film, 141a: opening, 141b: opening, 142a: opening, 142b: opening, 191: target, 192: plasma, 193: target, 194: plasma, 501: pixel circuit, 502: pixel portion, 504: driver circuit portion, 504a: gate driver, 504b: source driver, 506: protection circuit, 507: terminal portion, 550: transistor, 552: transistor, 554: transistor, 560: capacitor, 562: capacitor, 570: liquid crystal element, 572: light-emitting element, 600: display panel, 601: transistor, 604: connection portion, 605: transistor, 606: transistor, 607: connection portion, 612: liquid crystal layer, 613: conductive film, 617: insulating film, 620: insulating film, 621: insulating film, 623: conductive film, 631: coloring layer, 632: light-blocking film, 633a: alignment film, 633b: alignment film, 634: coloring layer, 640: liquid crystal element, 641: adhesive layer, 642: adhesive layer, 643: conductive film, 644: EL layer, 645*a*: conductive film, 645*b*: conductive film, 646: insulating film, 647: insulating film, 648: conductive film, 649: connection layer, 651: substrate, 652: conductive film, 653: semiconductor film, 654: conductive film, 655: opening, 656: polarizing plate, 659: circuit, 660: light-emitting element, 661: substrate, 662: display portion, 663: conductive film, 664: electrode, 665: electrode, 666: wiring, 667: electrode, 672: FPC, 673: IC, 681: insulating film, 682: insulating film, 683: insulating film, 684: insulating film, 685: insulating film, 686: connector, 687: connection portion, 700: display device, 701: substrate, 702: pixel portion, 704: source driver circuit portion, 705: substrate, 706: gate driver circuit portion, 708: FPC terminal portion, 710: signal line, 711: wiring portion, 712: sealant, 716: FPC, 730: insulating film, 732: sealing film, 734: insulating film, 736: coloring film, 738: light-blocking film, 750: transistor, 752: transistor, 760: connection electrode, 770: planarization insulating film, 772: conductive film, 773: insulating film, 774: conductive film, 775: liquid crystal element, 776: liquid crystal layer, 778: structure, 780: anisotropic conductive film, 782: light-emitting element, 786: EL layer, 788: conductive film, 790: capacitor, 791: touch panel, 792: insulating film, 793: electrode, 794: electrode, 795: insulating film, 796: electrode, 797: insulating film, 2190: plasma, 2192: cation, 2501: deposition chamber, 2502*a*: target, 2502*b*: target, 2504: segregation region, 2504*a*: sputtered particle, 2506: segregation region, 2506*a*: sputtered particle, 2510*a*: backing plate, 2510*b*: backing plate, 2520: target holder, 2520*a*: target holder, 2520*b*: target holder, 2530*a*: magnet unit, 2530*b*: magnet unit, 2530N1: magnet, 2530N2: magnet, 2530S: magnet, 2532: magnet holder, 2542: member, 2560: substrate, 2570: substrate holder, 2580*a*: magnetic line of force, 2580*b*: magnetic line of force, 4000: deposition apparatus, 4001: atmosphere-side substrate supply chamber, 4002: atmosphere-side substrate transfer chamber, 4003*a*: load lock chamber, 4003*b*: unload lock chamber, 4004: transfer chamber, 4005: substrate heating chamber, 4006*a*: deposition chamber, 4006*b*: deposition chamber, 4006*c*: deposition chamber, 4101: cassette port, 4102: alignment port, 4103: transfer robot, 4104: gate valve, 4105: heating stage, 4106: target, 4107: protection plate, 4108: substrate stage, 4109: substrate, 4110: cryotrap, 4111: stage, 4200: vacuum pump, 4201: cryopump, 4202: turbo molecular pump, 4300: mass flow controller, 4301: refiner, 4302: gas heating system, 6651: substrate, 7000: display module, 7001: upper cover, 7002: lower cover, 7003: FPC, 7004: touch panel, 7005: FPC, 7006: display panel, 7007: backlight, 7008: light source, 7009: frame, 7010: printed-circuit board, 7011: battery, 8000: camera, 8001: housing, 8002: display portion, 8003: operation buttons, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing bands, 8305: lenses, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television device, 9101: portable information terminal, 9102: portable information terminal, 9200: portable information terminal, 9201: portable information terminal.

This application is based on Japanese Patent Application serial no. 2016-101578 filed with Japan Patent Office on May 20, 2016 and Japanese Patent Application serial no. 2016-152985 filed with Japan Patent Office on Aug. 3, 2016, the entire contents of which are hereby incorporated by reference.

The invention claimed is:

1. A manufacturing method of a semiconductor device, comprising:
 a first step of forming a first oxide semiconductor film in a deposition chamber; and
 a second step of forming a second oxide semiconductor film over the first oxide semiconductor film in the deposition chamber,
 wherein water vapor partial pressure in an atmosphere in the deposition chamber is lower than water vapor partial pressure in atmospheric air,
 wherein the first oxide semiconductor film and the second oxide semiconductor film each have crystallinity, and
 wherein the crystallinity of the second oxide semiconductor film is higher than the crystallinity of the first oxide semiconductor film.

2. The manufacturing method of a semiconductor device, according to claim 1,
 wherein each of the first oxide semiconductor film and the second oxide semiconductor film is formed by a sputtering method.

3. The manufacturing method of a semiconductor device, according to claim 1,
 wherein the second oxide semiconductor film is formed in an atmosphere in which oxygen partial pressure is higher than oxygen partial pressure in an atmosphere in which the first oxide semiconductor film is formed.

4. The manufacturing method of a semiconductor device, according to claim 1,
 wherein the first oxide semiconductor film is formed with an oxygen flow rate ratio higher than or equal to 0% and lower than or equal to 30%, and
 wherein the second oxide semiconductor film is formed with an oxygen flow rate ratio higher than 30% and lower than or equal to 100%.

5. The manufacturing method of a semiconductor device, according to claim 1,
 wherein the first oxide semiconductor film includes a nanocrystal, and
 wherein the second oxide semiconductor film includes a c-axis-aligned crystal.

6. The manufacturing method of a semiconductor device, according to claim 1,
 wherein each of the first oxide semiconductor film and the second oxide semiconductor film is formed with an In—M—Zn oxide target, and
 wherein the M is Ga, Al, Y, or Sn.

7. The manufacturing method of a semiconductor device, according to claim 6,
 wherein an atomic ratio of the In to the M and the Zn is In:M:Zn=4:2:4.1 or a neighborhood of In:M:Zn=4:2:4.1.

8. The manufacturing method of a semiconductor device, according to claim 6,
 wherein an atomic ratio of the In to the M and the Zn is In:M:Zn=5:1:7 or a neighborhood of In:M:Zn=5:1:7.

9. The manufacturing method of a semiconductor device, according to claim 6,
 wherein an atomic ratio of the In to the M and the Zn is In:M:Zn=1:1:1.2 or a neighborhood of In:M:Zn=1:1:1.2.

10. A manufacturing method of a semiconductor device, comprising:

a first step of forming a first oxide semiconductor film in a deposition chamber; and a second step of forming a second oxide semiconductor film over the first oxide semiconductor film in the deposition chamber, wherein water vapor partial pressure in an atmosphere in the deposition chamber is lower than water vapor partial pressure in atmospheric air, wherein the first oxide semiconductor film and the second oxide semiconductor film are each formed at a temperature that is not increased by intentional heating and the first oxide semiconductor film and the second oxide semiconductor film each have crystallinity, and wherein the crystallinity of the second oxide semiconductor film is higher than the crystallinity of the first oxide semiconductor film.

11. The manufacturing method of a semiconductor device, according to claim 10, wherein each of the first oxide semiconductor film and the second oxide semiconductor film is formed by a sputtering method.

12. The manufacturing method of a semiconductor device, according to claim 10, wherein the second oxide semiconductor film is formed in an atmosphere in which oxygen partial pressure is higher than oxygen partial pressure in an atmosphere in which the first oxide semiconductor film is formed.

13. The manufacturing method of a semiconductor device, according to claim 10, wherein the first oxide semiconductor film is formed with an oxygen flow rate ratio higher than or equal to 0% and lower than or equal to 30%, and wherein the second oxide semiconductor film is formed with an oxygen flow rate ratio higher than 30% and lower than or equal to 100%.

14. The manufacturing method of a semiconductor device, according to claim 10, wherein the first oxide semiconductor film includes a nanocrystal, and wherein the second oxide semiconductor film includes a c-axis-aligned crystal.

15. The manufacturing method of a semiconductor device, according to claim 10, wherein each of the first oxide semiconductor film and the second oxide semiconductor film is formed with an In-M-Zn oxide target, and wherein the M is Ga, Al, Y, or Sn.

16. The manufacturing method of a semiconductor device, according to claim 15, wherein an atomic ratio of the In to the M and the Zn is In:M:Zn=4:2:4.1 or a neighborhood of In:M:Zn=4:2:4.1.

17. The manufacturing method of a semiconductor device, according to claim 15, wherein an atomic ratio of the In to the M and the Zn is In:M:Zn=5:1:7 or a neighborhood of In:M:Zn=5:1:7.

18. The manufacturing method of a semiconductor device, according to claim 15, wherein an atomic ratio of the In to the M and the Zn is In:M:Zn=1:1:1.2 or a neighborhood of In:M:Zn=1:1:1.2.

19. A manufacturing method of a semiconductor device, comprising:

a first step of forming a first oxide semiconductor film in a deposition chamber; and a second step of forming a second oxide semiconductor film over the first oxide semiconductor film in the deposition chamber, wherein water vapor partial pressure in an atmosphere in the deposition chamber is lower than water vapor partial pressure in atmospheric air, wherein the first oxide semiconductor film and the second oxide semiconductor film are each formed at a temperature higher than or equal to 100° C. and lower than or equal to 200° C. and the first oxide semiconductor film and the second oxide semiconductor film each have crystallinity, and wherein the crystallinity of the second oxide semiconductor film is higher than the crystallinity of the first oxide semiconductor film.

20. The manufacturing method of a semiconductor device, according to claim 19, wherein each of the first oxide semiconductor film and the second oxide semiconductor film is formed by a sputtering method.

21. The manufacturing method of a semiconductor device, according to claim 19, wherein the second oxide semiconductor film is formed in an atmosphere in which oxygen partial pressure is higher than oxygen partial pressure in an atmosphere in which the first oxide semiconductor film is formed.

22. The manufacturing method of a semiconductor device, according to claim 19, wherein the first oxide semiconductor film is formed with an oxygen flow rate ratio higher than or equal to 0% and lower than or equal to 30%, and wherein the second oxide semiconductor film is formed with an oxygen flow rate ratio higher than 30% and lower than or equal to 100%.

23. The manufacturing method of a semiconductor device, according to claim 19, wherein the first oxide semiconductor film includes a nanocrystal, and wherein the second oxide semiconductor film includes a c-axis-aligned crystal.

24. The manufacturing method of a semiconductor device, according to claim 19, wherein each of the first oxide semiconductor film and the second oxide semiconductor film is formed with an In—M—Zn oxide target, and wherein the M is Ga, Al, Y, or Sn.

25. The manufacturing method of a semiconductor device, according to claim 24, wherein an atomic ratio of the In to the M and the Zn is In:M:Zn=4:2:4.1 or a neighborhood of In:M:Zn=4:2:4.1.

26. The manufacturing method of a semiconductor device, according to claim 24, wherein an atomic ratio of the In to the M and the Zn is In:M:Zn=5:1:7 or a neighborhood of In:M:Zn=5:1:7.

27. The manufacturing method of a semiconductor device, according to claim 24, wherein an atomic ratio of the In to the M and the Zn is In:M:Zn=1:1:1.2 or a neighborhood of In:M:Zn=1:1:1.2.

* * * * *